(12) United States Patent
Koezuka et al.

(10) Patent No.: US 9,837,512 B2
(45) Date of Patent: Dec. 5, 2017

(54) SEMICONDUCTOR DEVICE, MANUFACTURING METHOD THEREOF, AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Kenichi Okazaki, Tochigi (JP); Daisuke Kurosaki, Tochigi (JP); Yukinori Shima, Gunma (JP); Yasuharu Hosaka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/340,031

(22) Filed: Nov. 1, 2016

(65) Prior Publication Data
US 2017/0047435 A1    Feb. 16, 2017

Related U.S. Application Data

(62) Division of application No. 14/796,403, filed on Jul. 10, 2015, now Pat. No. 9,496,412.

(30) Foreign Application Priority Data

Jul. 15, 2014 (JP) .................................. 2014-144659
Jan. 22, 2015 (JP) .................................. 2015-010055

(51) Int. Cl.
*H01L 21/00* (2006.01)
*H01L 29/66* (2006.01)
(Continued)

(52) U.S. Cl.
CPC ...... *H01L 29/66969* (2013.01); *H01L 21/022* (2013.01); *H01L 21/0214* (2013.01);
(Continued)

(58) Field of Classification Search
CPC ........... H01L 21/0214; H01L 21/02164; H01L 21/022; H01L 21/02472; H01L 21/02483; H01L 21/02554
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 104662668 A | 5/2015 |
| DE | 112013004655 | 7/2015 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Cuong Q Nguyen
(74) *Attorney, Agent, or Firm* — Fish & Richardson P.C.

(57) ABSTRACT

The transistor includes a gate electrode, a gate insulating film over the gate electrode, an oxide semiconductor film over the gate insulating film, a source electrode and a drain electrode electrically connected to the oxide semiconductor film. The oxide semiconductor film includes a first oxide semiconductor film on the gate electrode side and a second oxide semiconductor film over the first oxide semiconductor film. The first oxide semiconductor film includes a first (Continued)

region in which an atomic proportion of In is larger than that of M (M is Ti, Ga, Sn, Y, Zr, La, Ce, Nd, or Hf). The second oxide semiconductor film includes a second region in which an atomic proportion of In is smaller than that of the first oxide semiconductor film. The second region includes a portion thinner than the first region.

12 Claims, 41 Drawing Sheets

(51) Int. Cl.
  *H01L 29/786* (2006.01)
  *H01L 21/02* (2006.01)
  *H01L 27/12* (2006.01)
(52) U.S. Cl.
  CPC .... *H01L 21/0217* (2013.01); *H01L 21/02164* (2013.01); *H01L 21/02274* (2013.01); *H01L 21/02472* (2013.01); *H01L 21/02483* (2013.01); *H01L 21/02554* (2013.01); *H01L 21/02565* (2013.01); *H01L 21/02631* (2013.01); *H01L 27/1225* (2013.01); *H01L 27/1259* (2013.01); *H01L 29/7869* (2013.01); *H01L 29/78606* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,122,409 B2 | 10/2006 | Kawasaki et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,796,683 B2 | 8/2014 | Yamazaki |
| 9,048,324 B2 | 6/2015 | Miyamoto et al. |
| 9,082,863 B2 | 7/2015 | Yamazaki |
| 9,530,892 B2 * | 12/2016 | Koezuka et al. . H01L 21/02109 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321743 A1 | 12/2009 | Isa et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0193083 A1 | 8/2011 | Kim et al. |
| 2011/0215328 A1 | 9/2011 | Morosawa et al. |
| 2013/0193432 A1 | 8/2013 | Yamazaki |
| 2013/0300456 A1 | 11/2013 | Lennon |
| 2014/0084287 A1 | 3/2014 | Yamazaki |
| 2014/0103338 A1 | 4/2014 | Yamazaki et al. |
| 2014/0103339 A1 | 4/2014 | Yamazaki et al. |
| 2014/0110705 A1 | 4/2014 | Koezuka et al. |
| 2014/0110707 A1 | 4/2014 | Koezuka et al. |

(56) References Cited

U.S. PATENT DOCUMENTS

| | | |
|---|---|---|
| 2015/0249157 A1 | 9/2015 | Yamazaki et al. |
| 2015/0372022 A1 | 12/2015 | Okazaki et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-160679 A | 8/2012 |
| JP | 2013-175715 A | 9/2013 |
| JP | 2013-254951 A | 12/2013 |
| JP | 2014-078706 A | 5/2014 |
| JP | 2014-103390 A | 6/2014 |
| JP | 2014-112657 A | 6/2014 |
| KR | 2015-0058425 A | 5/2015 |
| KR | 2015-0066533 A | 6/2015 |
| TW | 201417293 | 5/2014 |
| WO | WO-2004/114391 | 12/2004 |
| WO | WO-2008/133345 | 11/2008 |
| WO | WO-2014/046220 | 3/2014 |
| WO | WO-2014/061762 | 4/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05 : Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUs on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Techno. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09 : Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

International Search Report (Application No. PCT/IB2015/055187) Dated Oct. 27, 2015.
Written Opinion (Application No. PCT/IB2015/055187) Dated Oct. 27, 2015.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

H$_2$-gas desorption spectrum @ SiNx

H$_2$-gas desorption spectrum @ SiNx

H$_2$O-gas desorption spectrum @SiON

H$_2$O-gas desorption spectrum @SiON

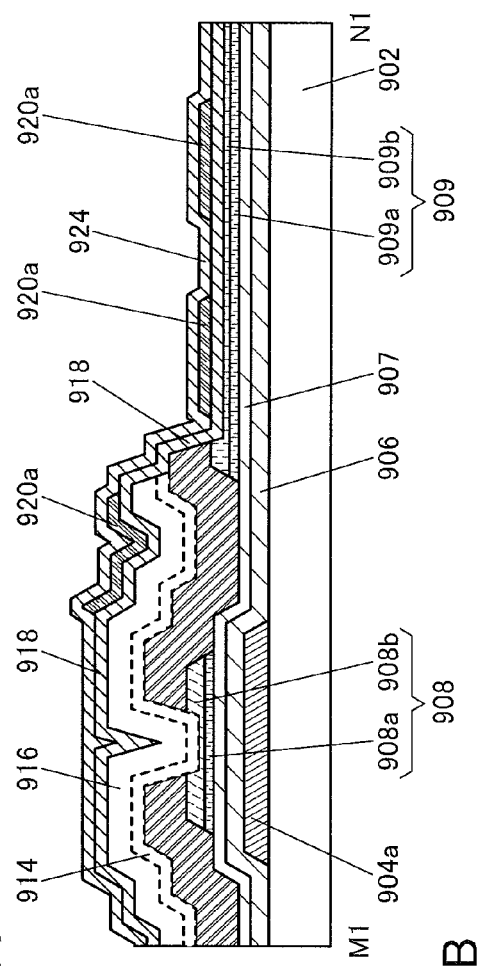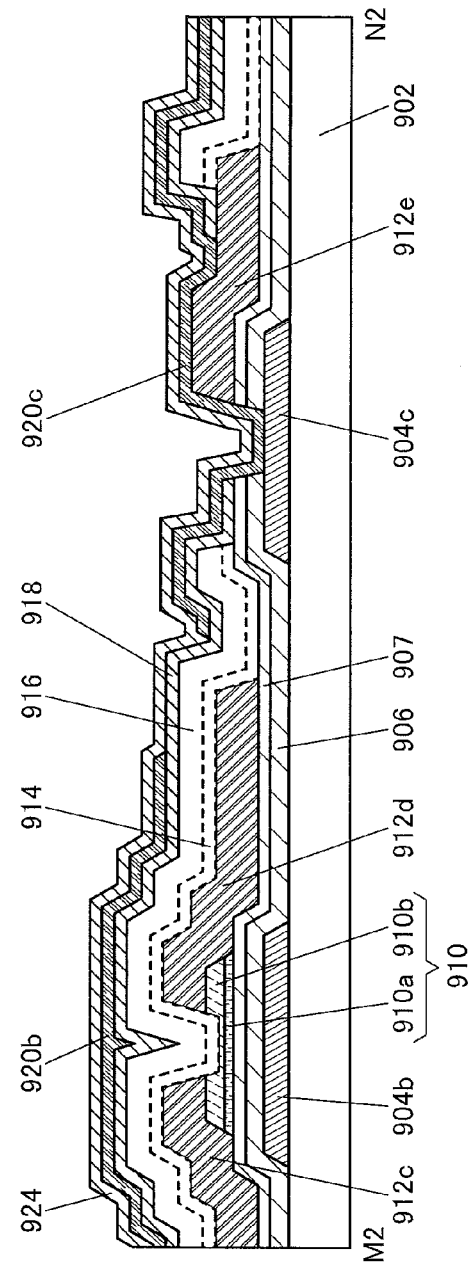

FIG. 37A
FIG. 37B
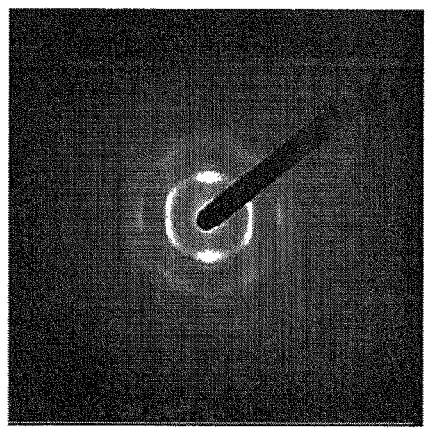
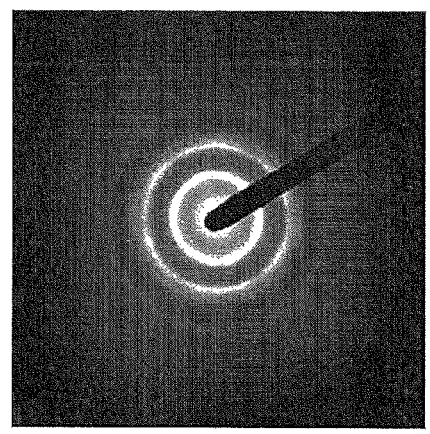

SEMICONDUCTOR DEVICE, MANUFACTURING METHOD THEREOF, AND DISPLAY DEVICE INCLUDING THE SEMICONDUCTOR DEVICE

CROSS-REFERENCE TO RELATED APPLICATIONS

This application is a divisional of U.S. application Ser. No. 14/796,403, filed Jul. 10, 2015, now allowed, which claims the benefit of foreign priority applications filed in Japan as Serial No. 2014-144659 on Jul. 15, 2014, and Serial No. 2015-010055 on Jan. 22, 2015, all of which are incorporated by reference.

TECHNICAL FIELD

One embodiment of the present invention relates to a semiconductor device including an oxide semiconductor film and a display device including the semiconductor device. Another embodiment of the present invention relates to a manufacturing method of the semiconductor device including an oxide semiconductor film.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A reliable semiconductor device in which stable electrical characteristics are applied to a transistor using an oxide semiconductor is disclosed (e.g., see Patent Document 1). In the semiconductor device, oxide semiconductor films with different compositions are stacked so that an oxide semiconductor film containing many In is provided on the channel side and an oxide semiconductor film containing many stabilizers such as Ga is provided on the back-channel side.

REFERENCE

Patent Document

[Patent Document 1] Japanese Published Patent Application No. 2013-175715

DISCLOSURE OF INVENTION

The oxide semiconductor film containing many In might have a small energy band gap (Eg) (for example, smaller than 3.0 eV). In this case, an oxide semiconductor film with larger Eg (for example, 3.0 eV or more and 3.5 eV or less) is more influenced by light than an oxide semiconductor film with smaller Eg. As a result of a bias-temperature stress test with application of a negative bias voltage and light irradiation (negative gate bias temperature (GBT) test with light), reliability of a transistor including the oxide semiconductor film with smaller Eg is sometimes reduced.

The negative GBT stress test with light irradiation is one kind of accelerated test and can evaluate, in a short time, change in characteristics of transistors, which is caused by long-term use. In particular, the amount of shift in threshold voltage ($\Delta$Vth) of the transistor between before and after a negative GBT stress test with light irradiation is an important indicator for examining reliability. The smaller the shift in the threshold voltage ($\Delta$Vth) between before and after a negative GBT stress test with light irradiation is, the higher the reliability of the transistor is.

In view of the problems, an object of one embodiment of the present invention is to suppress a change in electrical characteristics and to improve reliability in a semiconductor device including a transistor including an oxide semiconductor film containing many In. Another object of one embodiment of the present invention is to provide a semiconductor device with low power consumption. Another object of one embodiment of the present invention is to provide a novel semiconductor device. Another object of one embodiment of the present invention is to provide a method for manufacturing a novel semiconductor device. Another object of one embodiment of the present invention is to provide a method for manufacturing a novel display device.

Note that the description of the above object does not disturb the existence of other objects. In one embodiment of the present invention, there is no need to achieve all the objects. Objects other than the above objects will be apparent from and can be derived from the description of the specification and the like.

Means for Solving the Problems

One embodiment of the present invention is a semiconductor device including a transistor. The transistor includes a gate electrode, a gate insulating film over the gate electrode, an oxide semiconductor film over the gate insulating film, a source electrode electrically connected to the oxide semiconductor film, and a drain electrode electrically connected to the oxide semiconductor film. The oxide semiconductor film includes a first oxide semiconductor film on the gate electrode side and a second oxide semiconductor film over the first oxide semiconductor film. The first oxide semiconductor film includes a first region in which an atomic proportion of In is larger than an atomic proportion of M (M is Ti, Ga, Sn, Y, Zr, La, Ce, Nd, or Hf). The second oxide semiconductor film includes a second region in which an atomic proportion of In is smaller than that of the first oxide semiconductor film. The second region includes a portion thinner than the first region.

Another embodiment of the present invention is a semiconductor device including a transistor. The transistor includes a first gate electrode, a first gate insulating film over the first gate electrode, an oxide semiconductor film over the first gate insulating film, a source electrode electrically connected to the oxide semiconductor film, a drain electrode electrically connected to the oxide semiconductor film, a second gate insulating film over the oxide semiconductor film, and a second gate electrode over the second gate insulating film. The oxide semiconductor film includes a first oxide semiconductor film on the gate electrode side and a second oxide semiconductor film over the first oxide semiconductor film. The first oxide semiconductor film includes a first region in which an atomic proportion of In is larger than an atomic proportion of M (M is Ti, Ga, Sn, Y, Zr, La, Ce, Nd, or Hf). The second oxide semiconductor film includes a second region in which an atomic proportion of In is smaller than that of the first oxide semiconductor film. The second region includes a portion thinner than the first region.

In any of the above structures, it is preferable that the oxide semiconductor film contain In, M, and Zn, and M is preferably Ga. In any of the above structures, it is preferable that the oxide semiconductor film include a crystal part, the crystal part include a portion, and the c-axis of the portion be parallel to a normal vector of a surface where the oxide semiconductor film is formed.

In any of the above structures, it is preferable that the first region include a portion in which the proportion of the crystal part is larger than the second region. In any of the above structures, it is preferable that the first region include a portion with lower concentration of hydrogen than the second region.

Another embodiment of the present invention is a display device including the semiconductor device according to any of the above structures and a display element. Another embodiment of the present invention is a display module including the display device and a touch sensor. Another embodiment of the present invention is an electronic device including the semiconductor device according to any of the above structures, the display device, or the display module, and an operation key or a battery.

Another embodiment of the present invention is a manufacturing method of a semiconductor device including the steps of forming a gate electrode over a substrate, forming a gate insulating film over the gate electrode, forming a first oxide semiconductor film over the gate insulating film, footling a second oxide semiconductor film over the first oxide semiconductor film, forming a source electrode and a drain electrode over the second oxide semiconductor film, forming an oxide insulating film over the second oxide semiconductor film, forming an oxide conductive film over the oxide insulating film, adding oxygen into the oxide insulating film through the oxide conductive film, and removing the oxide conductive film In the step of forming the source electrode and the drain electrode, a region of the second oxide semiconductor film becomes thinner than the first oxide semiconductor film. The step of forming the oxide insulating film is performed at a temperature higher than or equal to 180° C. and lower than or equal to 350° C. in a PECVD apparatus. The temperature in the step of forming the oxide insulating film is the highest in the manufacturing steps of the transistor.

Another embodiment of the present invention is a manufacturing method of a semiconductor device including the steps of forming a first gate electrode over a substrate, forming a first gate insulating film over the first gate electrode, forming a first oxide semiconductor film over the first gate insulating film, forming a second oxide semiconductor film over the first oxide semiconductor film, forming a source electrode and a drain electrode over the second oxide semiconductor film, forming an oxide insulating film functioning as a second gate insulating film, over the second oxide semiconductor film, forming an oxide conductive film over the oxide insulating film, adding oxygen into the oxide insulating film through the oxide conductive film, removing the oxide conductive film, and forming a second gate electrode over the oxide insulating film. In the step of forming the source electrode and the drain electrode, a region of the second oxide semiconductor film becomes thinner than the first oxide semiconductor film. The step of forming the oxide insulating film is performed at a temperature higher than or equal to 180° C. and lower than or equal to 350° C. in a PECVD apparatus. The temperature in the step of forming the oxide insulating film is the highest in the manufacturing steps of the transistor.

In any of the above structures, each of the first oxide semiconductor film and the second oxide semiconductor film preferably contains O, In, Zn, and M (M is Ti, Ga, Sn, Y, Zr, La, Ce, Nd, or Hf). In any of the above structures, it is preferable that each of the first oxide semiconductor film and the second oxide semiconductor film include a crystal part, and a portion in which a c-axis of the crystal part is parallel to a normal vector to a formation surface of the first oxide semiconductor film or a normal vector to a formation surface of the second oxide semiconductor film be included.

According to one object of one embodiment of the present invention, a change in electrical characteristics can be inhibited and reliability can be improved in a semiconductor device using a transistor including an oxide semiconductor. According to one object of one embodiment of the present invention, a highly reliable semiconductor device can be provided. According to one embodiment of the present invention, a novel semiconductor device, a method for manufacturing the novel semiconductor device, or a novel display device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 32A and 32B are cross-sectional views of pixel portions and protective circuit portions according to Example.

FIGS. 37A and 37B show electron diffraction patterns of a CAAC-OS.

BEST MODE FOR CARRYING OUT THE INVENTION

Figure 1A:
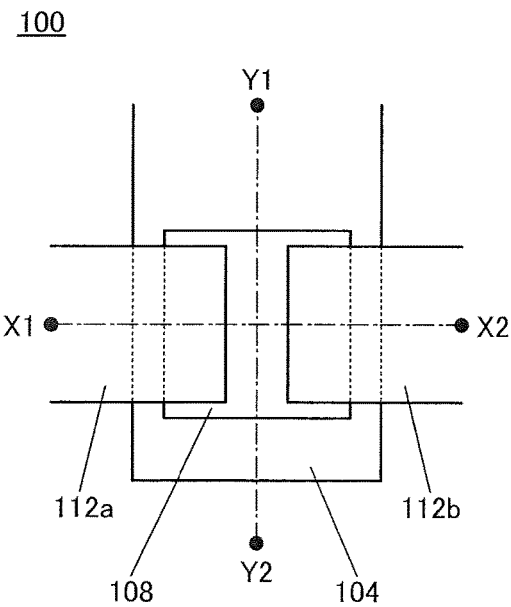
FIGS. 1A to 1C are a top view and cross-sectional views illustrating one embodiment of a semiconductor device.

Hereinafter, embodiments will be described with reference to drawings. The embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In describing structures of the invention with reference to the drawings in this specification and the like, common reference numerals are used for the same portions in different drawings.

In this specification and the like, the term "parallel" indicates that the angle faulted between two straight lines is greater than or equal to −10° and less than or equal to 10°, and thus includes the angle greater than or equal to −5° and less than or equal to 5°. The term "perpendicular" indicates that the angle formed between two straight lines is greater than or equal to 80° and less than or equal to 100°, and thus includes the angle greater than or equal to □5° and less than or equal to □5°.

In this specification and the like, the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Embodiment 1

In this embodiment, a semiconductor device that is one embodiment of the present invention and a method of manufacturing the semiconductor device are described with reference to FIGS. 1A to 1C to FIGS. 7A to 7G.

<Structure Example 1 of Semiconductor Device>

Figure 1B:
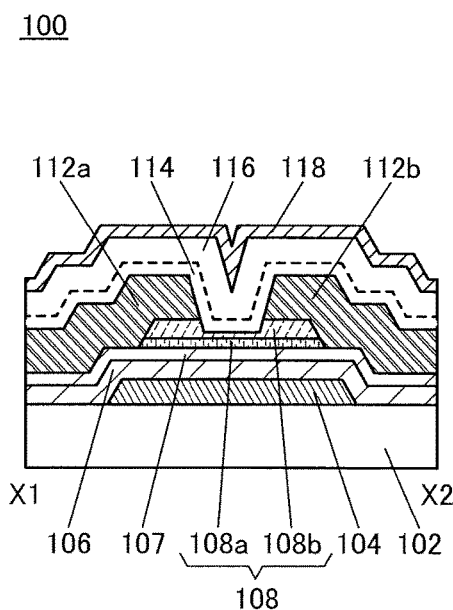
Figure 1C:
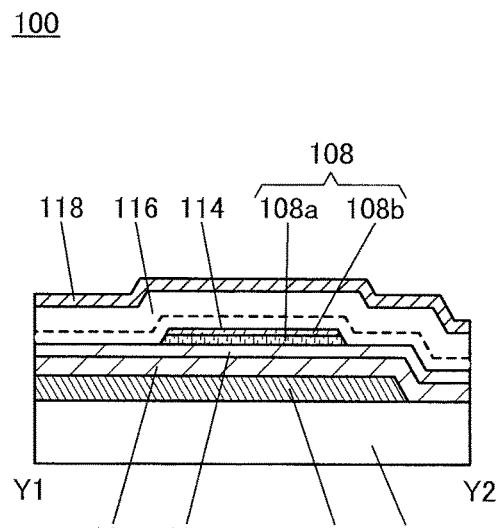

FIG. 1A is a top view of a transistor 100 that is a semiconductor device of one embodiment of the present invention. FIG. 1B is a cross-sectional view taken along a dashed dotted line X1-X2 in FIG. 1A. FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. The direction of the dashed dotted line X1-X1 may be called a channel length direction, and the direction of the dashed dotted line Y1-Y2 may be called a channel width direction. As in FIG. 1A, some components are not illustrated in some cases in top views of transistors described below.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, and conductive films 112a and 112b functioning as source and drain electrodes electrically connected to the oxide semiconductor film 108. Over the transistor 100, specifically, over the conductive films 112a and 112b and the oxide semiconductor film 108, insulating films 114, 116, and 118 are provided. The insulating films 114, 116, and 118 function as protective insulating films for the transistor 100.

The oxide semiconductor film 108 includes a first oxide semiconductor film 108a on the conductive film 104 side and a second oxide semiconductor film 108b over the first oxide semiconductor film 108a. The conductive film 104 serves as a gate electrode. The insulating films 106 and 107 function as gate insulating films of the transistor 100.

An In—M oxide (M is Ti, Ga, Sn, Y, Zr, La, Ce, Nd, or Hf) or an In—M—Zn oxide can be used for the oxide semiconductor film 108. It is particularly preferable to use an In—M—Zn oxide for the oxide semiconductor film 108.

The first oxide semiconductor film 108a includes a first region in which the atomic proportion of In is larger than the atomic proportion of M. The second oxide semiconductor film 108b includes a second region in which the atomic proportion of In is smaller than that in the first oxide semiconductor film 108a. The second region include a portion thinner than the first region.

The first oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs, preferably exceed 30 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the first oxide semiconductor film 108a including the first region in which the atomic proportion of In is larger than that of M makes it easier to change electrical characteristics of the transistor 100 in light irradiation. However, in the semiconductor device of one embodiment of the present invention, the second oxide semiconductor film 108b is formed over the first oxide semiconductor film 108a. In addition, the thickness of a portion including the channel region and the vicinity of the channel region in the second oxide semiconductor film 108b is smaller than the thickness of the first oxide semiconductor film 108a.

Furthermore, the second oxide semiconductor film 108b includes the second region in which the atomic proportion of In is smaller than the first oxide semiconductor film 108a and thus has larger Eg than that of the first oxide semiconductor film 108a. For this reason, the oxide semiconductor film 108 which is a layered structure of the first oxide semiconductor film 108a and the second oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 2.

Figure 2:
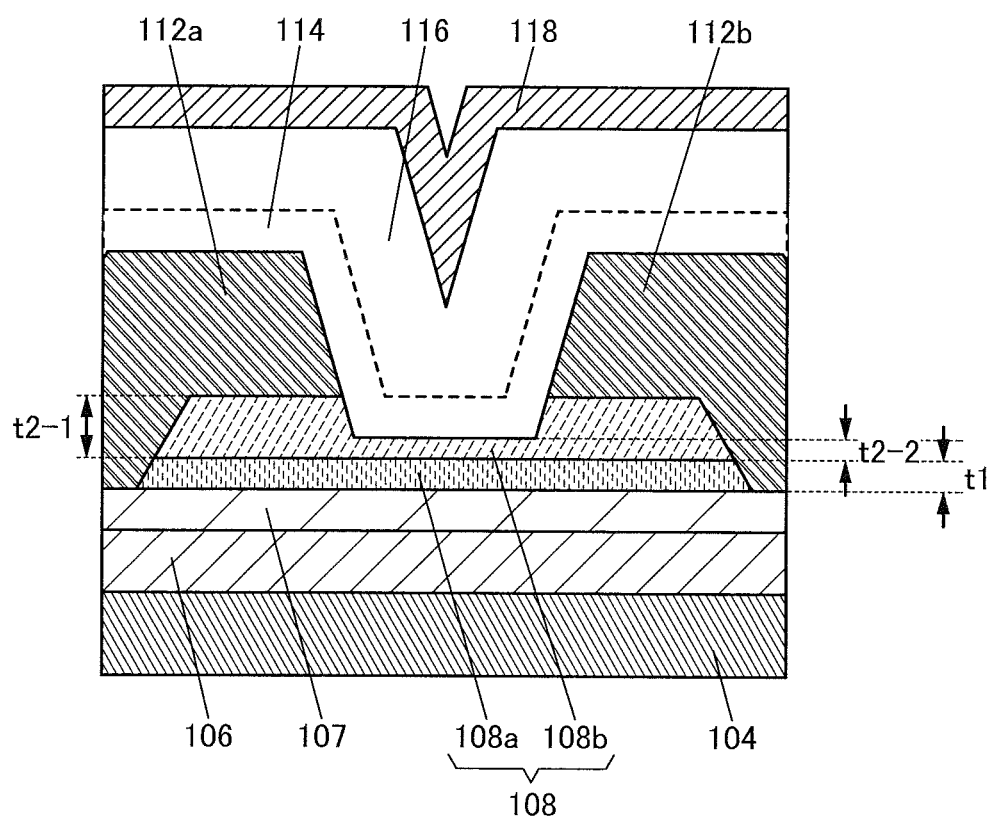
FIG. 2 is a cross-sectional view illustrating one embodiment of a semiconductor device.

FIG. 2 is a cross-sectional enlarged view of the oxide semiconductor film 108 and the periphery thereof in the transistor 100 shown in FIG. 1B.

In FIG. 2, t1, t2−1, and t2−2 denote a thickness of the first oxide semiconductor film 108a, one thickness of the second oxide semiconductor film 108b, and the other thickness the second oxide semiconductor film 108b, respectively. The second oxide semiconductor film 108b over the first oxide semiconductor film 108a prevents the first oxide semiconductor film 108a from being exposed to an etching gas, an etchant, or the like when the conductive films 112a and 112b are formed. This is why the first oxide semiconductor film 108a is not or is hardly reduced in thickness. In contrast, in the second oxide semiconductor film 108b, a portion not overlapping with the conductive films 112a and 112b is etched by formation of the conductive films 112a and 112b, so that a depression is formed in the etched region. In other words, a thickness of the second oxide semiconductor film 108b in a region overlapping with the conductive films 112a and 112b is t2−1, and a thickness of the second oxide semiconductor film 108b in a region not overlapping with the conductive films 112a and 112b is t2−2.

As for the relationships between the thicknesses of the first oxide semiconductor film 108a and the second oxide semiconductor film 108b, t2−1>t1>t2−2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the first oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the first oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the first oxide semiconductor film 108a, the thickness of the portion including the channel region and the vicinity of the channel region in the second oxide semiconductor film 108b is preferably small, and t2−2<t1 is preferably satisfied. For example, the thickness of the portion including the channel region and the vicinity of the channel region in the second oxide semiconductor film 108b is preferably more than or equal to 1 nm and less than or equal to 20 nm, more preferably more than or equal to 3 nm and less than or equal to 10 nm.

Other constituent elements of the semiconductor device of this embodiment are described below in detail.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<A Conductive Film Functioning as a Gate Electrode and Source and Drain Electrodes>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<An Insulating Film Functioning as a Gate Insulating Film>

As each of the insulating films 106 and 107 functioning as gate insulating films of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

<Oxide Semiconductor Film>

The oxide semiconductor layer 108 can be formed using the materials described above. In the case where the oxide semiconductor film 108 includes In—M—Zn oxide, it is preferable that the atomic ratio of metal elements of a sputtering target used for forming the In—M—Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor film 108 is formed of In—M—Zn oxide, it is preferable to use a target including polycrystalline In—M—Zn oxide as the sputtering target. The use of the target including polycrystalline In—M—Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The first oxide semiconductor film 108a can be formed using the sputtering target having an atomic ratio of In:M:Zn=2:1:3, In:M:Zn=3:1:2, or In:M:Zn=4:2:4.1. The second oxide semiconductor film 108b can be faulted using the sputtering target having an atomic ratio of In:M:Zn=1:1:1 or In:M:Zn=1:1:1.2. Note that the atomic ratio of metal elements in a sputtering target used for forming the second oxide semiconductor film 108b does not necessarily satisfy In≥M and Zn≥M, and may satisfy In≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the second oxide semiconductor film 108b preferably has a higher energy gap than that of the first oxide semiconductor film 108a.

Each thickness of the first oxide semiconductor film 108a and the second oxide semiconductor film 108b is more than or equal to 3 urn and less than or equal to 200 nm, preferably more than or equal to 3 nm and less than or equal to 100 nm, more preferably more than or equal to 3 nm and less than or equal to 50 nm. Note that the above-described thickness relationship between them is preferably satisfied.

An oxide semiconductor film with low carrier density is used as the second oxide semiconductor film 108b. For example, the carrier density of the second oxide semiconductor film 108b is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the first oxide semiconductor film 108a and the second oxide semiconductor film 108b be set to be appropriate.

Note that it is preferable to use, as the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film 108 reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The first oxide semiconductor film 108a preferably includes a region in which hydrogen concentration is smaller than that in the second oxide semiconductor film 108b. A semiconductor device including the first oxide semiconductor film 108a having the region in which hydrogen concentration is smaller than that in the second oxide semiconductor film 108b can be increased in reliability.

When silicon or carbon that is one of elements belonging to Group 14 is included in the first oxide semiconductor film 108a, oxygen vacancy is increased in the first oxide semiconductor film 108a, and the first oxide semiconductor film 108a becomes an n-type film. Thus, the concentration of silicon or carbon (the concentration is measured by SIMS) in the first oxide semiconductor film 108a or the concentration of silicon or carbon (the concentration is measured by SIMS) in the vicinity of an interface with the first oxide semiconductor film 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the first oxide semiconductor film 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The first oxide semiconductor film 108a may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

<An Insulating Film Functioning as a Protective Insulating Film of a Transistor>

The insulating films 114, 116, and 118 function as protective insulating films. The insulating films 114 and 116 include oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1\times10^{18}/cm^3$ and less than or equal to $5\times10^{19}/cm^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than or equal to 0 and less than or equal to 2, preferably greater than or equal to 1 and less than or equal to 2), typically $NO_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than or equal to 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/$cm^3$, typically higher than or equal to $1\times10^{17}$ spins/$cm^3$ and lower than $1\times10^{18}$ spins/$cm^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/$cm^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0\times10^{19}$ atoms/$cm^3$, preferably greater than or equal to $3.0\times10^{20}$ atoms/$cm^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5\times10^{18}$ spins/$cm^3$, preferably lower than or equal to $1\times10^{18}$ spins/$cm^3$ by ESR measurement. Note that the insulating film 116 is provided more apart from the oxide semiconductor film 108 than the insulating film 114 is; thus, the insulating film 116 may have higher density of defects than the insulating film 114.

Furthennore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. As an example of a thermal CVD method, a metal organic chemical vapor deposition (MOCVD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used.

Furthermore, a $Zn(CH_3)_2$ gas may be used.

<Structure Example 2 of Semiconductor Device>

Structure examples different from that of the transistor 100 in FIGS. 1A to 1C are described with reference to FIGS. 3A to 3C. Note that in the case where a portion has a function similar to that described above, the same hatch pattern is applied to the portion, and the portion is not especially denoted by a reference numeral in some cases.

Figure 3A:
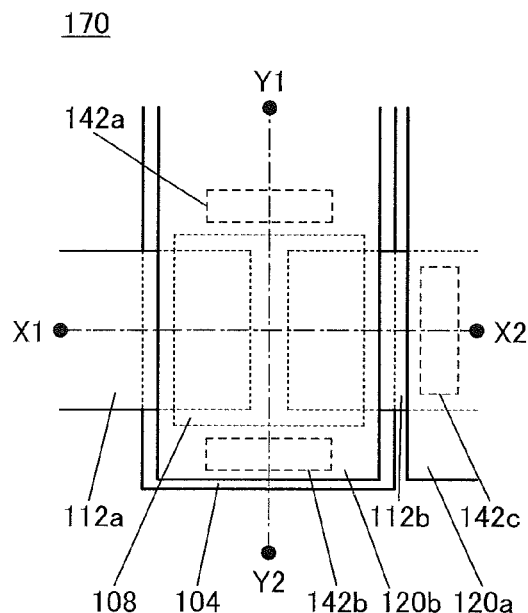
FIGS. 3A to 3C are cross-sectional views illustrating an example of a manufacturing process of a semiconductor device.

FIG. 3A is a top view of a transistor 170 that is a semiconductor device of one embodiment of the present invention. FIG. 3B is a cross-sectional view taken along dashed-dotted line X1-X2 illustrated in FIG. 3A, and FIG. 3C is a cross-sectional view taken along dashed-dotted line Y1-Y2 illustrated in FIG. 3A.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108, the conductive film 112b functioning as a drain electrode electrically connected to the oxide semiconductor film 108, the insulating film 114 over the oxide semiconductor film 108, the insulating film 118 over the insulating film 114, and conductive films 120a and 120b over the insulating film 118. The insulating films 114, 116, and 118 in the transistor 170 function as second gate insulating films of the transistor 170. The conductive film 120a is electrically connected with the conductive film 112b through an opening 142c provided in the insulating films 114, 116, and 118. The conductive film 120a in the transistor 170 functions as, for example, a pixel electrode used for a display device. The conductive film 120b in the transistor 170 functions as a second gate electrode (also referred to as a back gate electrode).

Figure 3B:
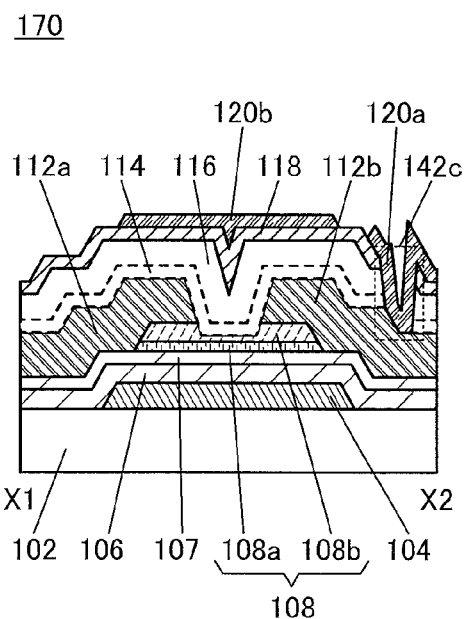
Figure 3C:
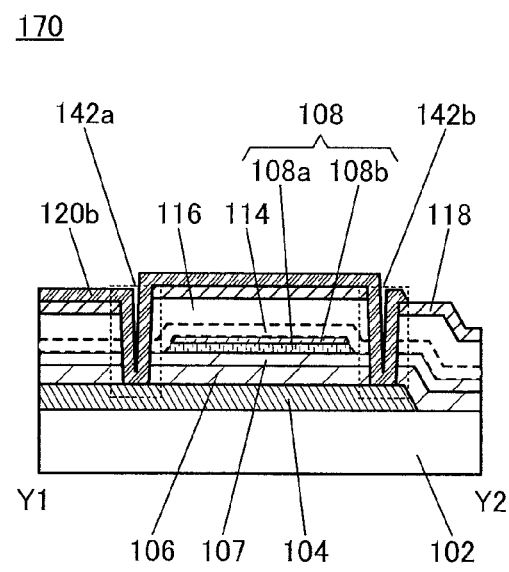

As illustrated in FIG. 3C, the conductive film 120b is connected to the conductive film 104 functioning as a first gate electrode through openings 142a and 142b provided in the insulating films 106, 107, 114, 116, and 118. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

Figure 6A:
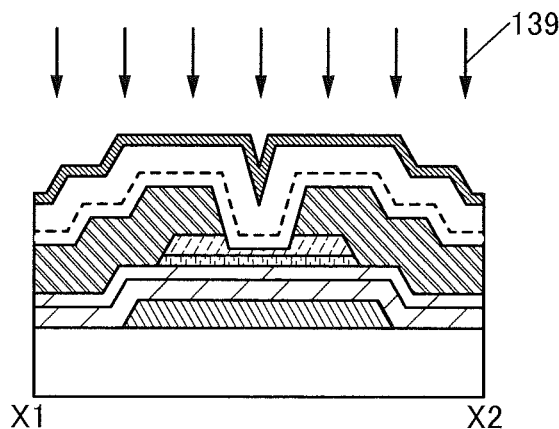
FIGS. 6A to 6C are cross-sectional views illustrating an example of a manufacturing process of a semiconductor device.
Figure 6B:
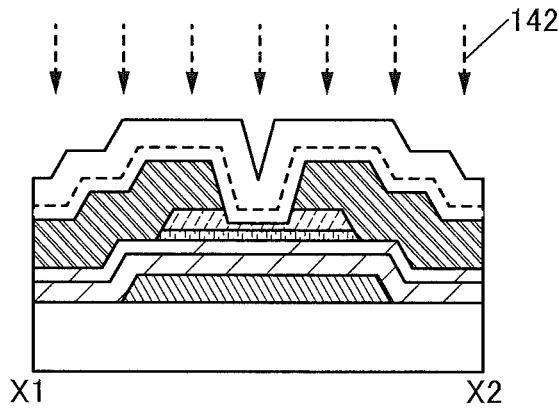

As illustrated in FIG. 6B, the oxide semiconductor film 108 is positioned to face each of the conductive film 104 functioning as a first gate electrode and the conductive film 120b functioning as a second gate electrode, and is sandwiched between the two conductive films functioning as gate electrodes. The lengths in the channel length direction and the channel width direction of the conductive film 120b functioning as a second gate electrode are longer than those in the channel length direction and the channel width direction of the oxide semiconductor film 108. The whole oxide semiconductor film 108 is covered with the conductive film 120b with the insulating films 114, 116, and 118 positioned therebetween. Since the conductive film 120b functioning as a second gate electrode is connected to the conductive film 104 functioning as a first gate electrode through the opening 142a and 142b provided in the insulating films 106, 107, 114, 116, and 118, a side surface of the oxide semiconductor film 108 in the channel width direction faces the conductive film 120b functioning as a second gate electrode with the insulating films 114, 116, and 118 positioned therebetween.

In other words, in the channel width direction of the transistor 170, the conductive film 104 functioning as a gate electrode and the conductive film 120b functioning as a second gate electrode are connected to each other through the openings provided in the insulating films 106 and 107 functioning as gate insulating films, and the insulating films 114, 116, and 118 functioning as second gate insulating films; and the conductive film 104 and the conductive film 120b surround the oxide semiconductor film 108 with the insulating films 106 and 107 functioning as gate insulating films, and the insulating films 114, 116, and 118 functioning as second gate insulating films positioned therebetween.

Such a structure makes it possible that the oxide semiconductor film 108 included in the transistor 170 is electrically surrounded by electric fields of the conductive film 104 functioning as a gate electrode and the conductive film 120b functioning as a second gate electrode. A device structure of a transistor, like that of the transistor 170, in which electric fields of a gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a gate electrode; therefore, the current drive capability of the transistor 170 can be improved and high on-state current characteristics can be obtained. Since the on-state current can be increased, it is possible to reduce the size of the transistor 170. In addition, since the transistor 170 is surrounded by the conductive film 104 functioning as a gate electrode and the conductive film 120b functioning as a second gate electrode, the mechanical strength of the transistor 170 can be increased.

Note that the other components of the transistor 170 are the same as those of the transistor 100 described above, and an effect similar to that of the transistor 100 can be obtained.

The structures of the transistors of this embodiment can be freely combined with each other. For example, the transistor 100 shown in FIGS. 1A to 1C can be used as a transistor in a pixel of a display device, and the transistor 170 shown in FIGS. 3A to 3C can be used as a transistor in a gate driver of a display device.

<Method 1 for Manufacturing Semiconductor Device>

Next, a method for manufacturing the transistor 100, which is a semiconductor device of one embodiment of the present invention, is described below in detail using FIGS. 4A to 4D, FIGS. 5A to 5D, and FIGS. 6A to 6C. FIGS. 4A to 4D, FIGS. 5A to 5D, and FIGS. 6A to 6C are cross-sectional views illustrating a method for manufacturing a semiconductor device.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a PECVD method are typical examples of the film formation method, a thermal CVD method may be used. As the thermal CVD method, an MOCVD method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by an ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

First, a conductive film is formed over the substrate 102 and processed through a lithography process and an etching process, whereby the conductive film 104 functioning as a first gate electrode is formed. Then, the insulating films 106 and 107 functioning as first gate insulating films are formed over the conductive film 104 (see FIG. 4A).

The conductive film 104 functioning as a gate electrode can be formed by a sputtering method, a CVD method, a vacuum evaporation method, or a PLD method. Alternatively, a coating method or a printing method can be used. Although typical deposition methods are a sputtering method and a PECVD method, a thermal CVD method, such as an MOCVD method, or an ALD method described above may be used.

In this embodiment, a glass substrate is used as the substrate 102, and as the conductive film 104 functioning as a first gate electrode, a 100-nm-thick tungsten film is formed by a sputtering method.

The insulating films 106 and 107 functioning as gate insulating films can be formed by a sputtering method, a PECVD method, a thermal CVD method, a vacuum evaporation method, a PLD method, or the like. In this embodiment, a 400-mn-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 μm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 (specifically the first oxide semiconductor film 108a) formed later.

Next, the first oxide semiconductor film 108a is formed over the insulating film 107. Then, the second oxide semiconductor film 108b is formed over the first oxide semiconductor film 108a (see FIG. 4B).

A method of forming the stacked-layer oxide semiconductor film in this embodiment is as follows: the first oxide semiconductor film is deposited by sputtering using an In—Ga—Zn metal oxide target (In:Ga:Zn=3:1:2 (atomic ratio) and then the second oxide semiconductor film is successively deposited in a vacuum by sputtering using an In—Ga—Zn metal oxide target (In:Ga:Zn=1:1:1.2 (atomic ratio). Next, a mask is formed over the stacked-layer oxide semiconductor film through a lithography process, and the stacked-layer oxide semiconductor film is processed into desired regions to form the island-shaped oxide semiconductor film 108.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas including carbon or hydrogen, from an exhaust system to the inside of the chamber.

Figure 4A:
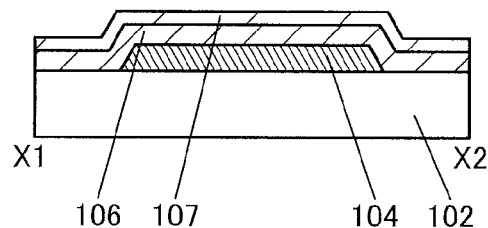
FIGS. 4A to 4D are cross-sectional views illustrating an example of a manufacturing process of a semiconductor device.
Figure 4B:
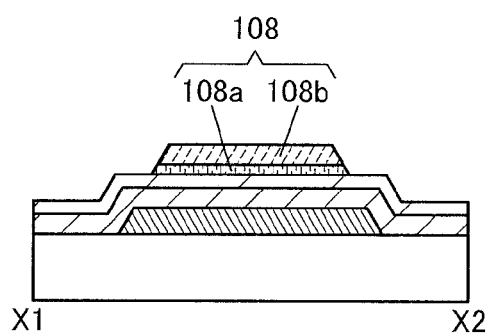
Figure 4C:
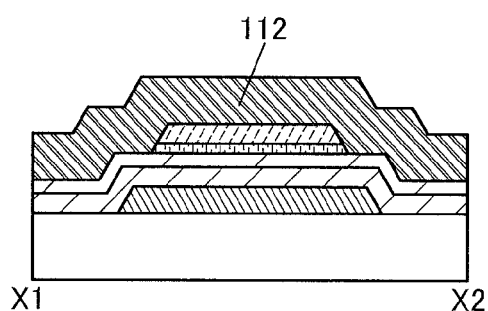

Next, the conductive film 112 functioning as source and drain electrodes are formed over the insulating film 107 and the oxide semiconductor film 108a (see FIG. 4C).

In this embodiment, the conductive film 112 is formed of a 400-nm-thick aluminum film is stacked over a 50-nm-thick tungsten film by a sputtering method. Although the conductive film 112 have a two-layer structure in this embodiment, one embodiment of the present invention is not limited thereto. For example, the conductive film 112 may have a three-layer structure in which a 400-nm-thick aluminum film is stacked over a 50-nm-thick tungsten film, and a 100-nm-thick titanium film is stacked over the 400-nm-thick aluminum film.

Figure 4D:
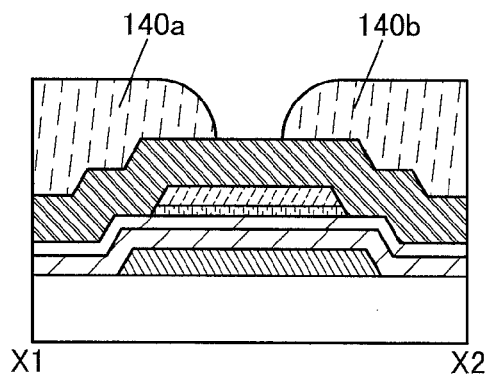

Next, masks 140a and 140b are formed in desired regions over the conductive film 112 (see FIG. 4D).

To form the masks 140a and 140b in this embodiment, a photosensitive resin film is applied and is patterned by a lithography process.

Figure 5A:
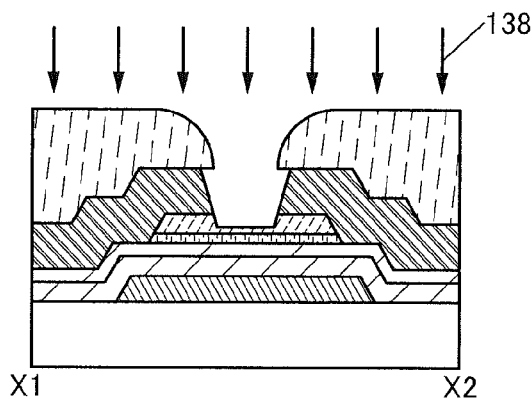
FIGS. 5A to 5D are cross-sectional views illustrating an example of a manufacturing process of a semiconductor device.
Figure 5B:
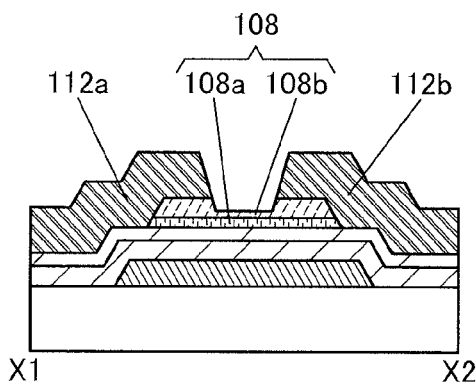

Then, an etching gas 138 is applied over the conductive film 112 and the masks 140a and 140b to process the conductive film 112 and the second oxide semiconductor film 108b (see FIG. 5A).

A dry-etching apparatus is used in this embodiment to process the conductive film 112 and the second oxide semiconductor film 108b. Note that a method of forming the conductive film 112 is not limited thereto. For example, a wet-etching apparatus and a chemical solution for the etching gas 138 are used to process the conductive film 112 and the second oxide semiconductor film 108b. However, a dry-etching apparatus is preferable than a wet-etching apparatus to process the conductive film 112 and the second oxide semiconductor film 108b because smaller micropatterns can be formed.

Then the masks 140a and 140b are removed, and the conductive films 112a and 112b respectively serving as a source electrode and a drain electrode over the second oxide semiconductor film 108b are formed. The stacked-layer oxide semiconductor film 108 of the first oxide semiconductor film 108a and the second oxide semiconductor film 108b is obtained (see FIG. 5B).

A chemical solution may be applied over the second oxide semiconductor film 108b and the conductive films 112a and 112b to clean the surface of the second oxide semiconductor film 108b on the back-channel side. The cleaning may be performed, for example, using a chemical solution such as phosphoric acid. The cleaning using a chemical solution such as a phosphoric acid can remove impurities (e.g., elements included in the conductive films 112a and 112b) attached to the surface of the second oxide semiconductor film 108b. Note that the cleaning is not necessarily performed, and thus the cleaning may be unnecessary.

Through the formation and/or cleaning of the conductive films 112a and 112b, the second region whose thickness is smaller than that of the first oxide semiconductor film 108a is formed in the second oxide semiconductor film 108b.

Figure 5C:
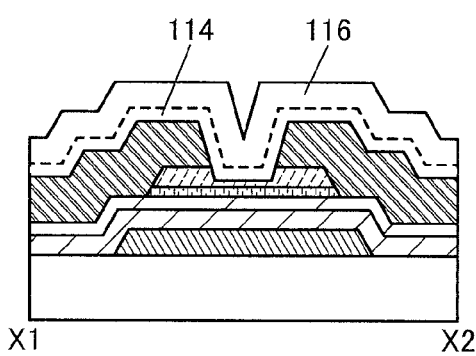

Next, the insulating films 114 and 116 are formed over the oxide semiconductor film 108 and the conductive films 112a and 112b (see FIG. 5C).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film including nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C., the pressure is greater than or equal to 100 Pa and less than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, however, the bond between silicon and oxygen is weak, and part of oxygen in the film is released by heat treatment in a later step. Thus, it is possible to form an oxide insulating film which contains oxygen at a higher proportion than the stoichiometric composition and from which part of oxygen is released by heating.

The step of forming the insulating film 116 is performed using a PECVD apparatus at a temperature higher than or equal to 180° C. and lower than or equal to 350° C., and a temperature in a step of forming the insulating film 116 is preferably the highest in the manufacturing process of the transistor 100. For example, formation of the insulating film 116 at 350° C. enables the transistor 100 to be directly formed on a flexible substrate or the like.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to faun an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment on the insulating films 114 and 116 is typically higher than or equal to 150° C. and lower than or equal to 350° C. The heat treatment can be performed under an atmosphere of nitrogen, oxygen, ultra-dry air (air with a water content of 20 ppm or less, preferably 1 ppm or less, more preferably 10 ppb or less), or a rare gas (e.g., argon or helium). Note that an electric furnace, an RTA apparatus, or the like can be used for the heat treatment, in which it is preferable that hydrogen, water, and the like not be contained in the nitrogen, oxygen, ultra-dry air, or rare gas.

In this embodiment, the heat treatment is performed at 350° C. in a nitrogen atmosphere for 1 hour. Note that the temperature at the formation step of the insulating film 116 is the highest of temperatures in the formation process of the transistor 100, and heat treatment at temperatures equivalent to the temperature for forming the insulating film 116 may be performed in other steps.

Figure 5D:
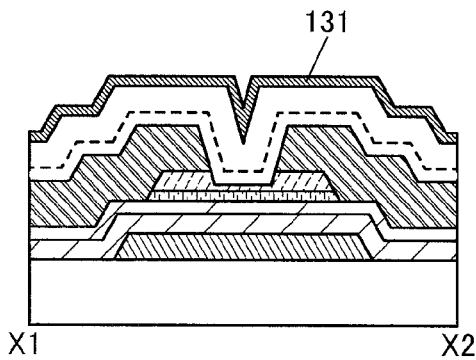

Next, an oxide conductive film 131 is formed over the insulating film 116 (see FIG. 5D).

The oxide conductive film 131 contains oxygen and metal (at least one of indium, zinc, titanium, aluminum, tungsten, tantalum, and molybdenum).

The oxide conductive film 131 can be formed using, for example, a tantalum oxynitride film, a titanium oxide film, an indium tin oxide (hereinafter also referred to as ITO) film, an aluminum oxide film, or an oxide semiconductor film (e.g., an IGZO film having an atomic ratio of In:Ga:Zn=1:4:5). The oxide conductive film 131 can be formed by a sputtering method, for example. The thickness of the oxide conductive film 131 is preferably greater than or equal to 1 nm and less than or equal to 20 nm, or greater than or equal to 2 nm and less than or equal to 10 nm. In this embodiment, a 5-nm-thick indium tin oxide doped with silicon oxide (hereinafter referred to as ITSO) is used for the oxide conductive film 131.

Next, the oxygen 139 is added to the insulating films 114 and 116 and the oxide semiconductor film 108 through the oxide conductive film 131 (see FIG. 6A).

As a method for adding the oxygen 139 to the insulating films 114 and 116 and the oxide semiconductor film 108 through the oxide conductive film 131, an ion doping method, an ion implantation method, plasma treatment, or the like is given. By the bias application to the substrate side when the oxygen 139 is added, the oxygen 139 can be effectively added to the insulating films 114 and 116 and the oxide semiconductor film 108. As the bias, for example, power density can be greater than or equal to 1 W/cm$^2$ and less than or equal to 5 W/cm$^2$. When the oxide conductive film 131 is provided over the insulating film 116 and then oxygen is added, the oxide conductive film 131 functions as a protective film for inhibiting release of oxygen from the insulating film 116. Thus, a larger amount of oxygen can be added to the insulating films 114 and 116 and the oxide semiconductor film 108.

The oxide conductive film 131 is removed using an etchant 142 (see FIG. 6B).

For example, dry etching, wet etching, or a combination thereof can be used for removing the oxide conductive film 131. Note that the etchant 142 is an etching gas in the case of dry etching and is a chemical solution in the case of wet etching. In this embodiment, wet etching is used for removing the oxide conductive film 131.

Figure 6C:
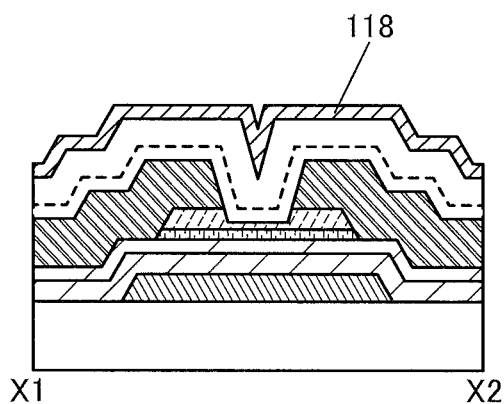

Next, the insulating film 118 is formed over the insulating film 116 (see FIG. 6C).

Note that heat treatment may be performed before or after the formation of the insulating film 118, so that excess oxygen included in the insulating films 114 and 116 can diffuse into the oxide semiconductor film 108 to fill oxygen vacancy in the oxide semiconductor film 108. Alternatively, the insulating film 118 may be deposited by heating, so that excess oxygen included in the insulating films 114 and 116 can diffuse into the oxide semiconductor film 108 to fill oxygen vacancy in the oxide semiconductor film 108.

In the case of using a PECVD method, the substrate temperature is preferably set to higher than or equal to 180° C. and lower than or equal to 350° C. because a dense insulating film 118 can be formed.

For example, in the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Through the above process, the transistor 100 illustrated in FIGS. 1A to 1C can be manufactured.

<Method 2 for Manufacturing Semiconductor Device>

Next, a method for manufacturing the transistor 170, which is one embodiment of the present invention, is described in detail with reference to FIGS. 7A to 7H. FIGS. 7A to 7H are cross-sectional views illustrating the method for manufacturing the semiconductor device. FIGS. 7A, 7C, 7E, and 7G are cross-sectional views in the channel length direction of the transistor 170. FIGS. 7B, 7D, 7F, and 7H are cross-sectional views in the channel width direction of the transistor 170.

First, the conductive film 104, the insulating films 106 and 107, the oxide semiconductor film 108, the conductive films 112a and 112b, and the insulating films 114, 116, and 118 are formed over the substrate 102 (see FIGS. 7A and 7B) through steps similar to the steps in the manufacturing method of the transistor 100 (the steps shown in FIGS. 4A to 4D, FIGS. 5A to 5D, and FIGS. 6A to 6C).

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIGS. 7C and 7D).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used. Moreover, the openings 142a and 142b may be formed in some steps. For example, the insulating films 106 and 107 are processed and then the insulating films 114, 116, and 118 are processed.

Figure 7A:
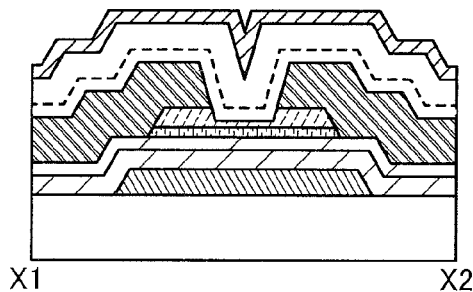
FIGS. 7A to 7H are cross-sectional views illustrating an example of a manufacturing process of a semiconductor device.
Figure 7B:
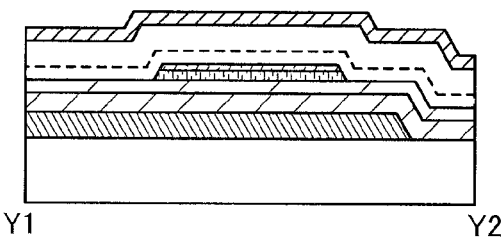
Figure 7C:
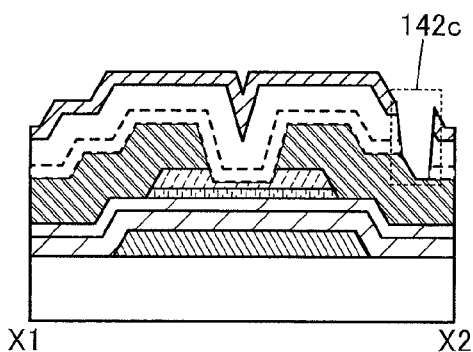
Figure 7D:
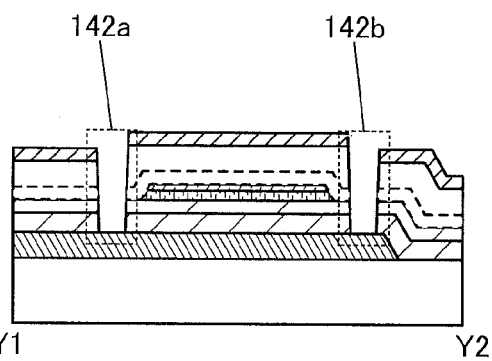
Figure 7E:
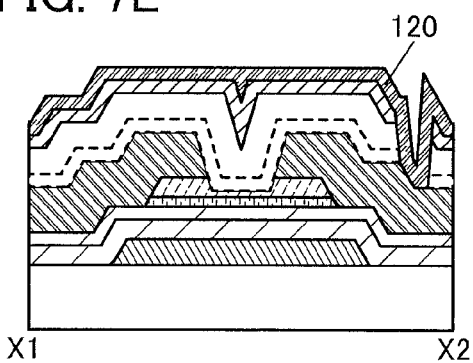
Figure 7F:
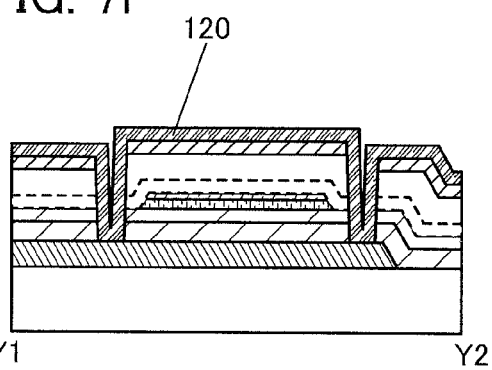

Next, a conductive film 120 is formed over the insulating film 118 to cover the openings 142a, 142b, and 142c (see FIGS. 7E and 7F).

For the conductive film 120, for example, a material including one of indium (In), zinc (Zn), and tin (Sn) can be used. In particular, for the conductive film 120, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added (ITSO) can be used. The conductive film 120 can be formed by a sputtering method, for example. In this embodiment, a 110-nm-thick ITSO film is formed by a sputtering method.

Figure 7G:
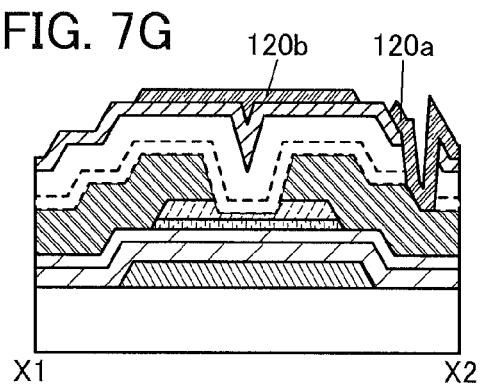
Figure 7H:
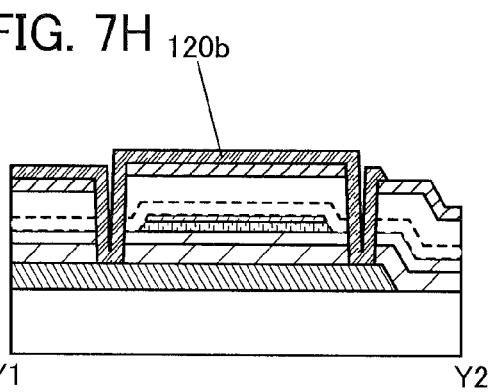

Next, a mask is formed over the conductive film 120 through a lithography process, and the conductive film 112 is processed into a desired shape to form the conductive films 120a and 120b (see FIGS. 7G and 7H).

A method for forming the conductive films 120a and 120b is, for example, a dry etching method, a wet etching method, or a combination of a dry etching method and a wet etching method. A wet etching method is used in this embodiment to process the conductive film 120 into the conductive films 120a and 120b.

Through the above process, the transistor 170 illustrated in FIGS. 3A to 3C can be manufactured.

The structure and method described in this embodiment can be implemented by being combined as appropriate with any of the other structures and methods described in the other embodiments.

Embodiment 2

In this embodiment, the structure of an oxide semiconductor included in a semiconductor device of one embodiment of the present invention will be described in detail.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 34A:
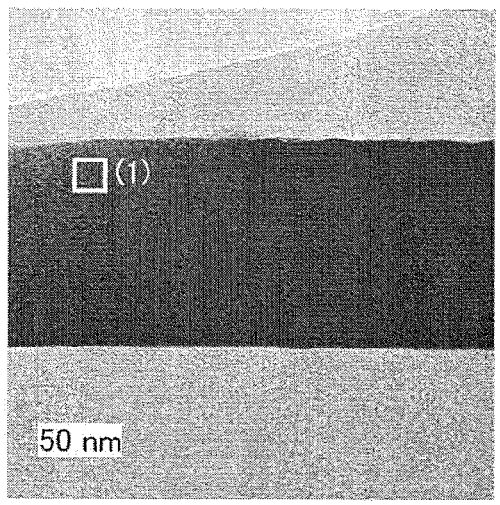
FIGS. 34A to 34C are Cs-corrected high-resolution TEM images of a cross section of a CAAC-OS and FIG. 34D is a schematic cross-sectional view of the CAAC-OS.

A CAAC-OS observed with TEM will be described below. FIG. 34A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 34B:
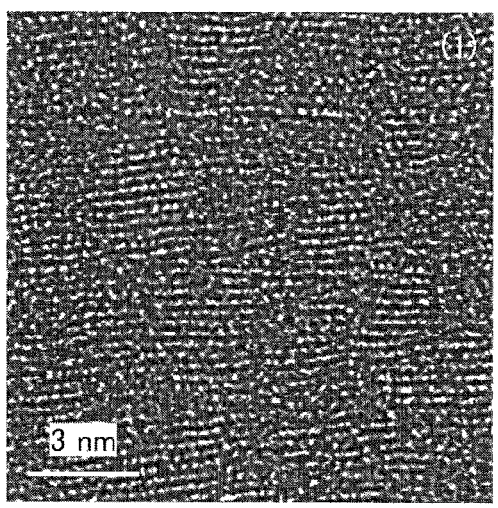

FIG. 34B is an enlarged Cs-corrected high-resolution TEM image of a region (1) in FIG. 34A. FIG. 34B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 34C:
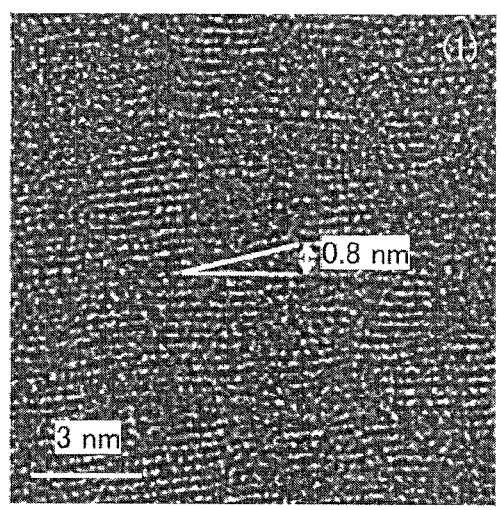

As shown in FIG. 34B, the CAAC-OS has a characteristic atomic arrangement. The characteristic atomic arrangement is denoted by an auxiliary line in FIG. 34C. FIGS. 34B and 34C prove that the size of a pellet is greater than or equal to 1 nm or greater than or equal to 3 urn, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 34D:
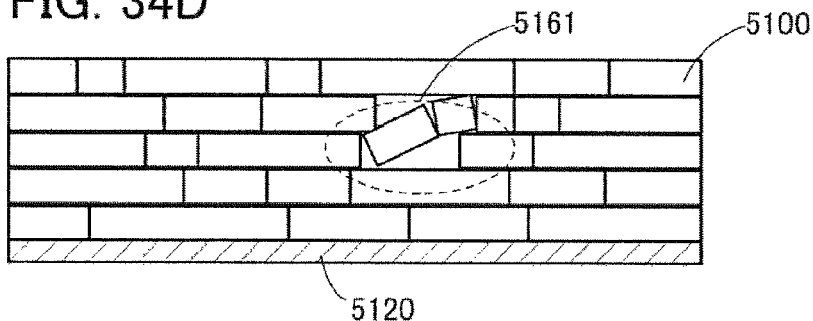

Here, according to the Cs-corrected high-resolution TEM images, the schematic arrangement of pellets 5100 of a CAAC-OS over a substrate 5120 is illustrated by such a structure in which bricks or blocks are stacked (see FIG. 34D). The part in which the pellets are tilted as observed in FIG. 34C corresponds to a region 5161 shown in FIG. 34D.

Figure 35A:
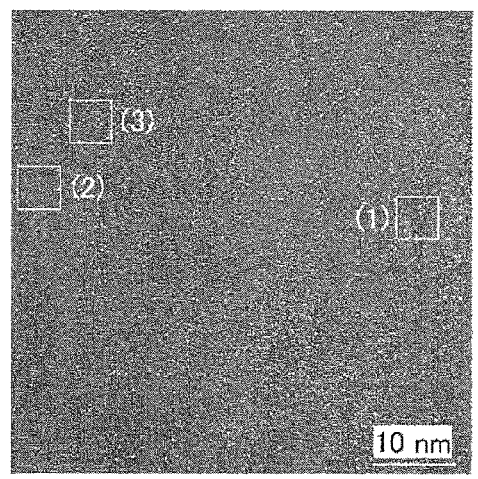
FIGS. 35A to 35D are Cs-corrected high-resolution TEM images of a plane of a CAAC-OS.
Figure 35B:
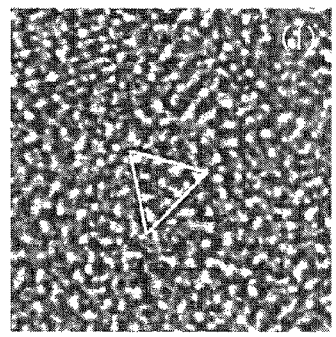
Figure 35C:
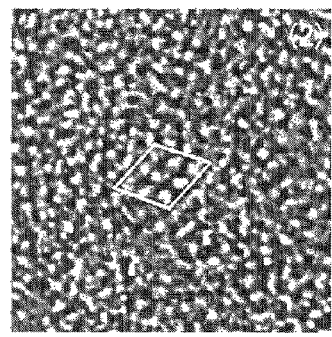
Figure 35D:
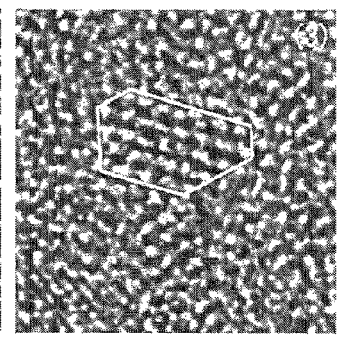

FIG. 35A shows a Cs-corrected high-resolution TEM image of a plane of the CAAC-OS observed from a direction substantially perpendicular to the sample surface. FIGS. 35B, 35C, and 35D are enlarged Cs-corrected high-resolution TEM images of regions (1), (2), and (3) in FIG. 35A, respectively. FIGS. 35B, 35C, and 35D indicate that metal atoms are arranged in a triangular, quadrangular, or hexagonal configuration in a pellet. However, there is no regularity of arrangement of metal atoms between different pellets.

Figure 36A:
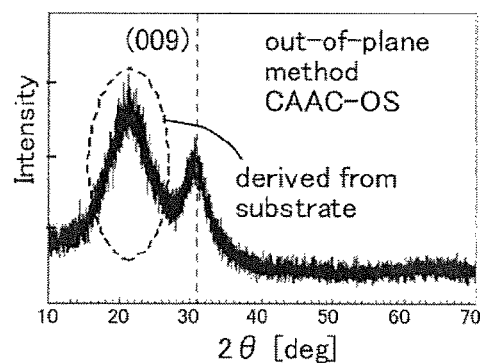
FIGS. 36A to 36C show structural analyses of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 36A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 36B:
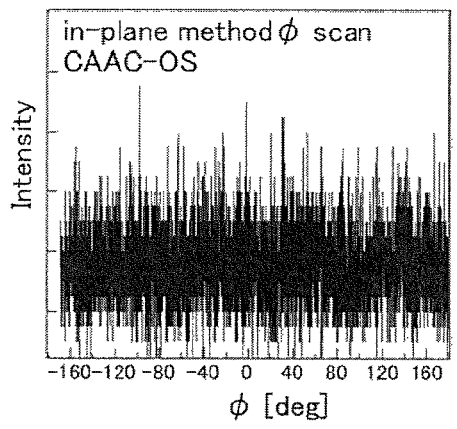
Figure 36C:
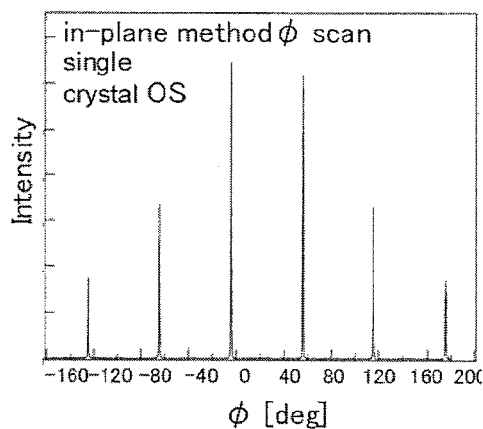

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 36B, a peak is not clearly observed. In contrast, in the case of a single crystal oxide semiconductor of $InGaZnO_4$, when φ scan is performed with 2θ fixed at around 56°, as shown in FIG. 36C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 37A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 37B shows a diffraction pattern obtained in such a manner that an electron beam with a probe diameter of 300 nm is incident on the same sample in a direction perpendicular to the sample surface. As shown in FIG. 37B, a ring-like diffraction pattern is observed. Thus, the electron diffraction also indicates that the a-axes and b-axes of the pellets included in the CAAC-OS do not have regular alignment. The first ring in FIG. 37B is considered to be derived from the (010) plane, the (100) plane, and the like of the $InGaZnO_4$ crystal. The second ring in FIG. 37B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with a low carrier density. Such an oxide semiconductor is referred to as a highly purified intrinsic or substantially highly purified intrinsic oxide semiconductor. A CAAC-OS has a low impurity concentration and a low density of defect states.

Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 38:
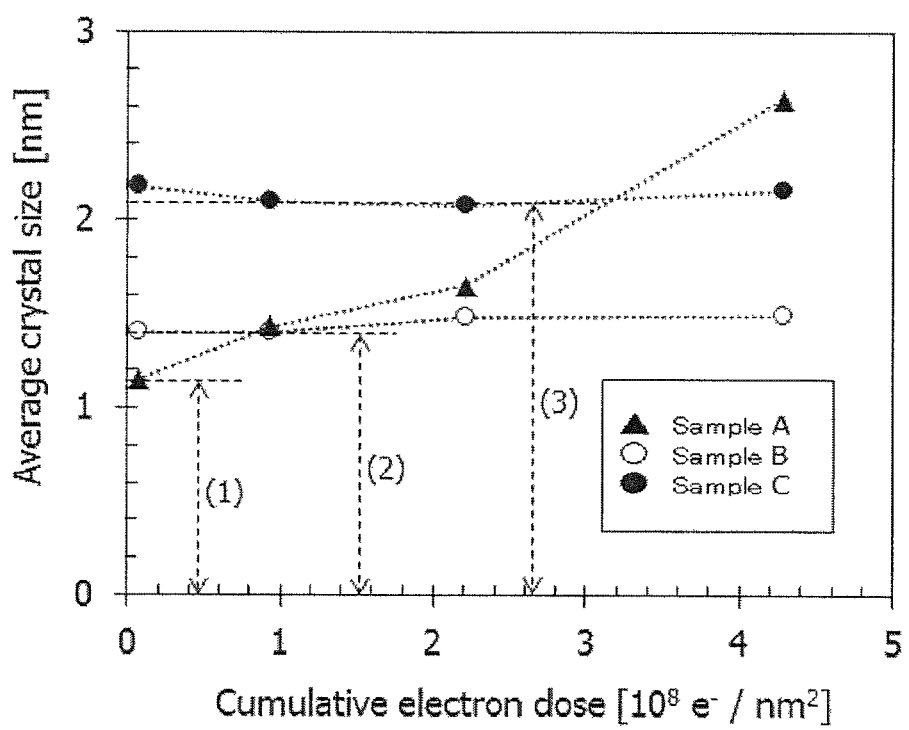
FIG. 38 shows a change of crystal parts of In—Ga—Zn oxides owing to electron irradiation.

FIG. 38 shows change in the average size of crystal parts (at 22 points to 45 points) in each sample. Note that the crystal part size corresponds to the length of a lattice fringe. FIG. 38 indicates that the crystal part size in the a-like OS increases with an increase in the cumulative electron dose. Specifically, as shown by (1) in FIG. 38, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 38, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Deposition Model>

Examples of deposition models of a CAAC-OS and an nc-OS are described below.

Figure 39A:
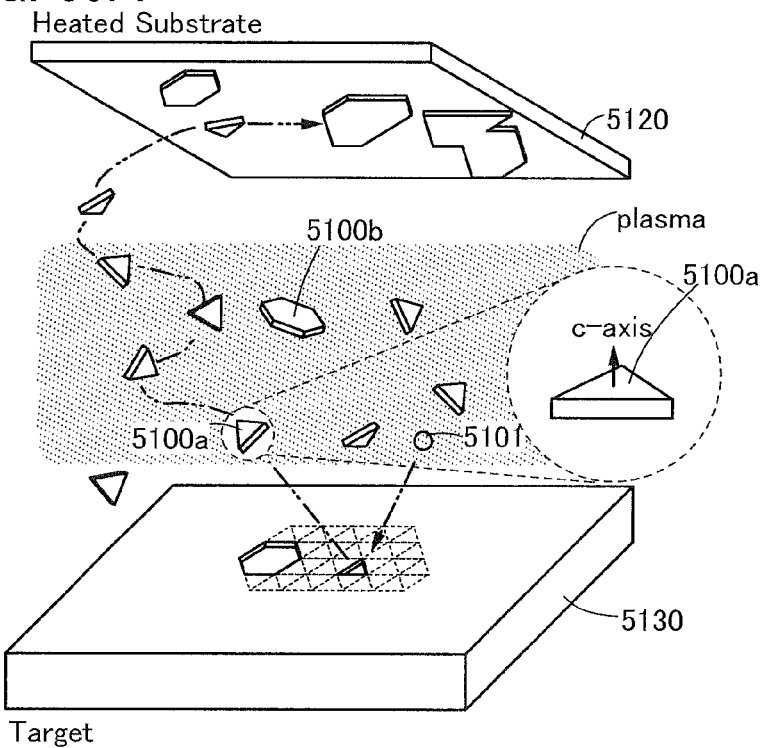
FIGS. 39A and 39B are schematic diagrams illustrating deposition models of a CAAC-OS and an nc-OS.

FIG. 39A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. The above description on the deposition chamber is referred to for the layout and structure of magnets. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 40A:
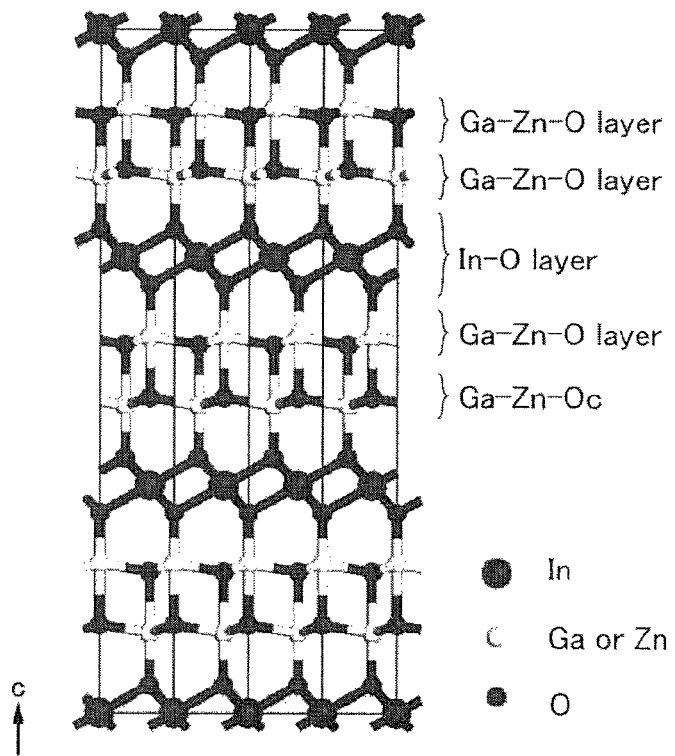
FIGS. 40A to 40C show an InGaZnO$_4$ crystal and a pellet.

A cleavage plane of the target 5130 including an In—Ga—Zn oxide is described as an example. FIG. 40A shows a structure of an InGaZnO$_4$ crystal included in the target 5130. Note that FIG. 40A shows a structure of the case where the InGaZnO$_4$ crystal is observed from a direction parallel to the b-axis when the c-axis is in an upward direction.

FIG. 40A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 40B:
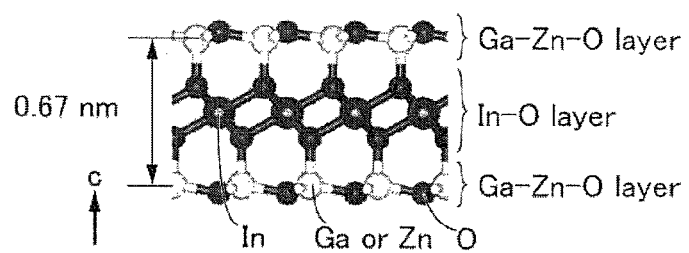
Figure 40C:
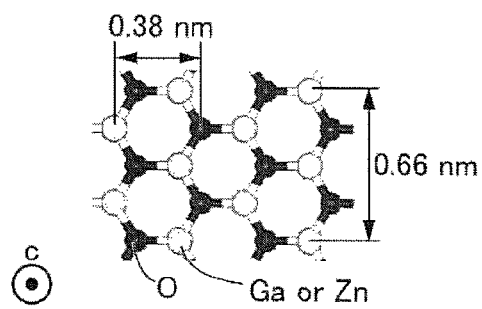

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 38. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 40B is ejected. Note that FIG. 40C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. This is a cause of a difference in size between (2) and (1) in FIG. 38. Here, in the case where the temperature of the substrate 5120 is at around room temperature, the pellet 5100 does not grow anymore; thus, an nc-OS is formed (see FIG. 39B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 39B:
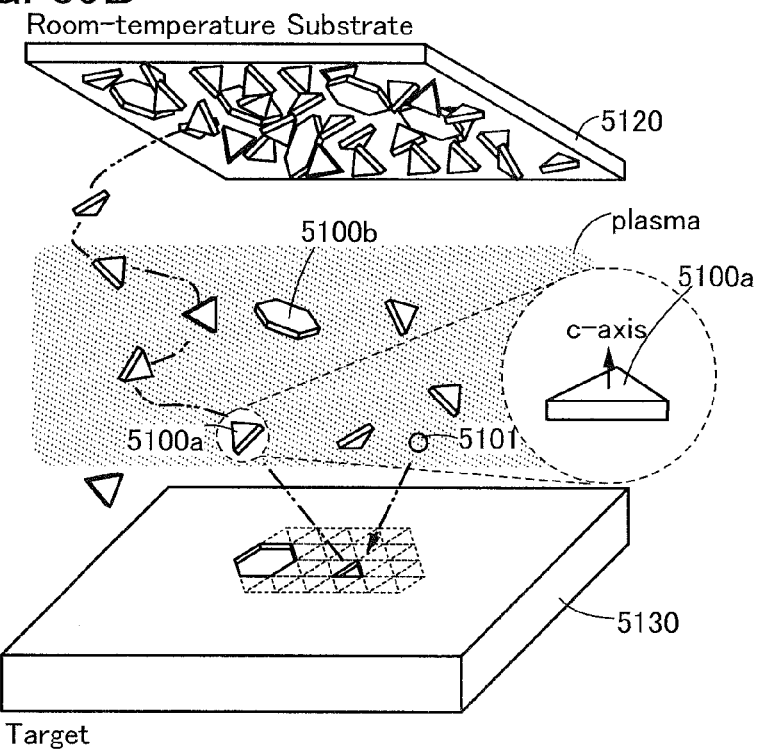

As shown in FIGS. 39A and 39B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, magnet units and/or the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 39A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 41A to 41D are cross-sectional schematic views.

Figure 41A:
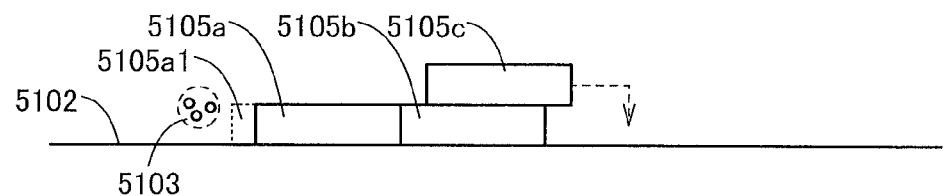
FIGS. 41A to 41D are schematic views showing deposition models of a CAAC-OS.

As illustrated in FIG. 41A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 41B:
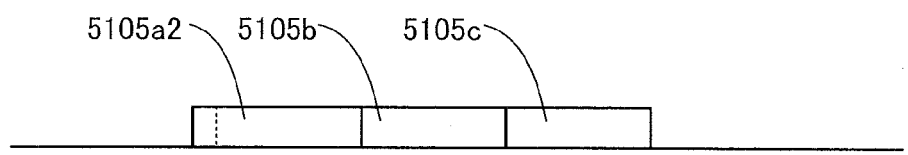

Then, as illustrated in FIG. 41B, the region 5105a1 grows to part of the pellet 5105a to form a pellet 5105a2. In addition, a side surface of the pellet 5105c is in contact with another side surface of the pellet 5105b.

Figure 41C:
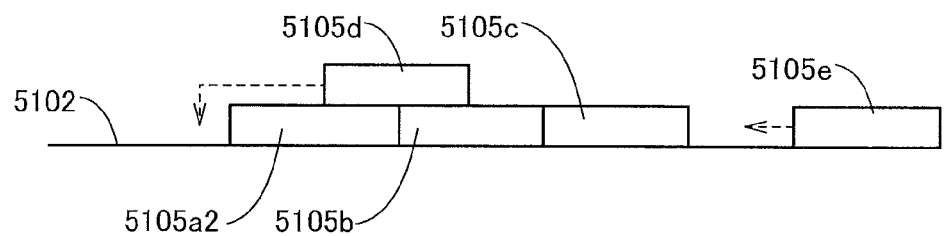

Next, as illustrated in FIG. 41C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 41D:
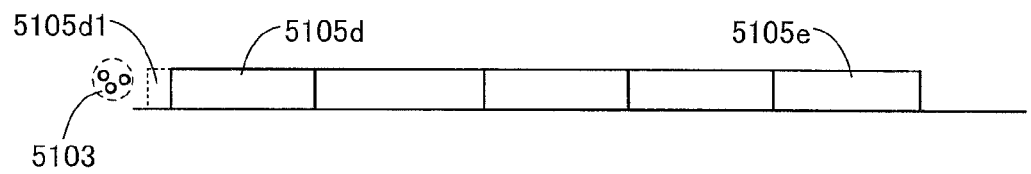

Then, as illustrated in FIG. 41D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 38 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

The structure described in this embodiment can be used in appropriate combination with the structure described in any of the other embodiments.

Embodiment 3

In this embodiment, an example of a display device that includes any of the transistors described in the above embodiment will be described below with reference to FIG. 8, FIG. 9, and FIG. 10.

Figure 8:
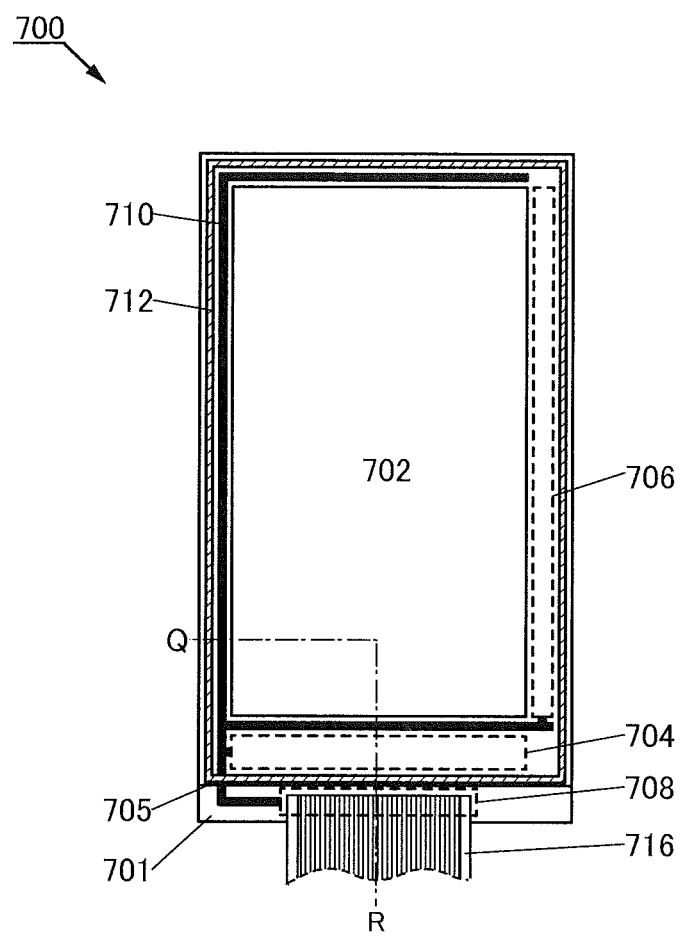
FIG. 8 is a top view illustrating one embodiment of a display device.

FIG. 8 is a top view of an example of a display device. A display device 700 illustrated in FIG. 8 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 8, a display element is provided between the first substrate 701 and the second substrate 705.

In the display device 700, a flexible printed circuit (FPC) terminal portion 708 electrically connected each other to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, display media whose contrast, luminance, reflectivity, transmittance, or the like is changed by an electrical or magnetic effect may be included. Examples of display devices having EL elements include an EL display.

Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G B, Y, and W. By using a self-luminous element, power consumption can be further reduced as compared with the case of using the coloring layer in some cases.

In this embodiment, a structure including a liquid crystal element and an EL element as display elements is described with reference to FIG. 9 and FIG. 10. Note that FIG. 9 is a cross-sectional view along the dashed-dotted line Q-R shown in FIG. 8 and shows a structure including a liquid crystal element as a display element, whereas FIG. 10 is a cross-sectional view along the dashed-dotted line Q-R shown in FIG. 8 and shows a structure including an EL element as a display element.

Figure 9:
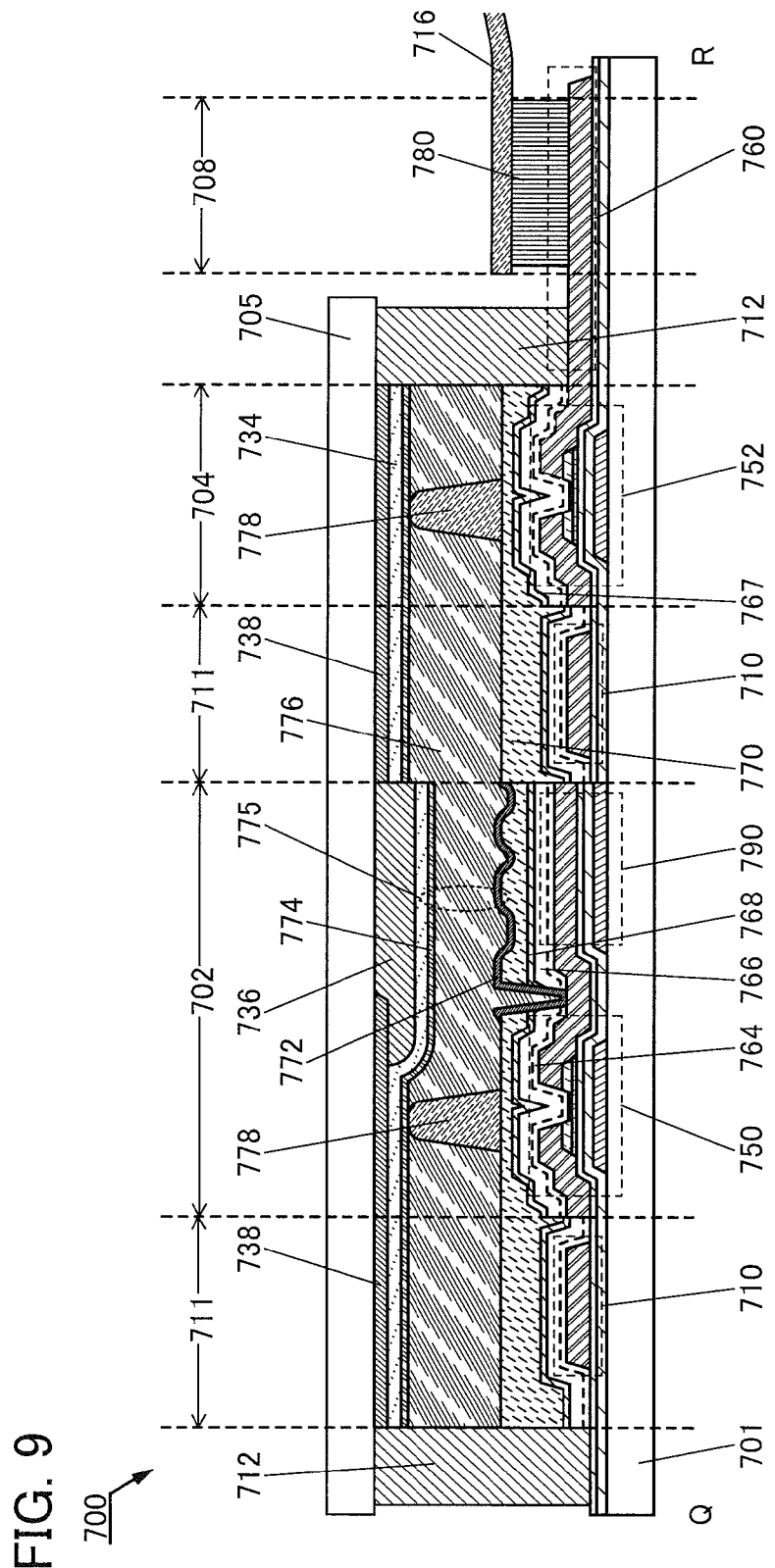
FIG. 9 is a cross-sectional view illustrating one embodiment of a display device.
Figure 10:
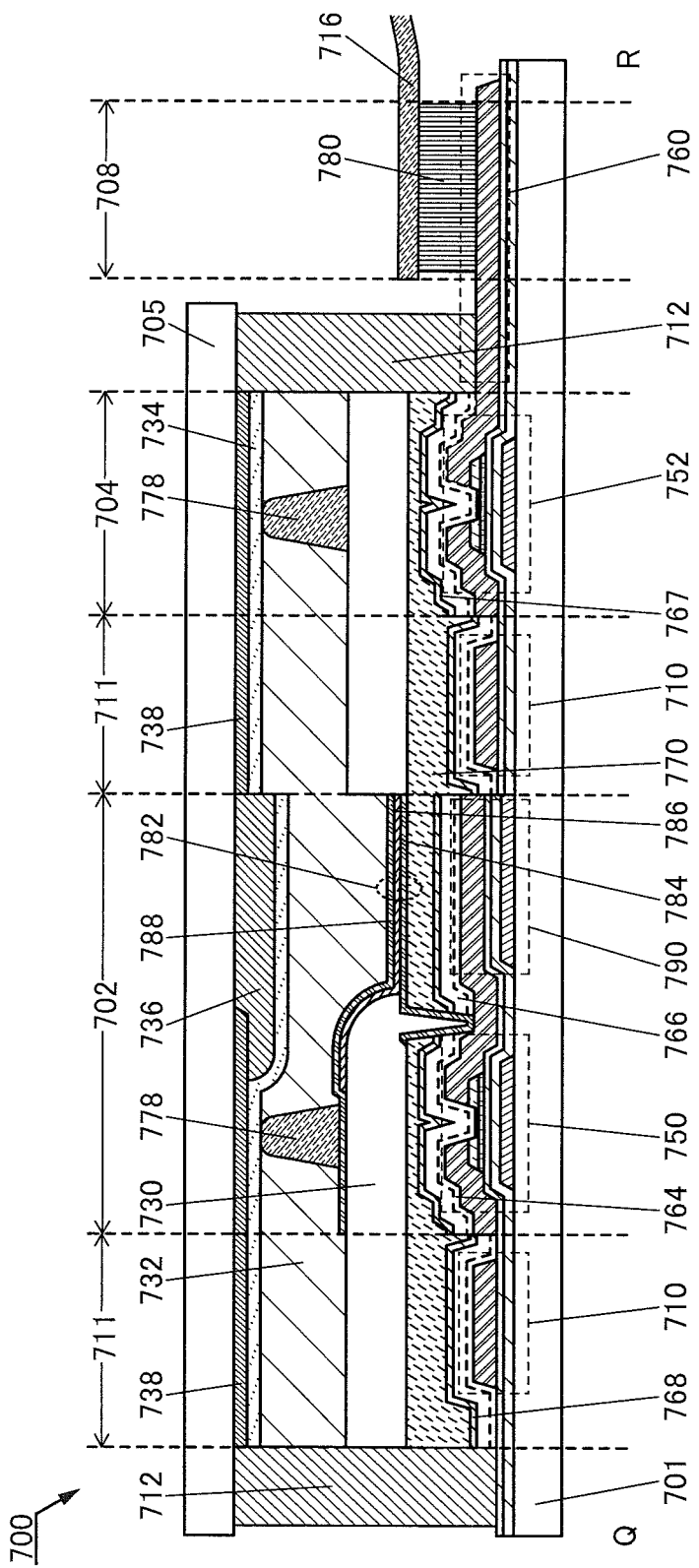
FIG. 10 is a cross-sectional view illustrating one embodiment of a display device.

Common portions between FIG. 9 and FIG. 10 are described first, and then different portions are described.

<Common Portions in Display Devices>

The display device 700 illustrated in FIG. 9 and FIG. 10 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancy is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, whereby the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 9 and FIG. 10, insulating films 764, 766, and 768, an oxide semiconductor film 767, and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The oxide semiconductor film 767 can be formed using a material and a method similar to those of the oxide semiconductor film 108 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same steps as conductive films functioning as source and drain electrodes of the transistor 750 or 752. Note that the signal line 710 may be formed using a conductive film which is formed in different steps as a source electrode and a drain electrode of the transistor 750 or 752, for example, a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same steps as the conductive films functioning as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 in FIG. 9 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 9 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive film functioning as a source and drain electrode included in the transistor 750. The conductive film 772 is formed over the planarization insulating film 770 to function as a pixel electrode, that is, one electrode of the display element. The conductive film 772 functions as a reflective electrode. The display device 700 in FIG. 9 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one of indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because, when the aluminum film that is the bottom layer is exposed after the etching of the silver alloy film that is the top layer, electrons are extracted from metal that is less noble than the silver alloy film, that is, aluminum that is metal having a high ionization tendency, and thus etching of the silver alloy film is suppressed.

Note that projections and depressions are provided in part of the planarization insulating film 770 of the pixel portion 702 in the display device 700 in FIG. 9. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 in FIG. 9 is a reflective color liquid crystal display device given as an example, but a display type is not limited thereto. For example, a transmissive color liquid crystal display device in which a conductive film that transmits visible light is used as the conductive film 772 may be used. In the case of a transmissive color liquid crystal display device, projections and depressions are not necessarily provided on the planarization insulating film 770.

Although not illustrated in FIG. 9, an alignment film may be provided on a side of the conductive film 772 in contact with the liquid crystal layer 776 and on a side of the conductive film 774 in contact with the liquid crystal layer 776. Although not illustrated in FIG. 9, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 10 includes a light-emitting element 782. The light-emitting element 782 includes a conductive film 784, an EL layer 786, and a conductive film 788. The display device 700 in FIG. 10 is capable of displaying an image by light emission from the EL layer 786 included in the light-emitting element 782.

The conductive film 784 is connected to the conductive film functioning as a source and drain electrode included in the transistor 750. The conductive film 784 is formed over the planarization insulating film 770 to function as a pixel electrode, that is, one electrode of the display element. A conductive film which transmits visible light or a conductive film which reflects visible light can be used as the conductive film 784. The conductive film which transmits visible light can be formed using a material including one of indium (In), zinc (Zn), and tin (Sn), for example. The conductive film which reflects visible light can be formed using a material including aluminum or silver, for example.

In the display device 700 in FIG. 10, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 10, the structure is not limited thereto. In the case where the EL layer 786 is formed by a separate coloring method, the coloring film 736 is not necessarily provided.

The structure described in this embodiment can be used in appropriate combination with the structure described in any of the other embodiments.

Embodiment 4

In this embodiment, a display device that includes a semiconductor device of one embodiment of the present invention will be described with reference to FIGS. 18A to 18C.

The display device illustrated in FIG. 11A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504*a* has a function of supplying an initialization signal. Without being limited thereto, the gate driver 504*a* can supply another signal.

The source driver 504*b* includes a shift register or the like. The source driver 504*b* receives a signal (video signal) from which a data signal is derived, as well as a signal for driving the shift register, through the terminal portion 507. The source driver 504*b* has a function of generating a data signal to be written to the pixel circuit 501 which is based on the video signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches, for example. The source driver 504*b* can output, as the data signals, signals obtained by time-dividing the video signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (in is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 11A:
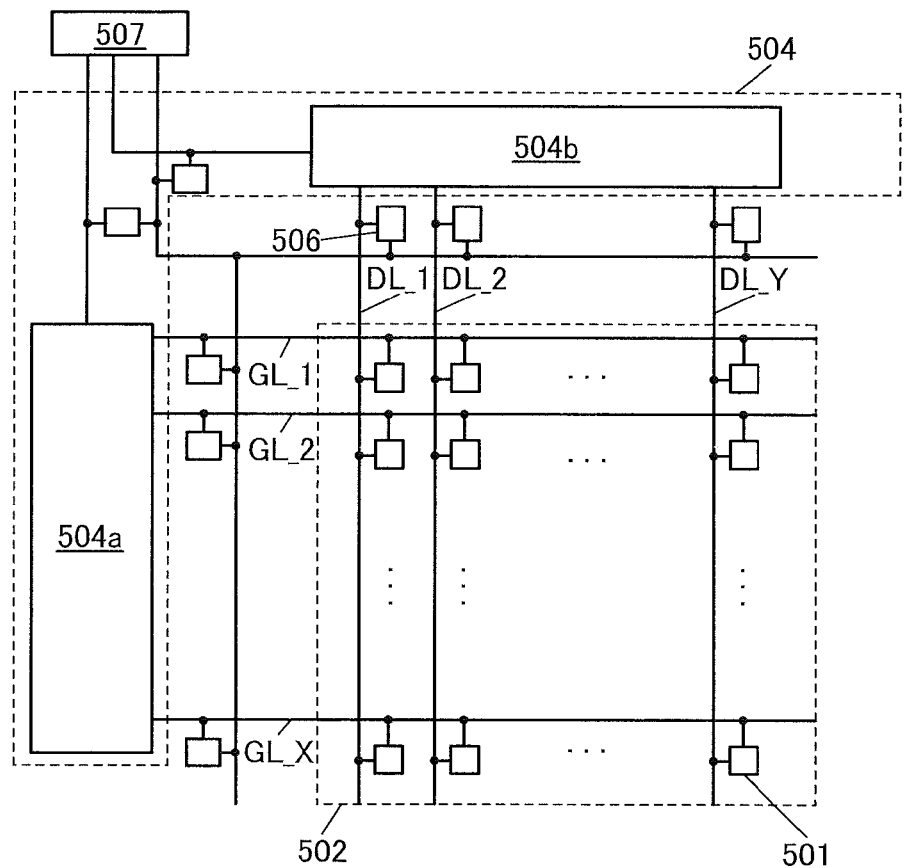
FIGS. 11A to 11C are a block diagram and circuit diagrams illustrating a display device.

The protection circuit 506 illustrated in FIG. 11A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 11A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 11A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 11B:
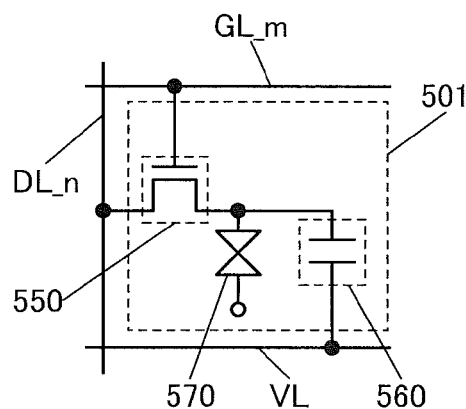

Each of the plurality of pixel circuits 501 in FIG. 11A can have the structure illustrated in FIG. 11B, for example.

The pixel circuit 501 illustrated in FIG. 11B includes a liquid crystal element 570, a transistor 550, and a capacitor 560. As the transistor 550, any of the transistors described in the above embodiment can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 11B, the pixel circuits 501 are sequentially selected row by row by the gate driver 504*a* illustrated in FIG. 11A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 11C:
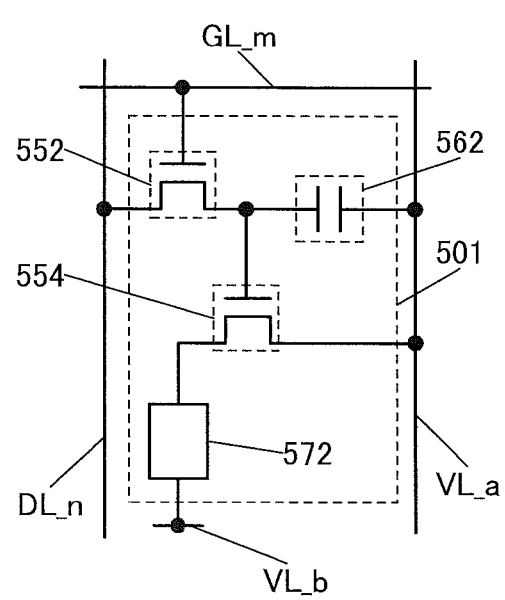

Alternatively, each of the plurality of pixel circuits 501 in FIG. 11A can have the structure illustrated in FIG. 11C, for example.

The pixel circuit 501 illustrated in FIG. 11C includes transistors 552 and 554, a capacitor 562, and a light-emitting element 572. Any of the transistors described in the above embodiment can be used as one or both of the transistors 552 and 554.

One of a source electrode and a drain electrode of the transistor 552 is electrically connected to a wiring to which a data signal is supplied (hereinafter referred to as a data line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 11C, the pixel circuits 501 are sequentially selected row by row by the gate driver 504a illustrated in FIG. 11A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image can be displayed.

The structure described in this embodiment can be used in appropriate combination with the structure described in any of the other embodiments.

Embodiment 5

Figure 12:
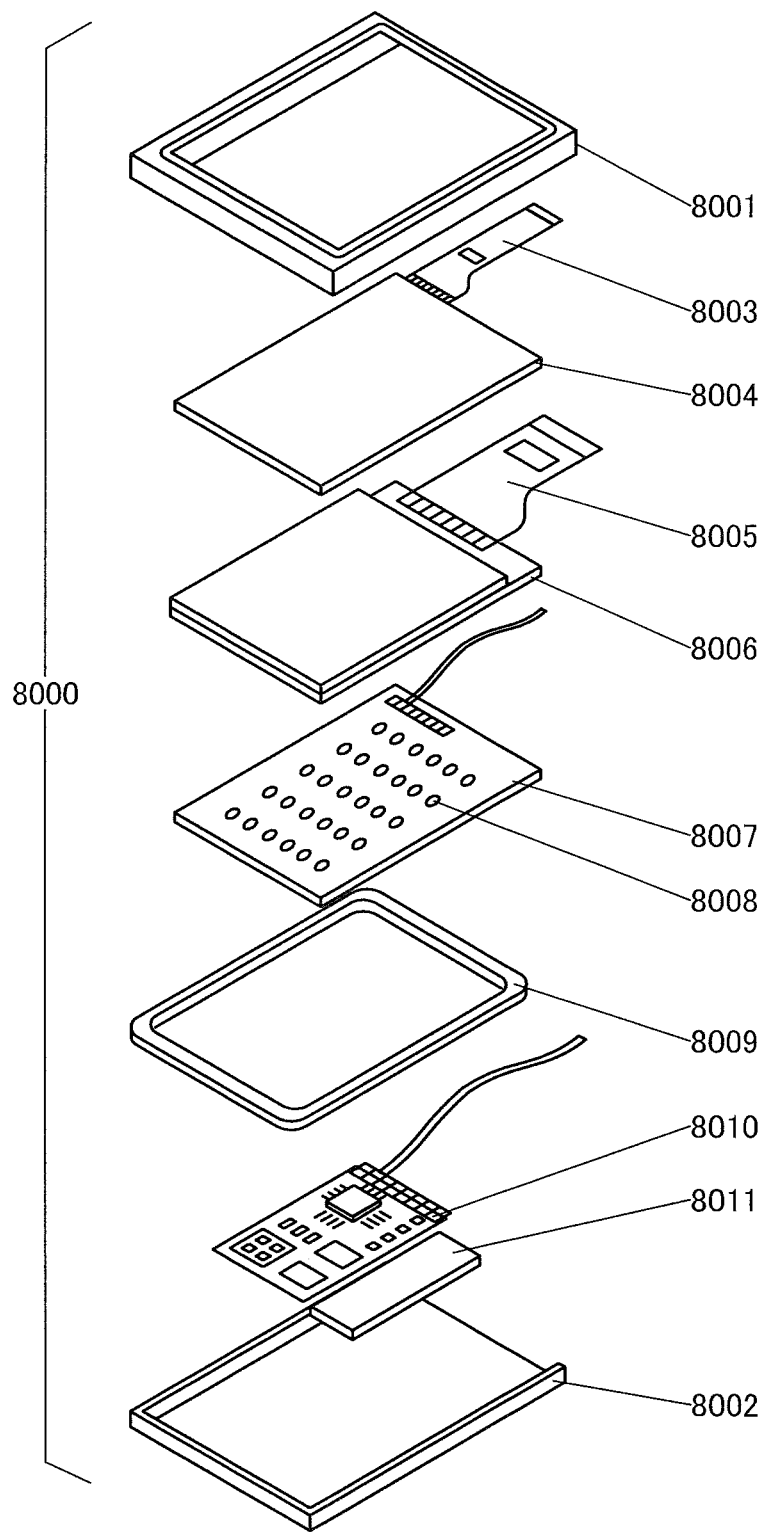
FIG. 12 is a diagram illustrating a display module.

In this embodiment, a display module and electronic devices that include a semiconductor device of one embodiment of the present invention will be described with reference to FIG. 12 and FIGS. 13A to 13G In a display module 8000 illustrated in FIG. 12, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 12, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 13A to 13G illustrate electronic devices. These electronic device s can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 13A to 13G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 13A to 13G are not limited to those described above, and the electronic devices can have a variety of functions. Although not illustrated in FIGS. 13A to 13G, the electronic device may include a plurality of display portions. Furthermore, the electronic device may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic devices illustrated in FIGS. 13A to 13G are described in detail below.

Figure 13A:
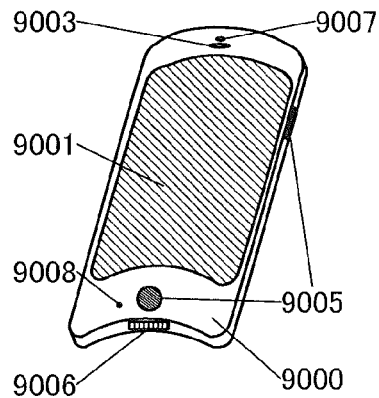
FIGS. 13A to 13G illustrate electronic devices.

FIG. 13A is a perspective view illustrating a portable information terminal 9100. A display portion 9001 of the portable information terminal 9100 is flexible. Therefore, the display portion 9001 can be incorporated along a bent surface of a bent housing 9000. Furthermore, the display portion 9001 includes a touch sensor, and operation can be performed by touching the screen with a finger, a stylus, or the like. For example, by touching an icon displayed on the display portion 9001, an application can be started.

Figure 13D:
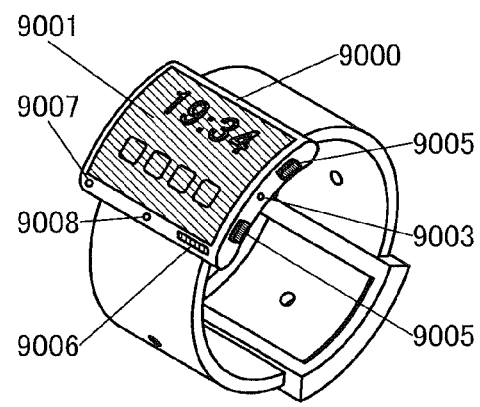
Figure 13B:
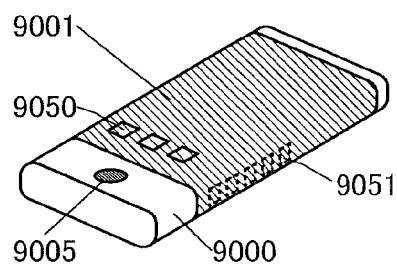

FIG. 13B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that although the speaker 9003, the connection terminal 9006, the sensor 9007, and the like of the portable information terminal 9101 are not illustrated in FIG. 13B, they can be provided in the same positions as the portable information terminal 9100 in FIG. 13A. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 13E:
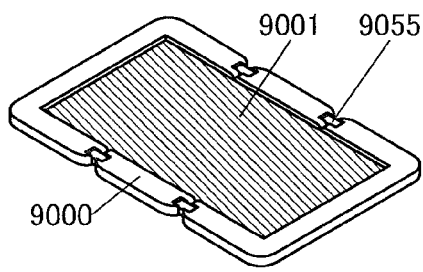
Figure 13C:
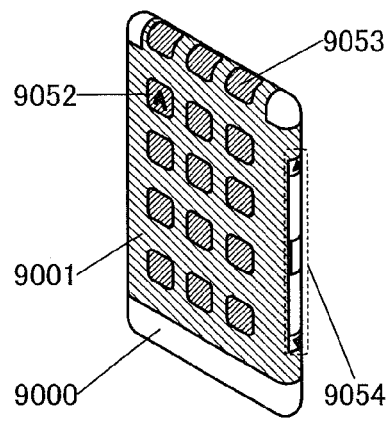

FIG. 13C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 13D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the correction terminal 9006, and data can be directly transmitted to and received from another information terminal via a connector. Charging through the connection terminal 9006 is possible. Note that the charging operation may be performed by wireless power feeding without using the connection terminal 9006.

Figure 13F:
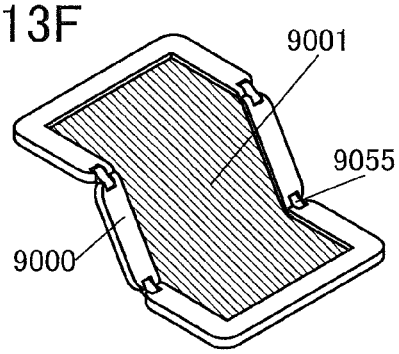
Figure 13G:
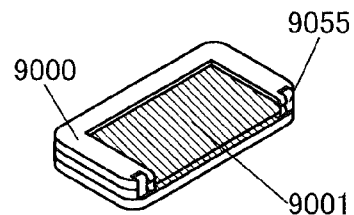

FIGS. 13E, 13F, and 13G are perspective views each illustrating a foldable portable information terminal 9201. FIG. 13E is a perspective view illustrating the portable information terminal 9201 that is opened, FIG. 13F is a perspective view illustrating the portable information terminal 9201 that is being opened or being folded, and FIG. 13G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with any of the structures described in the other embodiments.

Example 1

In Example 1, samples A1 to A3 for analysis were fabricated and subjected to SIMS analysis.

The samples for the analysis fabricated in Example 1 are described first.

(Samples A1 to A3)

First, a 100-nm-thick oxide semiconductor film was formed over a 0.7-mm-thick glass substrate. Note that the oxide semiconductor films of the samples A1 to A3 differ in composition.

The oxide semiconductor film of the sample A1 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

The oxide semiconductor film of the sample A2 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=3:1:2).

The oxide semiconductor film of the sample A3 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=4:2:4.1).

Next, heat treatment was performed. The heat treatment was performed at 450° C. in a nitrogen atmosphere for 1 hour and then performed again at 450° C. in a mixed atmosphere of nitrogen and oxygen for 1 hour. Although the heat treatment was performed at 450° C. on each sample to reduce hydrogen concentration of the oxide semiconductor film in this example, heat treatment is preferably performed at 350° C. or lower in a practical process of manufacturing a transistor.

Through these steps, the samples A1 to A3 were fabricated.

Figure 14:
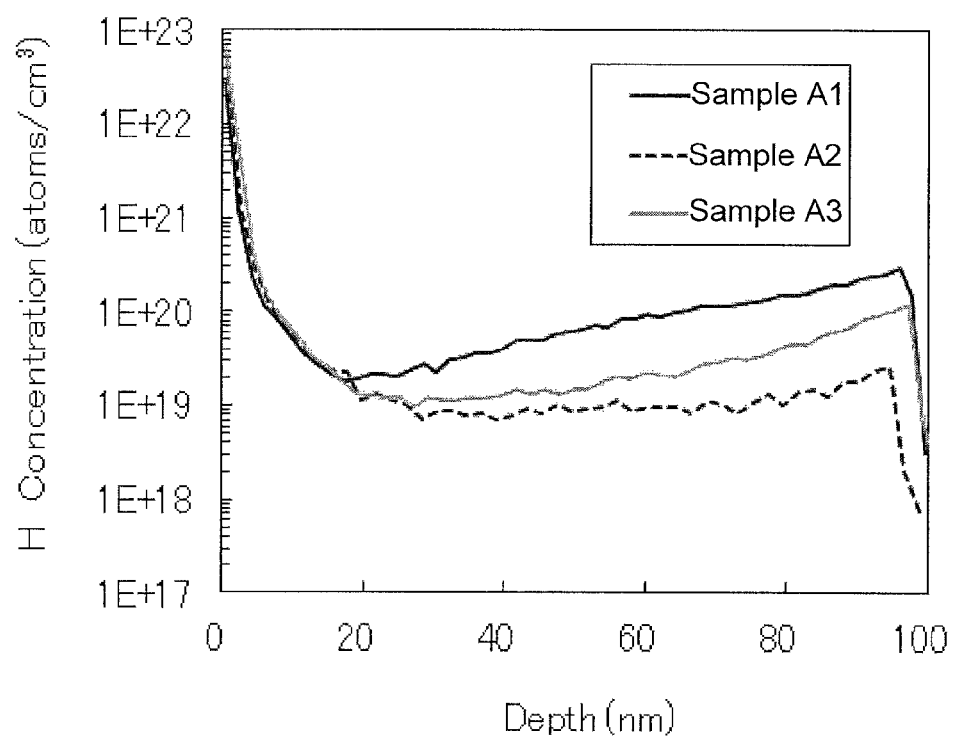
FIG. 14 shows results of SIMS analysis.

Next, SIMS analysis was performed to measure hydrogen concentrations of the oxide semiconductor films of the fabricated samples A1 to A3. FIG. 14 shows the analysis results of the samples A1 to A3. Note that the vertical axis and the horizontal axis in FIG. 14 indicate hydrogen concentration (atoms/cm$^3$) and depth (nm), respectively.

As shown in the results of FIG. 14, a hydrogen concentration of the oxide semiconductor film of the sample A1 was $6.33 \times 10^{19}$ atoms/cm$^3$. A hydrogen concentration of the oxide semiconductor film of the sample A2 was $8.64 \times 10^{18}$ atoms/cm$^3$. A hydrogen concentration of the oxide semiconductor film of the sample A3 was $1.46 \times 10^{19}$ atoms/cm$^3$. Note that each hydrogen concentration of the oxide semiconductor films was measured at a thickness of 50 nm.

When the oxide semiconductor film of the sample A1 is formed over the oxide semiconductor film of the sample A2, a structure in which an IGZO film (In:Ga:Zn=1:1:1.2) is formed over an IGZO film (In:Ga:Zn=3:1:2) is obtained. When the oxide semiconductor film of the sample A1 is formed over the oxide semiconductor film of the sample A3, a structure in which an IGZO film (In:Ga:Zn=1:1:1.2) is formed over an IGZO film (In:Ga:Zn=4:2:4.1) is obtained.

A semiconductor device of one embodiment of the present invention preferably includes a layered structure of oxide semiconductor films in which a hydrogen concentration of the upper oxide semiconductor film is higher than a hydrogen concentration of the lower oxide semiconductor film. Furthermore, an atomic proportion of In is larger than the atomic proportion of Ga in the lower oxide semiconductor film, and an atomic proportion of In in the upper oxide semiconductor film is smaller than that in the lower oxide semiconductor film. The laminated structure of oxide semiconductor films with such compositions achieves a semiconductor device with high field-effect mobility and reliability.

The structure described in this example can be used in appropriate combination with any of the structures described in the other embodiments and examples.

Example 2

In Example 2, the amount of hydrogen and water released from an insulating film of the semiconductor device of one embodiment of the present invention was evaluated using TDS. In addition, defects to be carrier traps of the insulating film of the semiconductor device of one embodiment of the present invention were evaluated using ESR. Samples B1 to B4 and samples C1 to C4 were fabricated.

First, the samples B1 to B4 are described in detail.

<Sample B1>

The sample B1 includes a 100-nm-thick silicon nitride film over a glass substrate.

The silicon nitride film of the sample B1 was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus.

<Sample B2>

The sample B2 includes a 100-nm-thick silicon nitride film over a glass substrate.

The silicon nitride film of the sample B2 was deposited under the same conditions as those used for forming the sample B1 except that the flow rate of an ammonia gas was 2000 sccm.

<Sample B3>

The sample B3 includes a 200-nm-thick silicon oxynitride film over a glass substrate.

The silicon oxynitride film of the sample B3 was deposited under the conditions where the substrate temperature was 350° C., a silane gas at a flow rate of 20 sccm and a dinitrogen monoxide gas at a flow rate of 3000 sccm were introduced into a chamber, the pressure was set 40 Pa, and an RF power of 1000 W was supplied between parallel-plate electrodes placed in a PECVD apparatus.

<Sample B4>

The sample B4 includes a 200-nm-thick silicon oxynitride film over a glass substrate.

The silicon oxynitride film of the sample B4 was deposited under the same conditions as those used for forming the sample B3 except that the RF power was 100 W.

<TDS Measurement>

Next, the fabricated samples B1 to B4 were subjected to TDS measurement. In the TDS measurement, each sample was heated at temperatures ranging from 50° C. to 500° C. to evaluate the amount of gas released from the insulating film of each sample. The amount of hydrogen released from the silicon nitride film of each of the samples B1 and B2 was evaluated. Note that the amount of released gas having a mass-to-charge ratio (M/z) of 2 was measured as the amount of released hydrogen. The amount of $H_2O$ released from the silicon oxynitride film of each of the samples B3 and B4 was evaluated. Note that the amount of released gas having a mass-to-charge ratio (M/z) of 18 was measured as the amount of released $H_2O$.

FIGS. 15A and 15B and FIGS. 16A and 16B show TDS measurement results of the samples B1, B2, B3, and B4, respectively. Note that the vertical axis and the horizontal axis in FIGS. 15A and 15B to FIGS. 16A and 16B indicate intensity (arbitrary unit) and substrate temperature (° C.), respectively.

Figure 15A:
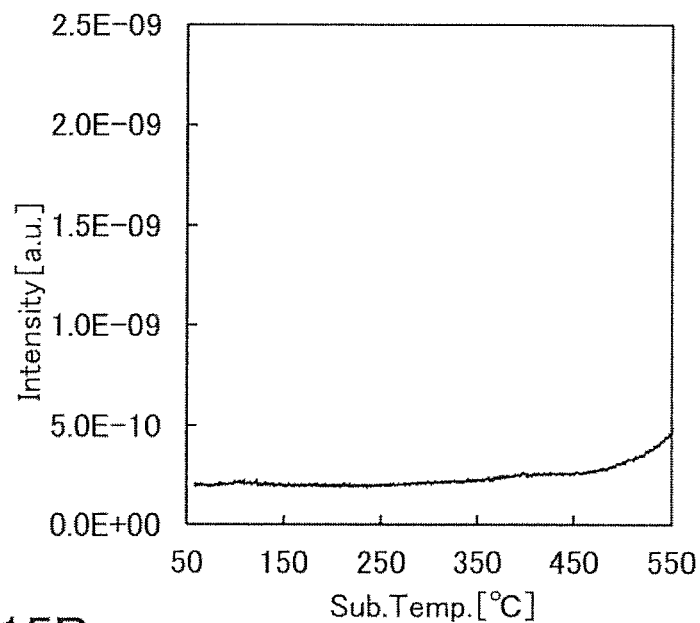
FIGS. 15A and 15B show TDS analysis results.
Figure 15B:
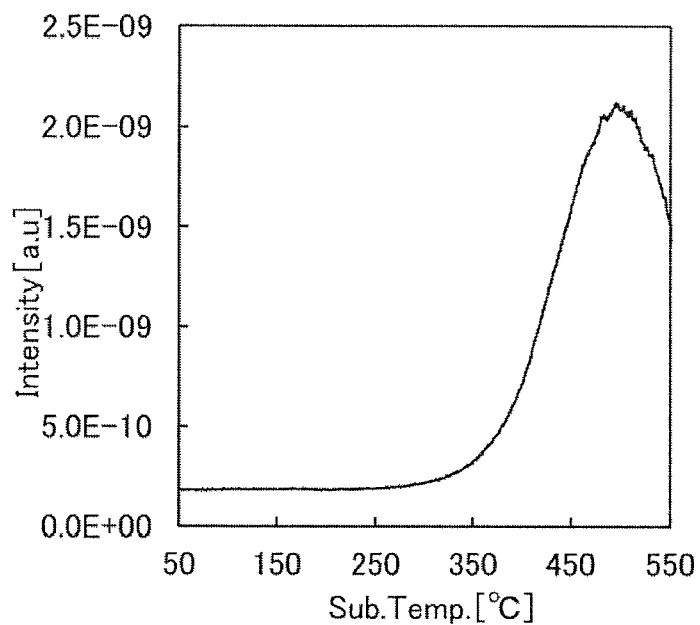

The results in FIGS. 15A and 15B show that the reduction in flow rate of an ammonia gas allows deposition of the silicon nitride film from which hydrogen is less released.

Figure 16A:
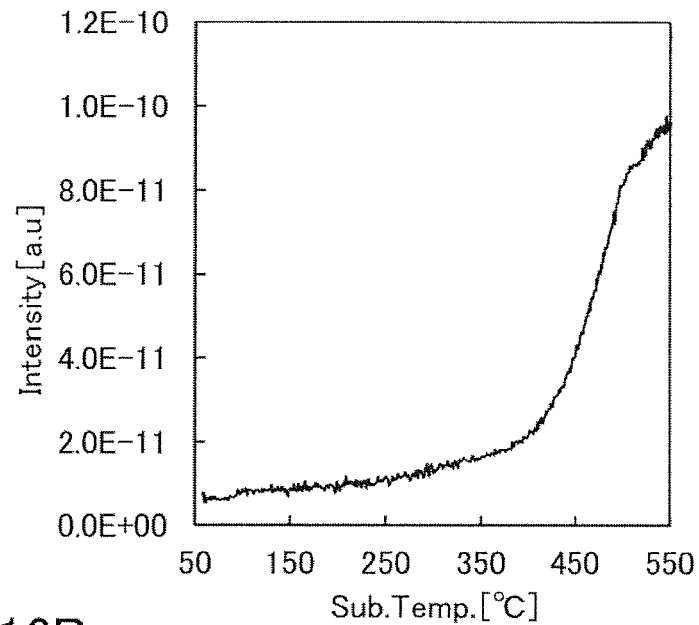
FIGS. 16A and 16B show results of TDS analysis.
Figure 16B:
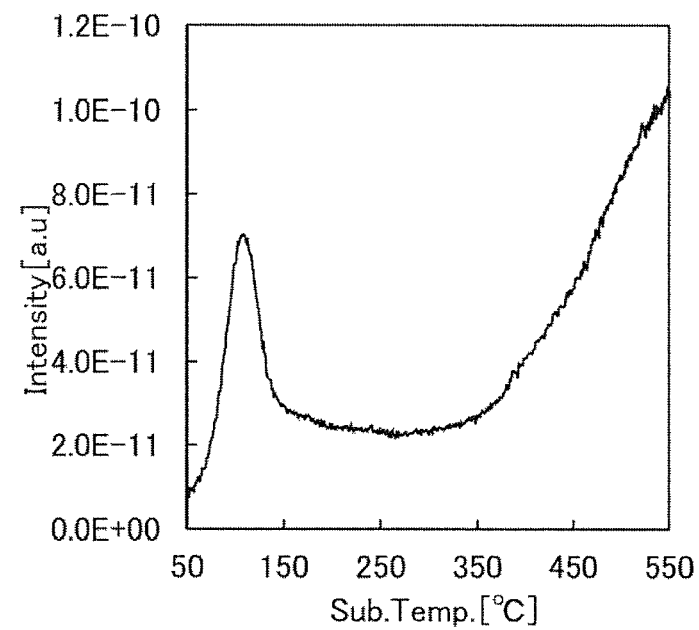

The results in FIGS. 16A and 16B show that the increase in RF power allows deposition of the silicon oxynitride film from which water is less released.

Next, the samples C1 to C4 are described in detail.
<Sample C1>
The sample C1 includes a 100-nm-thick silicon nitride film over a glass substrate.

The silicon nitride film used in the sample C1 was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was 100 Pa; and an RF power of 2000 W was supplied between parallel-plate electrodes provided in a PECVD apparatus.
<Sample C2>
The sample C2 includes a 100-nm-thick silicon nitride film over a glass substrate.

The silicon nitride film used in the sample C2 was deposited under the conditions where the substrate temperature was 280° C.; a silane gas at a flow rate of 100 sccm, a nitrogen gas at a flow rate of 1000 sccm, and an ammonia gas at a flow rate of 50 sccm were introduced into a chamber; the pressure was 100 Pa; and an RF power of 750 W was supplied between parallel-plate electrodes provided in a PECVD apparatus.
<Sample C3>
The sample C3 includes a 100-nm-thick silicon oxynitride film over a glass substrate.

The silicon oxynitride film was deposited under the conditions where the substrate temperature was 280° C., a silane gas at a flow rate of 50 sccm and a dinitrogen monoxide gas at a flow rate of 1250 sccm were introduced into a chamber, the pressure was 20 Pa, and an RF power of 750 W was supplied between parallel-plate electrodes provided in a PECVD apparatus.
<Sample C4>
The sample C4 includes a 100-nm-thick silicon oxynitride film over a glass substrate.

The silicon oxynitride film of the sample C4 was deposited under the same conditions as those used for forming the sample C3 except that the RF power was 250 W.
☐ESR Measurement☐

Next, the fabricated samples C1 to C4 were subjected to ESR measurement. In the ESR measurement performed at a predetermined temperature, a value of a magnetic field ($H_0$) where a microwave is absorbed is used for an equation $g=h\nu/\beta H_0$, and a parameter "g-factor" can be obtained. Note that ν indicates the frequency of the microwave. Note that the frequency of the microwave is denoted by ν, and the Planck constant and the Bohr magneton are denoted by, respectively, h and β which are both constants.

Conditions of the ESR measurement on the samples C1 and C2 are as follows: the measurement temperature was room temperature (25° C.), the high-frequency power (power of microwaves) of 9.2 GHz was 0.1 mW, and the direction of a magnetic field was parallel to a surface of each sample. Note that the detection limit of a spin density of a signal attributed to K-center in the silicon nitride film was $1.5 \times 10^{16}$ spins/cm$^3$.

Conditions of the ESR measurement on the samples C3 and C4 are as follows: the measurement temperature was room temperature (25° C.), the high-frequency power (power of microwaves) of 9.2 GHz was 0.005 mW, and the direction of a magnetic field was parallel to a surface of each sample. Note that the detection limit of a spin density of a signal attributed to E'-center in the silicon oxynitride film was $1.5 \times 10^{16}$ spins/cm$^3$.

Figure 17:
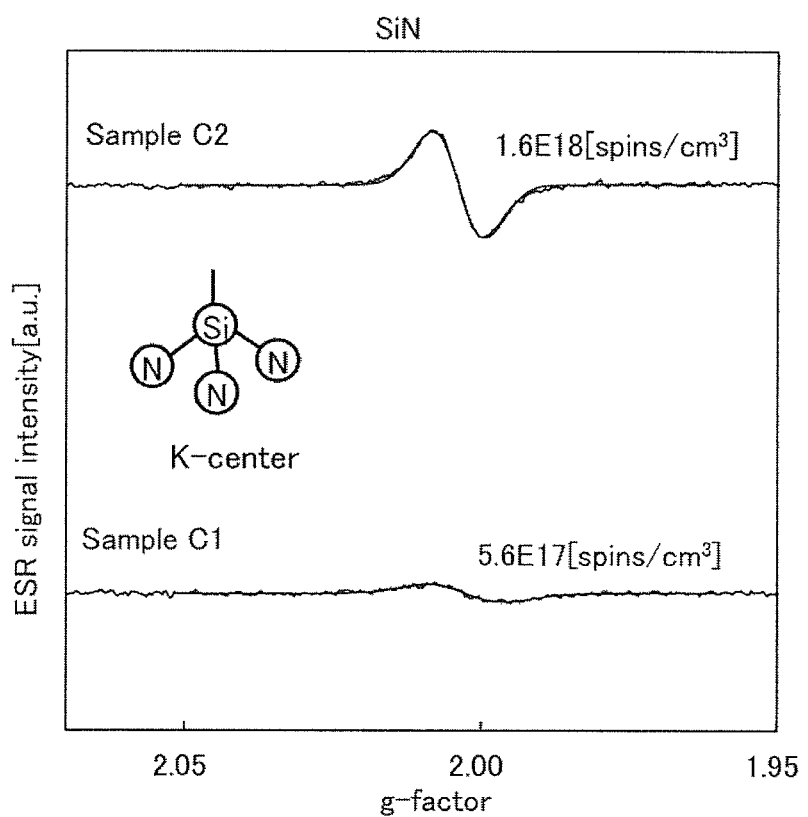
FIG. 17 shows results of ESR measurement.
Figure 18:
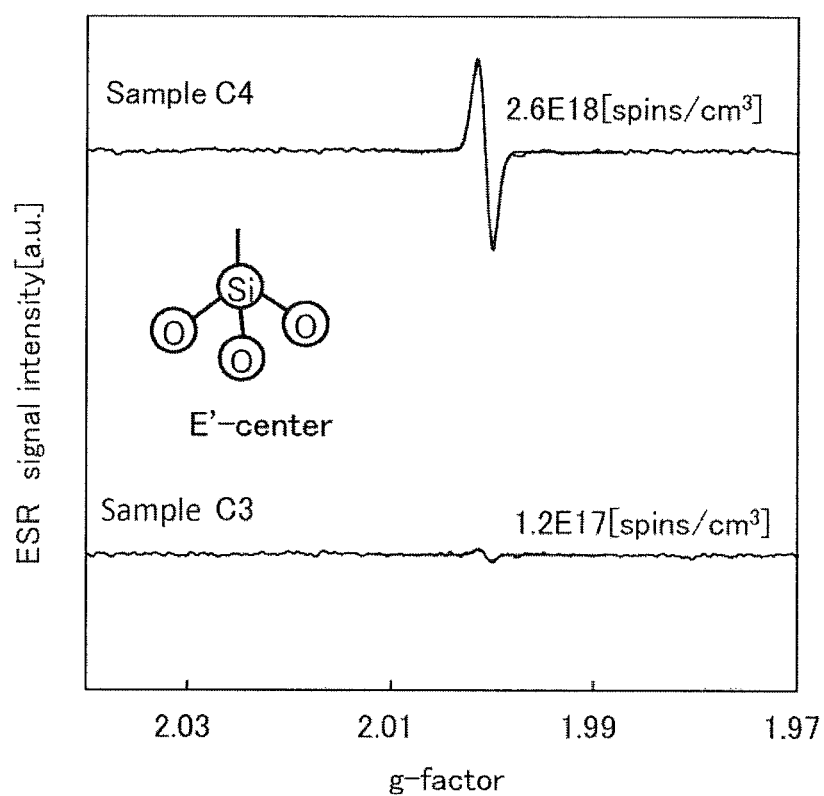
FIG. 18 shows results of ESR measurement

FIG. 17 shows ESR spectra obtained by the ESR measurement on the samples C1 and C2. FIG. 18 shows ESR spectra obtained by the ESR measurement for the samples C3 and C4.

As shown in FIG. 17, the intensity of the signal attributed to K-center is smaller in the sample C1 than the sample C2. K-center is a defect due to a dangling bond of silicon illustrated in FIG. 17. These results show that the deposition at a higher temperature and a higher RF power allows deposition of the silicon nitride film with less dangling bonds of silicon.

As shown in FIG. 18, the intensity of the signal attributed to E'-center is smaller in the sample C3 than the sample C4. E'-center is a defect due to a dangling bond of silicon illustrated in FIG. 18. These results show that the deposition at a higher temperature and a higher RF power allows deposition of the silicon oxynitride film with less dangling bonds of silicon.

The structure described in this example can be used in appropriate combination with any of the structures described in the other embodiments and examples.

Example 3

In this example, transistors corresponding to the transistor 170 illustrated in FIGS. 3A to 3C were fabricated, and their ID-VG characteristics were evaluated. Samples D1 to D3 described below were fabricated for the evaluation in this example. Note that the samples D1 and D2 each include a transistor which is a comparative example, whereas the sample D3 includes a transistor which is one embodiment of the present invention. Each of the samples D1 to D3 includes a transistor having a channel length L of 2 μm and a channel width W of 50 μm, a transistor having a channel length L of 3 μm and a channel width W of 50 μm, and a transistor having a channel length L of 6 μm and a channel width W of 50 μm.

The samples formed in this example are described below. Note that the reference numerals used for the transistor 170 in FIGS. 3A to 3C are used in the following description.
<Manufacturing Method of Sample D1>
First, the conductive film 104 was formed over the substrate 102. As the substrate 102, a glass substrate was used. As the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

The insulating film 106 was deposited as follows. First, a 50-nm-thick silicon nitride film was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus. Then, the flow rate of an ammonia gas was changed to 2000 sccm to deposit a 300-nm-thick silicon nitride film. Finally, the flow rate of an ammonia gas was changed to 100 sccm to deposit a 50-nm-thick silicon nitride film.

The insulating film 107 was deposited under the conditions where the substrate temperature was 350° C., a silane gas at a flow rate of 20 sccm and a dinitrogen monoxide gas at a flow rate of 3000 sccm were introduced into a chamber, the pressure was 40 Pa, and an RF power of 100 W was supplied between parallel-plate electrodes provided in a PECVD apparatus.

Then, the oxide semiconductor film 108 was formed over the insulating film 107. As the oxide semiconductor film 108, a single-layer IGZO film was formed with a sputtering apparatus. A 35-nm-thick IGZO film was formed as the oxide semiconductor film 108. Note that the oxide semiconductor film 108 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Then, first heat treatment was performed. As the first heat treatment, heat treatment was performed at 450° C. for 1 hour in a nitrogen atmosphere and then heat treatment was performed at 450° C. for 1 hour in a mixed atmosphere of nitrogen and oxygen.

Next, the conductive films 112a and 112b were formed over the insulating film 107 and the oxide semiconductor film 108. As the conductive films 112a and 112b, a 50-nm-thick tungsten film, a 400-nm-thick aluminum film, and a 100-nm-thick titanium film were successively formed in vacuum with a sputtering apparatus.

After that, the insulating film 114 and the insulating film 116 were formed over the insulating film 107, the oxide semiconductor film 108, and the conductive films 112a and 112b. As the insulating film 114, a 50-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in vacuum with a PECVD apparatus.

The insulating film 114 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in a nitrogen gas atmosphere for 1 hour.

Next, the following two processes were performed.
(1. ITSO Film Formation Process)

A 5-nm-thick ITSO film was formed over the insulating film 116 using a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$ =85:10:5 [wt. %]) provided in the sputtering apparatus.

(2. Oxygen Addition Process)

Next, oxygen addition treatment was performed on the oxide semiconductor film 108 and the insulating films 114 and 116 through the ITSO film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 600 sec. between parallel-plate electrodes provided in the ashing apparatus so that a bias would be applied to the substrate side.

Then, the substrate temperature was set to 350° C. and heat treatment was performed in a nitrogen atmosphere of 175 Pa, and the insulating film 118 was formed over the ITSO film. As the insulating film 118, a 100-nm-thick silicon nitride film was formed with a PECVD apparatus.

Next, the opening 142c reaching the conductive film 112b and the openings 142a and 142b reaching the conductive film 104 were formed. The openings 142a, 142b, and 142c were formed with a dry etching apparatus.

Next, a conductive film was formed over the insulating film 118 to cover the openings 142a, 142b, and 142c and processed to form the conductive films 120a and 120b. For the conductive films 120a and 120b, a 100-nm-thick ITSO film was formed with a sputtering apparatus. The composition of a target used for forming the ITSO film was the same as that used in the step of forming the ITSO film described above.

Then, third heat treatment was performed. The third heat treatment was performed at 250° C. under a nitrogen atmosphere for 1 hour.

Through the above process, the sample D1 of this example was fabricated. Note that the highest temperature through the process for manufacturing the sample D1 was 450° C.

<Manufacturing Method of Sample D2>

A manufacturing method of the sample D2 is different from that of the sample D1 described above in the following step. The other steps were the same as the steps for the sample D1.

The first heat treatment was not performed on the sample D2.

The oxygen addition treatment was performed for 120 sec in the (2. oxygen addition treatment step) for the sample D2. Then, the ITSO film was removed to expose the insulating film 116. The ITSO film was removed using a wet-etching apparatus in such a manner that etching was performed using an oxalic acid solution at a concentration of 5% for 300 sec and then etching was performed using hydrofluoric acid at a concentration of 0.5% for 15 sec.

Then, the insulating film 118 is formed over the insulating film 116 without heat treatment.

Through the above process, the sample D2 of this example was fabricated. Note that the highest temperature through the process for manufacturing the sample D2 was 350° C.

<Manufacturing Method of Sample D3>

A fabrication method of the sample D3 which is different from that of the sample D1 described above will be described. The other steps were the same as the steps for the sample D1.

As the oxide semiconductor film 108 of the sample D3, a stacked layer in which the first oxide semiconductor film 108a on the conductive film 104 side and the second oxide semiconductor film 108b over the first oxide semiconductor film 108a was formed. The conductive film 104 serves as a gate electrode. A 10-nm-thick IGZO film and a 15-nm-thick IGZO film were formed as the first oxide semiconductor film 108a and the second oxide semiconductor film 108b, respectively.

Note that the first oxide semiconductor film 108a was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=4:2:4.1).

Note that the second oxide semiconductor film 108b was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

The first heat treatment was not performed on the sample D3.

The oxygen addition treatment was performed for 120 sec in the (2. oxygen addition treatment step) for the sample D3. Then, the ITSO film was removed to expose the insulating film 116. The ITSO film war removed using a wet-etching apparatus in such a manner that etching was performed using an oxalic acid solution at a concentration of 5% for 300 sec and then etching was performed using hydrofluoric acid at a concentration of 0.5% for 15 sec.

Then, the insulating film 118 is formed over the insulating film 116 without heat treatment.

Through the above process, the sample D3 of this example was fabricated. Note that the highest temperature through the process for fabricating the sample D3 was 350° C.

Figure 19A:
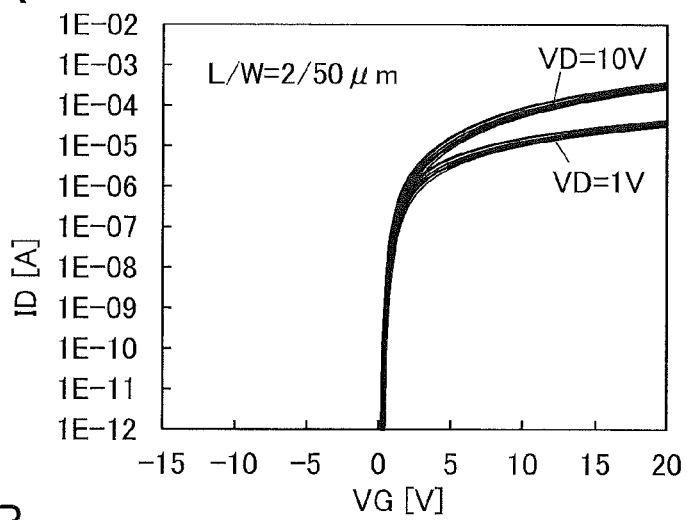
FIGS. 19A to 19C show ID-VG characteristics of a transistor according to Example.
Figure 19B:
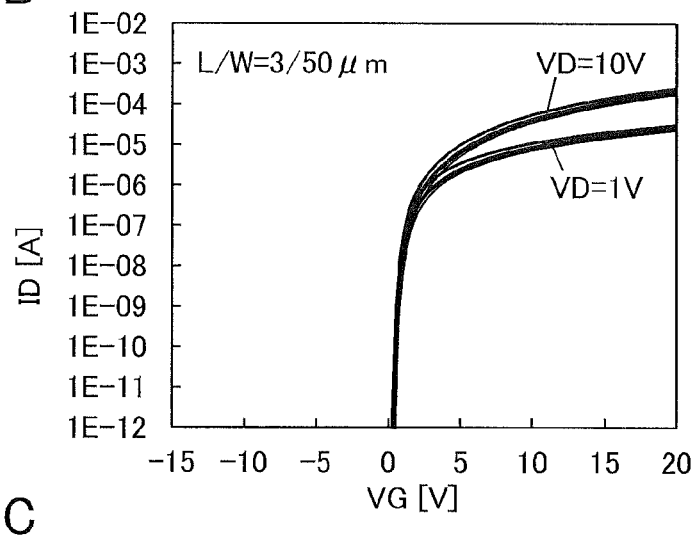
Figure 19C:
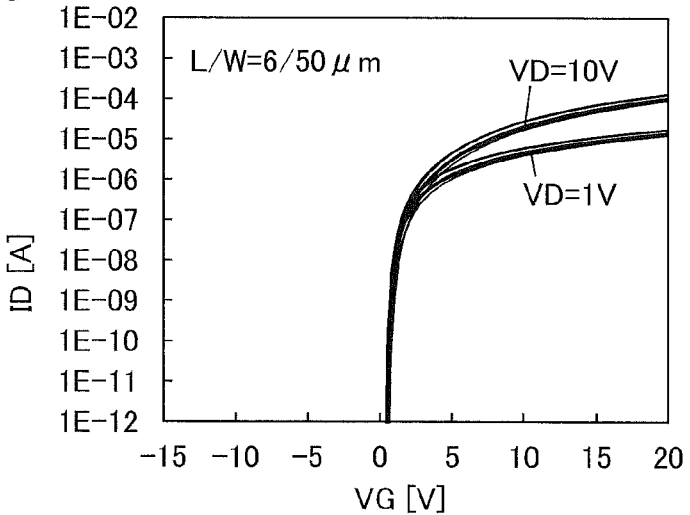
Figure 20A:
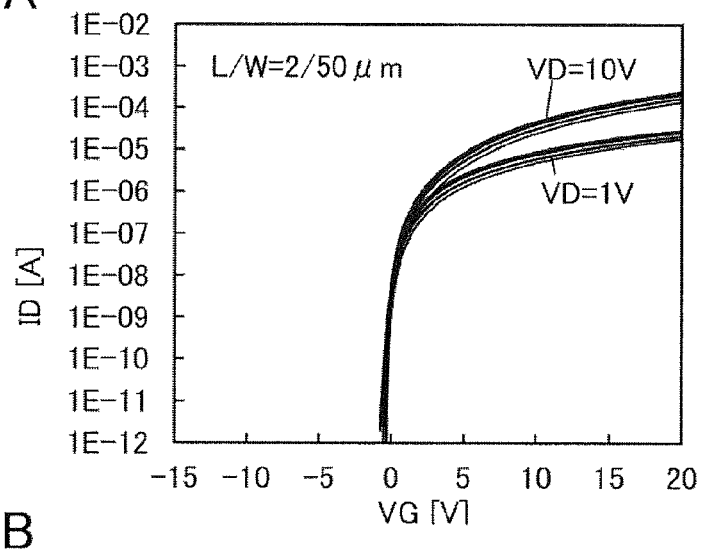
FIGS. 20A to 20C show ID-VG characteristics of a transistor according to Example.
Figure 20B:
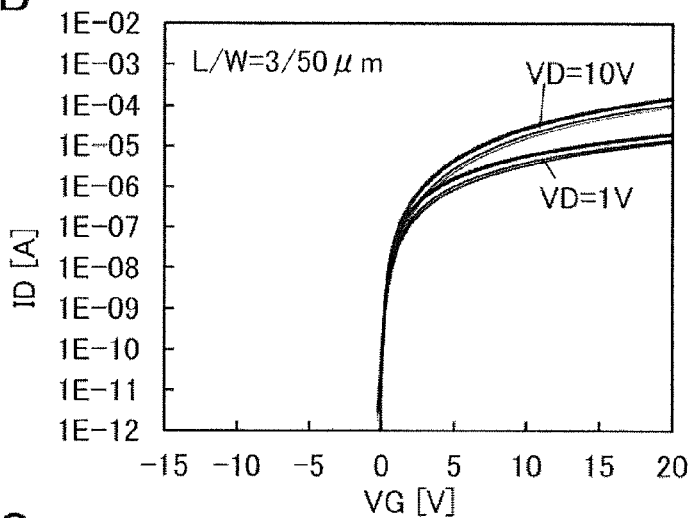
Figure 20C:
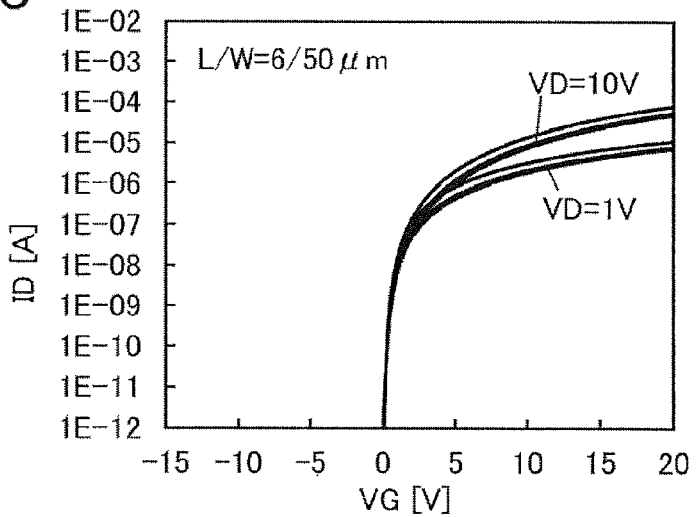
Figure 21A:
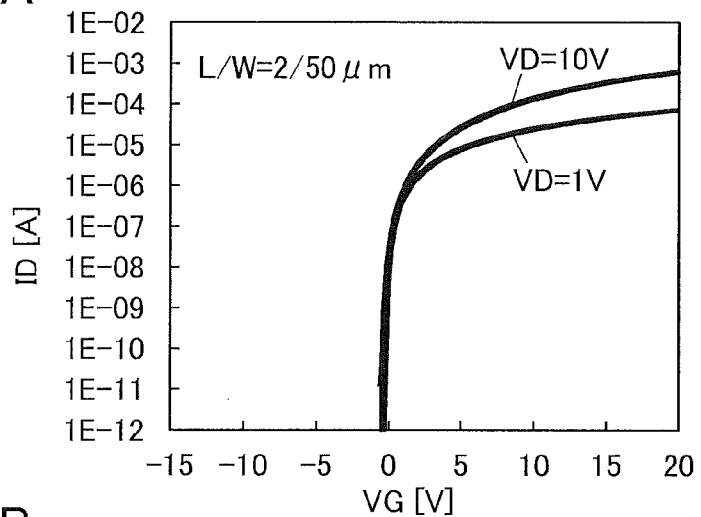
FIGS. 21A to 21C show ID-VG characteristics of a transistor according to Example.
Figure 21B:
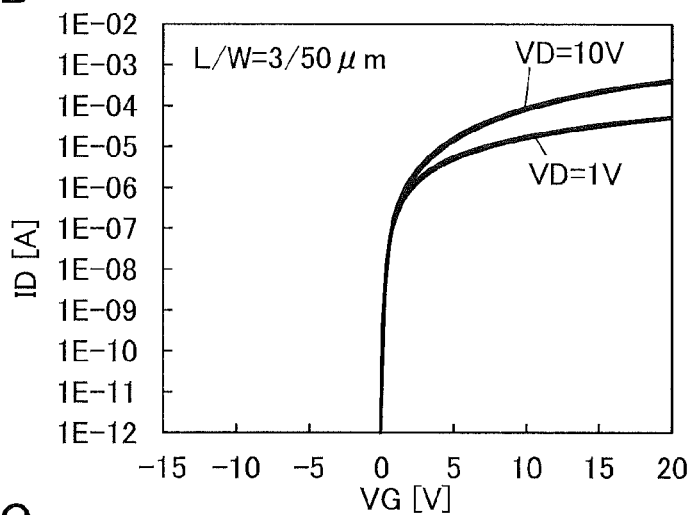
Figure 21C:
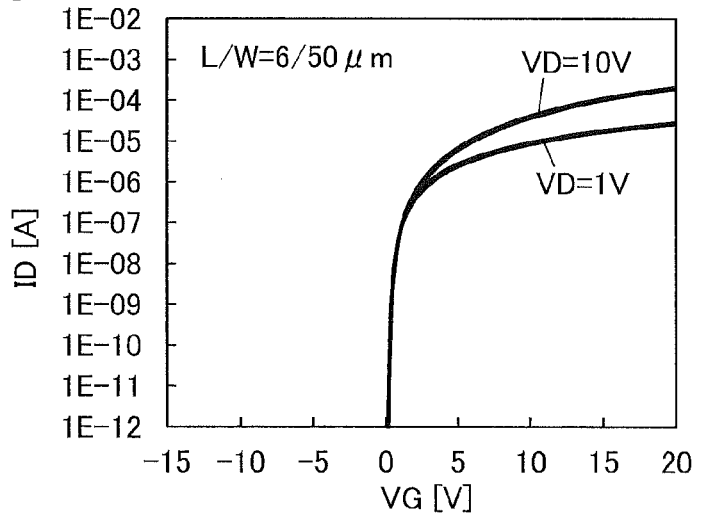

Next, ID-VG characteristics of the samples D1 to D3 were measured. FIGS. 19A to 19C to FIGS. 21A to 21C show the ID-VG characteristics of the samples D1 to D3. Note that FIGS. 19A to 19C, FIGS. 20A to 20C, and FIGS. 21A to 21C respectively show the ID-VG characteristics of the samples D1, D2, and D3. In FIGS. 19A to 19C to FIGS. 21A to 21C, the vertical axis indicates ID (A) and the horizontal axis indicates VG (V). FIGS. 19A, 20A, and 21A show ID-VG characteristics of transistors each of which has a channel length L of 2 μm and a channel width W of 50 μm. FIGS. 19B, 20B, and 21B show the ID-VG characteristics of transistors each of which has a channel length L of 3 μm and a channel width W of 50 μm. FIGS. 19C, 20C, and 21C show the ID-VG characteristics of transistors each of which has a channel length L of 6 μm and a channel width W of 50 μm.

A voltage (hereinafter also referred to as gate voltage (VG)) applied to the conductive film 104 that functions as the first gate electrode of the transistor 170 was changed from −15 V to +20 V in increments of 0.25 V. A voltage (VBG) applied to the conductive film 120b that functions as the second gate electrode of the transistor 100 was changed from −15 V to +20 V in increments of 0.25 V. A voltage (hereinafter also referred to as source voltage (VS)) applied to the conductive film 112a that functions as a source electrode of the transistor 170 is 0 V (common), and a voltage (hereinafter also referred to as drain voltage (VD)) applied to the conductive film 112b that functions as a drain electrode is 1 V or 10 V.

The results of FIGS. 19A to 19C to FIGS. 21A to 21C show that there is no big difference between ID-VG characteristics of the transistors even after the highest temperature in the process is lowered from 450° C. to 350° C. The variation in electrical characteristics of the sample D3 having a stacked-layer oxide semiconductor film was reduced than the sample D2. In addition, the sample D3 is increased in on-state current and S value (subthreshold swing value) is small. Thus, it was confirmed that the semiconductor device of one embodiment of the present invention had excellent electrical characteristics.

Next, reliability evaluation was performed on the fabricated samples D1 to D3 using a bias-temperature stress test (hereinafter, referred to as gate bias temperature (GBT) test).

The GBT tests in this example were performed under the conditions where the gate voltage (VG) was ±30 V; the drain voltage (VD) and the source voltage (VS) were 0 V (COMMON); the stress temperature was 60° C.; the time for stress application was 1 hour; and two kinds of measurement environments, a dark environment and a photo environment (irradiation with light having approximately 10000 1x with a white LED), were employed. In other words, the source electrode and the drain electrode of the transistor were set at the same potential, and a potential different from that of the source and drain electrodes was applied to the gate electrode for a certain time (one hour, here). A case where the potential applied to the gate electrode is higher than that of the source and drain electrodes is called positive stress, and a case where the potential applied to the gate electrode is lower than that of the source and drain electrodes is called negative stress. Thus, the reliability evaluation was performed under four conditions in total, i.e., positive GBT stress (Dark), negative GBT stress (Dark), positive GBT stress (Light irradiation), and negative GBT stress (Light irradiation).

Figure 22:
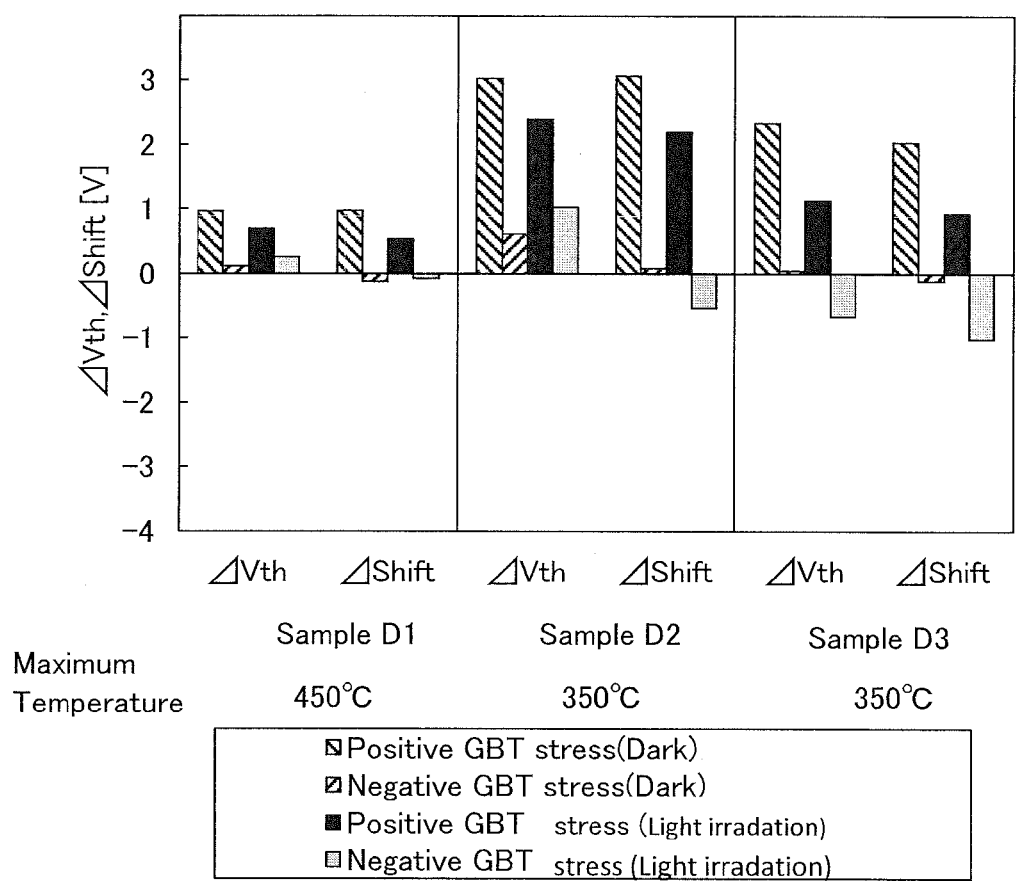
FIG. 22 shows results of gate BT stress tests on transistors according to Example.

FIG. 22 shows the GBT test results of the samples D1 to D3. The vertical axis in FIG. 22 indicates the amount of change in threshold voltage (ΔVth) of the transistor and the amount of change in shift value (ΔShift). The horizontal axis in FIG. 22 indicates the name of samples, process conditions, and the like. Note that the shift value means, in the drain current (ID)-gate voltage (VG) characteristics of the transistor, the gate voltage (VG) at a point of intersection of an axis of $1\times10^{-12}$ A and a tangent line of the logarithm of a drain current (ID) having the highest gradient. ΔShift means the amount of change in Shift value.

As shown in FIG. 22, the amount of change in threshold voltage (ΔVth) by the GBT test of the sample D2 was approximately three times that of the sample D1, whereas that of the sample D3 was approximately twice that of the sample D1. The stacked-layer oxide semiconductor film can suppress reduction in reliability regardless of decrease of the highest process temperature from 450° C. to 350° C.

Next, the amount of change in threshold voltage of the samples D1 to D3 when the positive gate BT stress tests (Dark +GBT) and the negative gate BT stress tests (Dark −GBT) were alternately performed. First, ID-VG characteristics of the transistors were measured (initial). Then, the positive gate BT stress test and the negative gate BT stress test were, and each test was performed twice in total. Each of the gate BT stress tests was performed at a stress temperature of 60° C. at a stress time of 3600 seconds. The transistor measured here had a channel length L of 6 μm and a channel width W of 50 μm.

Figure 23:
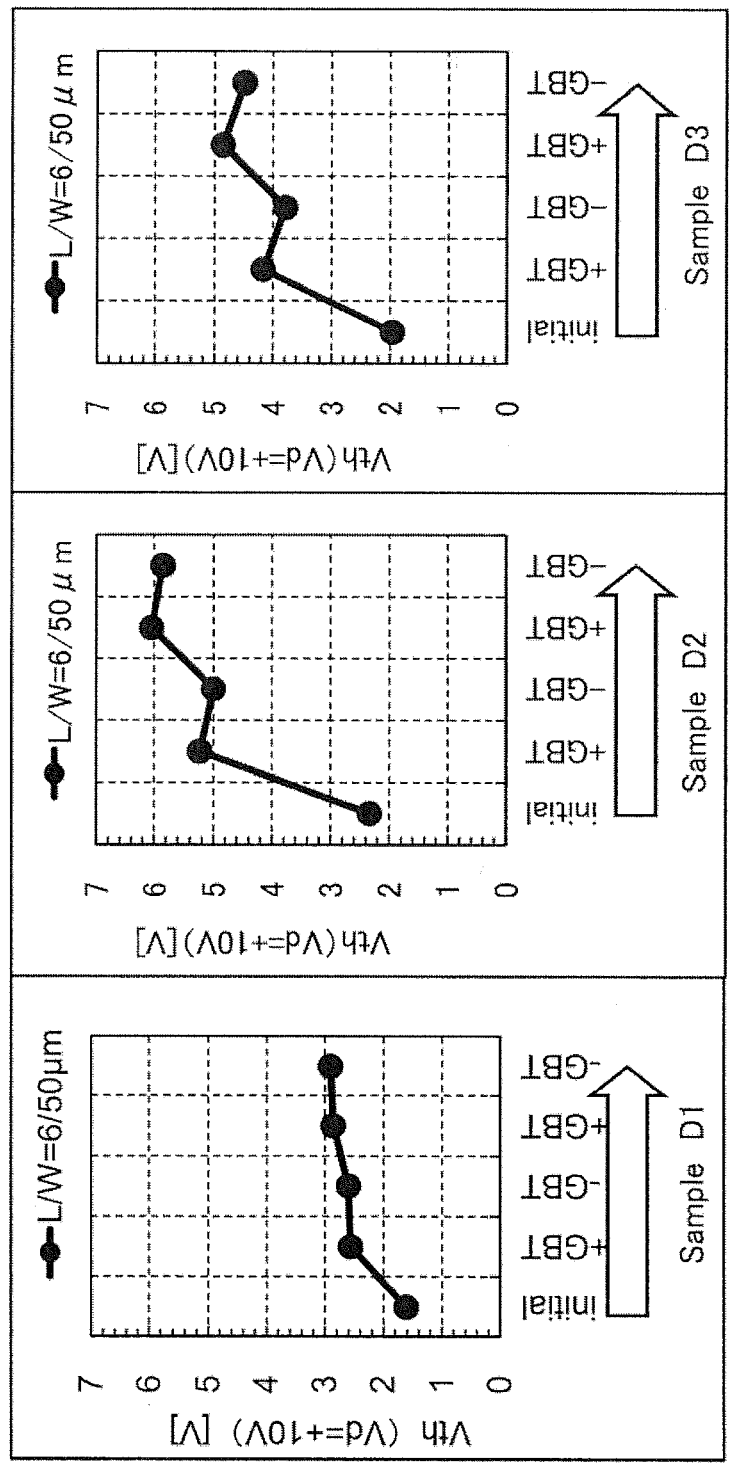
FIG. 23 shows results of gate BT stress tests on transistors according to Example.

FIG. 23 shows threshold voltages of the samples D1 to D3 before the stress test (initial) and the threshold voltages after each gate BT stress test. The vertical axis and the horizontal axis in FIG. 23 indicate a threshold voltage (Vth) when drain voltage is 10 V and name of stress test, respectively. FIG. 23 shows the results before the stress test (initial), after the positive gate BT stress test (+GBT), after the negative gate BT stress test (−GBT), after the positive gate BT stress test (+GBT), and after the negative gate BT stress test (−GBT).

In the case where the threshold voltage alternately increases and decreases when positive gate BT stress tests and negative gate BT stress tests are alternately performed, it is assumed that the threshold voltage changes because of trap and detrap of carriers by a trap level at the time of application of voltage to a gate electrode. In the case where the threshold voltage gradually increases or decreases, for example, it is assumed that the threshold voltage changes because carriers trapped by a trap level serve as fixed charges.

The results in FIG. 23 show that the amount of change in threshold voltage of the transistor of the sample D3 after each stress test is smaller than that of the sample D2.

From the above-described results, the transistor of the sample D3 having a stacked-layer oxide semiconductor film, which is one embodiment of the present invention, showed excellent electrical characteristics; that is, improvement in reliability and on-state current, reduction in variation of electrical characteristics, and a small S value were all achieved even when the process temperature is lowered.

The structure described above in this example can be combined with any of the structures described in the other embodiments and examples as appropriate.

Example 4

In this example, transistors corresponding to the transistor 170 illustrated in FIGS. 3A to 3C were fabricated and their ID-VG characteristics were evaluated. Samples E1 and E2 described below were fabricated for the evaluation in this example. Note that the sample E1 includes a transistor which is a comparative example, whereas the sample E2 includes a transistor which is one embodiment of the present invention. The samples E1 and E2 each include the transistor having a channel length L of 2 μm and a channel width W of 50 μm, the transistor having a channel length L of 3 μm and a channel width W of 50 μm, and the transistor having a channel length L of 6 μm and a channel width W of 50 μm. The three different kinds of transistors were fabricated in three different substrates. The transistors were fabricated 40 for each kind.

The samples formed in this example are described below. Note that the reference numerals used for the transistor 170 in FIGS. 3A to 3C are used in the following description.

<Manufacturing Method of Sample E1>

First, the conductive film 104 was formed over the substrate 102. As the substrate 102, a glass substrate was used. Note that the size and the thickness of the glass substrate were 600 mm×720 mm and 0.7 mm, respectively.

As the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

The insulating film 106 was deposited as follows. First, a 50-nm-thick silicon nitride film was deposited under the conditions where the substrate temperature was 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes placed in a PECVD apparatus. Then, the flow rate of an ammonia gas was changed to 2000 sccm to deposit a 300-nm-thick silicon nitride film. Finally, the flow rate of an ammonia gas was changed to 100 sccm to deposit a 50-nm-thick silicon nitride film.

The insulating film 107 was deposited under the conditions where the substrate temperature was 350° C., a silane gas at a flow rate of 20 sccm and a dinitrogen monoxide gas at a flow rate of 3000 sccm were introduced into a chamber, the pressure was 40 Pa, and an RF power of 100 W was supplied between parallel-plate electrodes provided in a PECVD apparatus.

Then, the oxide semiconductor film 108 was formed over the insulating film 107. As the oxide semiconductor film 108, a stacked layer in which the first oxide semiconductor film 108a on the conductive film 104 side and the second oxide semiconductor film 108b over the first oxide semiconductor film 108a was formed. The conductive film 104 serves as a gate electrode. A 10-nm-thick IGZO film and a 15-nm-thick IGZO film were formed as the first oxide semiconductor film 108a and the second oxide semiconductor film 108b, respectively.

Note that the first oxide semiconductor film 108a was deposited under the conditions where the substrate temperature was 170° C., an argon gas at a flow rate of 140 sccm and an oxygen gas at a flow rate of 60 sccm were introduced into a chamber, the pressure was 0.6 Pa, and an AC power of 2500 W was applied to a polycrystalline metal oxide sputtering target (having an atomic ratio of In:Ga:Zn=☐☐:2:4.1).

Note that the second oxide semiconductor film 108b was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target (having an atomic ratio of In:Ga:Zn=1:1:1.2).

Then, first heat treatment was performed. As the first heat treatment, heat treatment was performed at 450° C. for 1 hour in a nitrogen atmosphere and then heat treatment was performed at 450° C. for 1 hour in a mixed atmosphere of nitrogen and oxygen.

Next, the conductive films 112a and 112b were formed over the insulating film 107 and the oxide semiconductor film 108. As the conductive films 112a and 112b, a 50-nm-thick tungsten film, a 400-nm-thick aluminum film, and a 100-nm-thick titanium film were successively formed in vacuum with a sputtering apparatus.

After that, the insulating film 114 and the insulating film 116 were formed over the insulating film 107, the oxide semiconductor film 108, and the conductive films 112a and 112b. As the insulating film 114, a 50-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in vacuum with a PECVD apparatus.

The insulating film 114 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed. The second heat treatment was performed at 350° C. in a nitrogen gas atmosphere for 1 hour.

Next, the following three processes were performed.

(1. ITSO Film Formation Process)

A 5-nm-thick ITSO film was formed over the insulating film 116 using a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3:SnO_2:SiO_2$=85:10:5 [wt. %]) provided in the sputtering apparatus.

(2. Oxygen Addition Process)

Next, oxygen addition treatment was performed on the oxide semiconductor film 108 and the insulating films 114 and 116 through the ITSO film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 sec. between parallel-plate electrodes provided in the ashing apparatus so that a bias would be applied to the substrate side.

(3. ITSO Film Removing Process)

Next, the ITSO film was removed to expose the insulating film 116. The ITSO film was removed using a wet-etching apparatus in such a manner that etching was performed using an oxalic acid solution at a concentration of 5% for 300 sec and then etching was performed using hydrofluoric acid at a concentration of 0.5% for 15 sec.

Next, the insulating film 118 was formed over the insulating film 116. As the insulating film 118, a 100-nm-thick silicon nitride film was formed with a PECVD apparatus. Note that the substrate temperature in the PECVD apparatus in deposition of the insulating film 118 was 350° C.

Next, the opening 142c reaching the conductive film 112b and the openings 142a and 142b reaching the conductive film 104 were formed. The openings 142a, 142b, and 142c were formed with a dry etching apparatus.

Next, a conductive film was formed over the insulating film 118 to cover the openings 142a, 142b, and 142c and processed to form the conductive films 120a and 120b. For the conductive films 120a and 120b, a 100-nm-thick ITSO film was formed with a sputtering apparatus. The composition of a target used for forming the ITSO film was the same as that used in the step of forming the ITSO film described above.

Then, third heat treatment was performed. The third heat treatment was performed at 250° C. under a nitrogen atmosphere for 1 hour.

Through the above process, the sample E1 of this example was manufactured. Note that the highest temperature through the fabrication of the sample E1 was 450° C.

<Manufacturing method of sample E2>

A manufacturing method of the sample E2 is different from that of the sample E1 described above in the following step. The other steps were the same as the steps for the sample E1.

The first treatment was not performed on the sample E2.

Through the above process, the sample E2 of this example was manufactured. Note that the highest temperature in the process of manufacturing the sample E2 was 350° C.

Figure 24A:
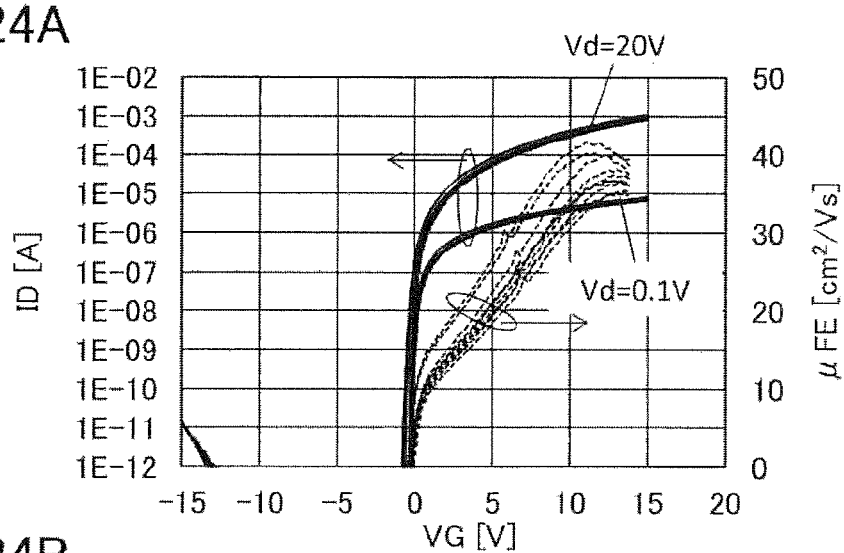
FIGS. 24A to 24C show ID-VG characteristics of a transistor according to Example.
Figure 24B:
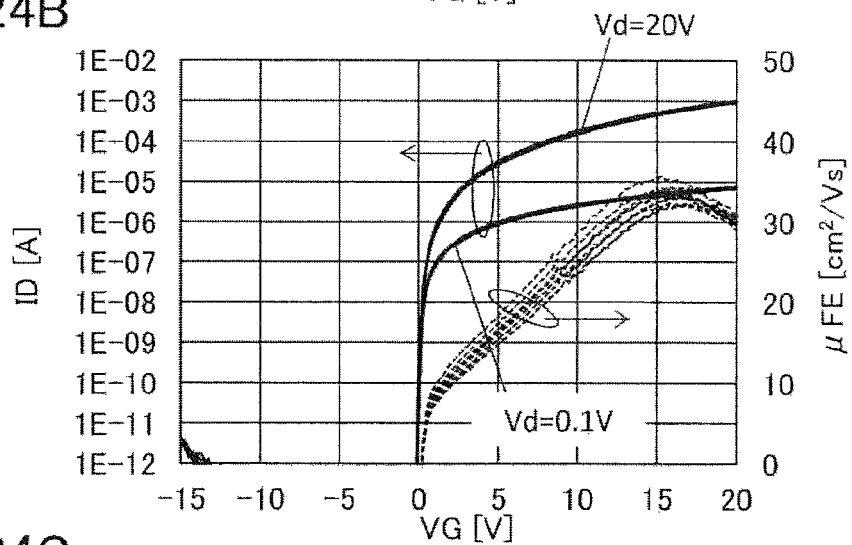
Figure 24C:
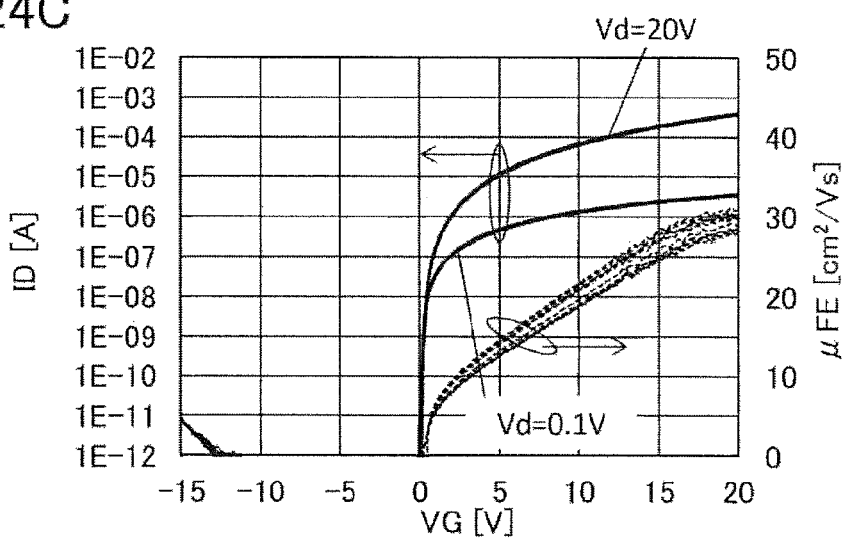
Figure 25A:
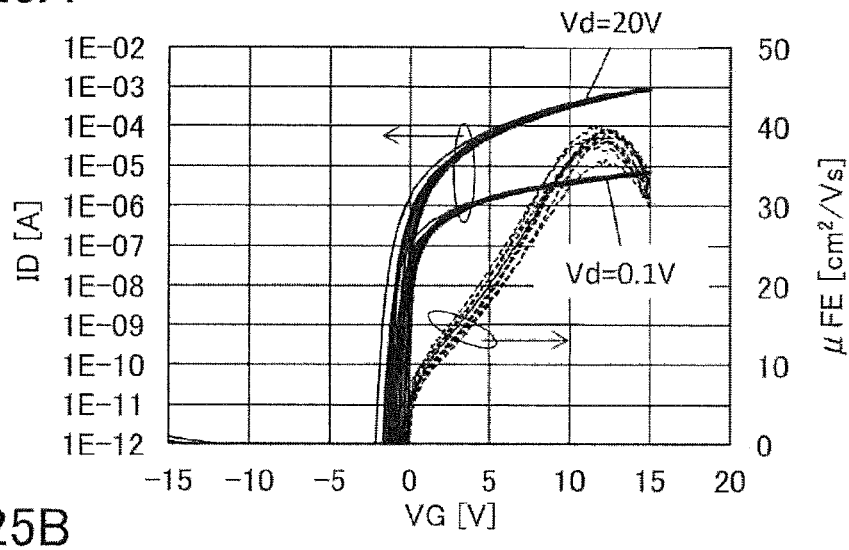
FIGS. 25A to 25C show ID-VG characteristics of a transistor according to Example.
Figure 25B:
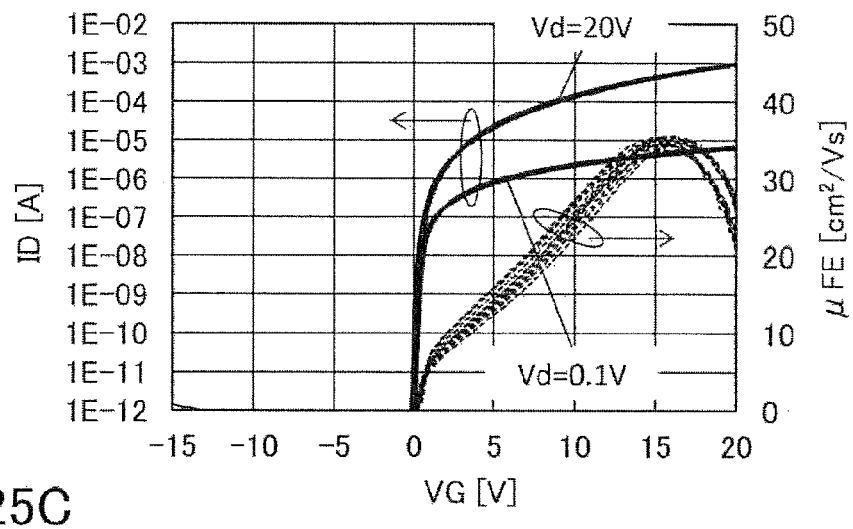
Figure 25C:
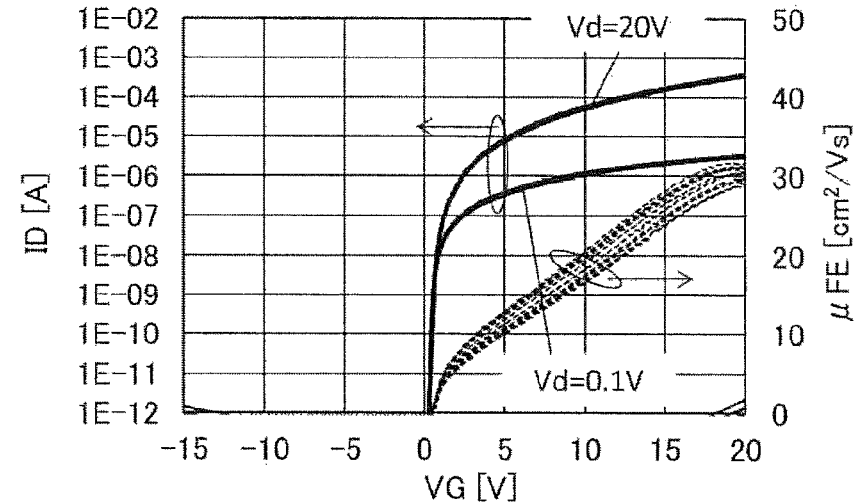

Next, ID-VG characteristics of the samples E1 and E2 were measured. FIGS. 24A to 24C and FIGS. 25A to 25C show the ID-VG characteristics of the samples E1 and E2. Note that FIGS. 24A to 24C and FIGS. 25A to 25C respectively show the ID-VG characteristics of the samples E1 and E2. In FIGS. 24A to 24C and FIGS. 25A to 25C, the first vertical axis indicates ID (A), the second vertical axis indicates $\mu FE$ ($cm^2/Vs$), and the horizontal axis indicates VG (V). FIGS. 24A and 25A show ID-VG characteristics of transistors each of which has a channel length L of 2 μm and a channel width W of 50 μm. FIGS. 24B and 25B show the ID-VG characteristics of transistors each of which has a channel length L of 3 μm and a channel width W of 50 μm. FIGS. 24C and 25C show the ID-VG characteristics of transistors each of which has a channel length L of 6 μm and a channel width W of 50 μm. FIGS. 24A to 24C and FIGS. 25A to 25C show overlaps of the characteristics of the ten transistors.

A voltage applied to the conductive film 104 that functions as the first gate electrode of the transistor 170 (the voltage is also referred to as gate voltage (VG)) was changed from −15 V to +20 V in increments of 0.25 V. A voltage applied to the conductive film 120b that functions as the second gate electrode of the transistor 100 (the voltage is also referred to as VBG) was changed from −15 V to +20 V in increments of 0.25 V. Note that only for the transistor having a channel length L of 2 um and a channel width W of 50 μm, VG and VBG were changed from −15 V to +☐☐ V. A voltage applied to the conductive film 112a that functions as a source electrode (the voltage is also referred to as source voltage (VS)) was 0 V (common), and a voltage applied to the conductive film 112b that functions as a drain electrode (the voltage is also referred to as drain voltage (VD)) was 0.1 V or 20 V. Note that the results of field effect mobility ($\mu FE$) when VD=20 V are shown.

The results of FIGS. 24A to 24C and FIGS. 25A to 25C show that there is no big difference between ID-VG characteristics of the transistors even after the highest temperature in the process is lowered from 450° C. to 350° C.

Next, variation in the substrate surface (600 mm×720 mm) of the transistors of the samples E1 and E2 (channel length L=3 μm, channel width W=50 μm) was evaluated.

Figure 26A:
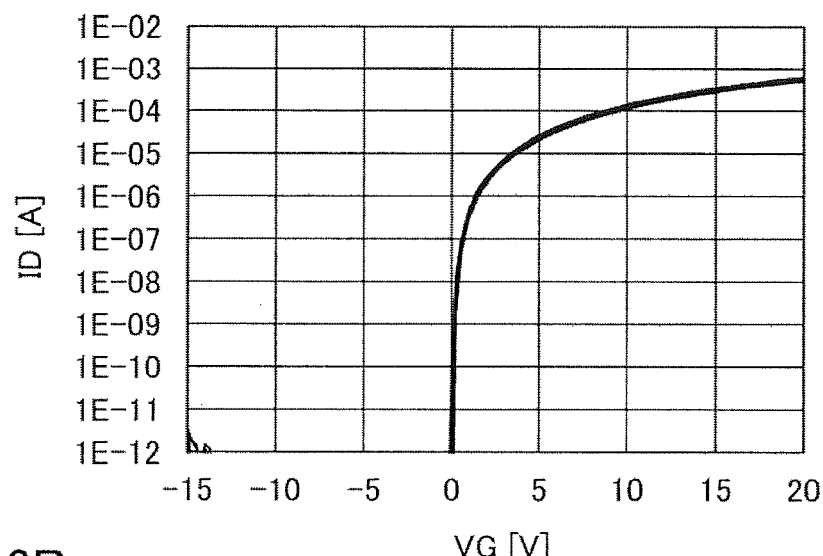
FIGS. 26A and 26B show ID-VG characteristics of a transistor according to Example.
Figure 26B:
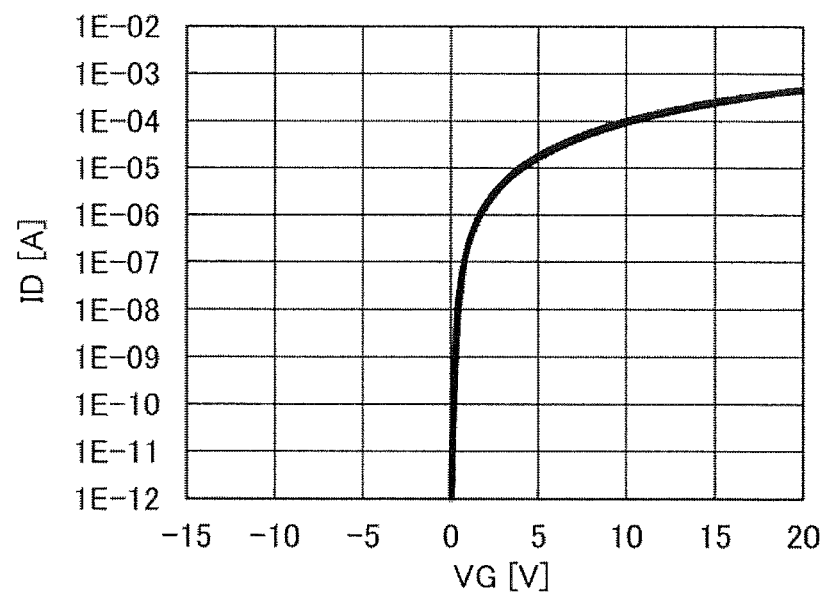

First, ID-VG characteristics of the transistors of the samples E1 and E2 each having a channel width L of 3 μm and a channel width W of 50 μm were evaluated. FIGS. 26A and 26B show the ID-VG characteristics of the samples E1 and E2. Note that FIGS. 26A and 26B respectively show the ID-VG characteristics of the samples E1 and E2. In FIGS. 26A and 26B, the vertical axis indicates ID (A) and the horizontal axis indicates VG (V). FIGS. 26A and 26B each show overlap of the characteristics of 40 transistors in total. Note that measurement conditions of the ID-VG characteristics in FIGS. 26A and 26B are different from those in FIGS. 24A to 24C and FIGS. 25A to 25C. Specifically, each voltage applied to the conductive films 104 and 120b was changed from −15 V to +20 V in increments of 0.25 V. The source voltage (VS) and the drain voltage (VD) were set to 0 V (common) and 10 V, respectively.

Figure 27A:
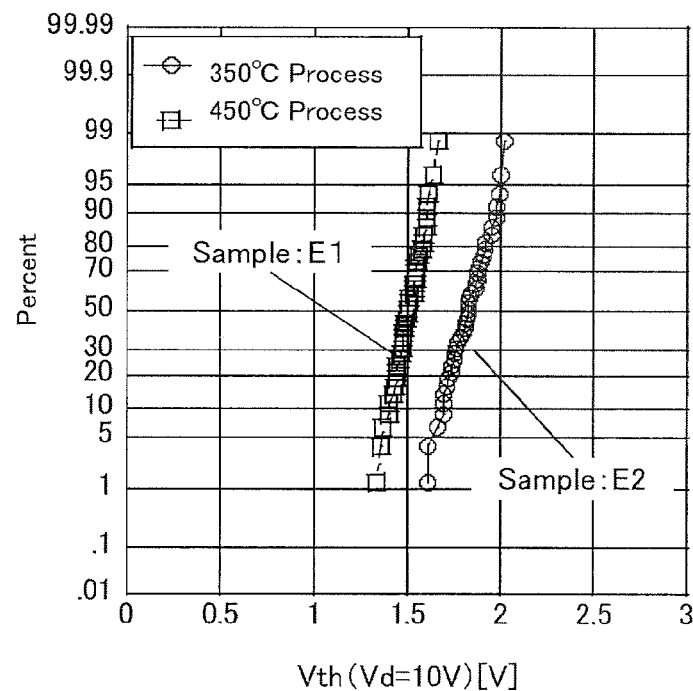
FIGS. 27A and 27B show probability distributions of Vth and Ion of transistors according to Example
Figure 27B:
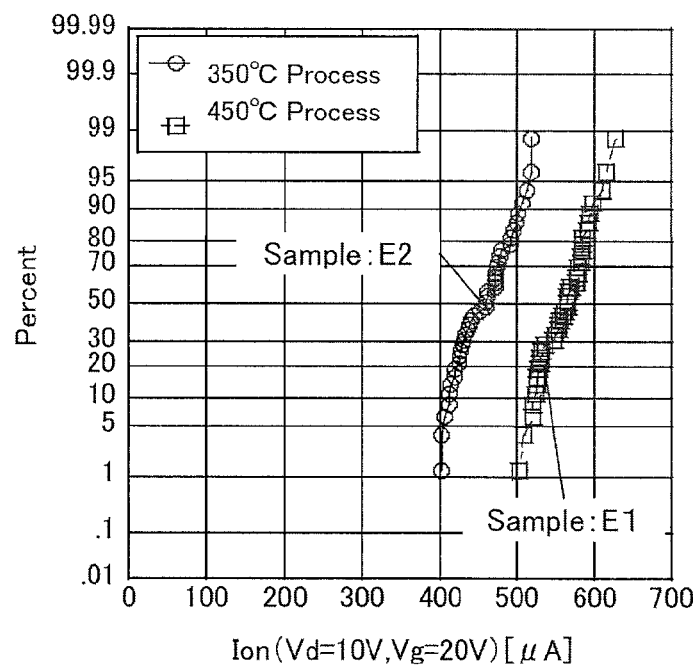

FIGS. 27A and 27B shows comparison results of variation in threshold voltage (Vth) and on-state current (Ion) of the transistors of the samples E1 and E2, which are shown in FIGS. 26A and 26B. FIG. 27A and FIG. 27B show probability distributions of the Vth and the Ion in the substrate surface (600 mm×720 mm), respectively. Note that the Ion in FIG. 27B are values when VG is 20 V.

The results in FIGS. 26A and 26B and FIGS. 27A and 27B showed that the sample E2 was slightly decreased in Ion but had more favorable transistor characteristics with less variation in the substrate surface than the sample E1.

Next, reliability tests were performed on the manufactured samples E1 and E2. As the reliability evaluation, GBT tests were used.

The GBT tests in this example were performed under the conditions where the gate voltage (VG) was ±30 V; the drain voltage (VD) and the source voltage (VS) were 0 V (COMMON); the stress temperature was 60° C.; the time for stress application was 1 hour; and two kinds of measurement environments, a dark environment and a photo environment (irradiation with light having approximately 10000 lx with a white LED), were employed. In other words, the source electrode and the drain electrode of the transistor were set at the same potential, and a potential different from that of the source and drain electrodes was applied to the gate electrode for a certain time (one hour, here). A case where the potential applied to the gate electrode is higher than that of the source and drain electrodes is called positive stress, and a case where the potential applied to the gate electrode is lower than that of the source and drain electrodes is called negative stress. Thus, the reliability evaluation was performed under four conditions in total, i.e., positive GBT stress (Dark), negative GBT stress (Dark), positive GBT stress (Light irradiation), and negative GBT stress (Light irradiation). Note that positive GBT stress (Dark) can be referred to as PBTS (Positive Bias Temperature Stress), negative GBT stress (Dark) as NBTS (Negative Bias Temperature Stress), positive GBT stress (Light irradiation) as PBITS (Positive Bias Illuminations Temperature Stress), negative GBT stress (Light irradiation) as NBITS (Negative Bias Illuminations Temperature Stress).

Figure 28:
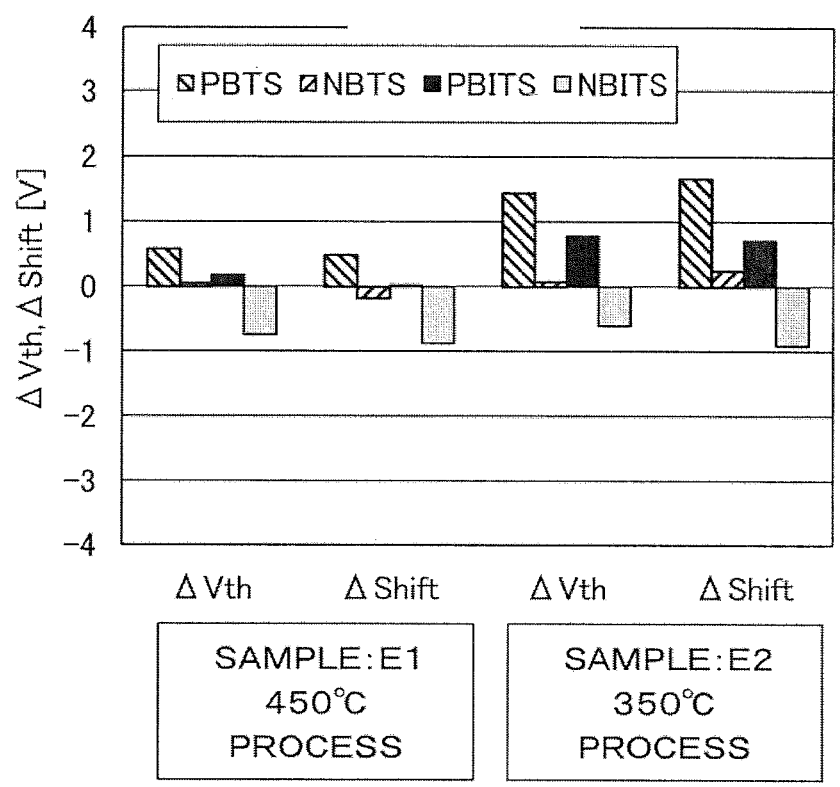
FIG. 28 shows results of gate BT stress tests performed on a transistor of Example.

FIG. 28 shows the GBT test results of the samples E1 and E2. The vertical axis in FIG. 28 indicates the amount of change in threshold voltage (ΔVth) of the transistor and the amount of change in shift value (ΔShift).

As is found from the results shown in FIG. 28, although the amount of change in threshold voltage of the sample E2 is slightly larger than that of the sample E1, the GBT negative change and positive change are 1 V or less and 2 V or less, respectively.

Next, the amount of change in threshold voltage of the samples E1 and E2 when the PBTS and the NBTS were alternately performed. First, ID-VG characteristics of the transistors were measured (initial). Then, the PBTS and the NBTS were, and each test was performed twice in total. Each of the gate BT stress tests was performed at a stress temperature of 60° C. at a stress time of 3600 seconds. The transistor measured here had a channel length L of 6 μm and a channel width W of 50 μm.

Figure 29A:
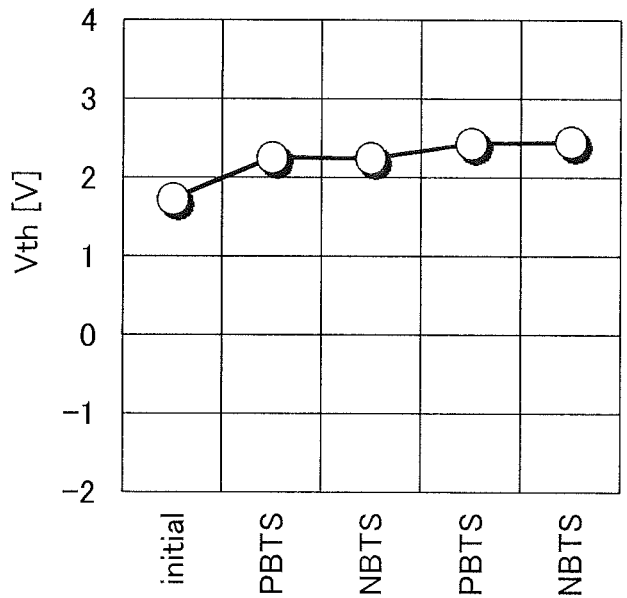
FIGS. 29A and 29B show results of gate BT stress tests performed on transistors of Example.
Figure 29B:
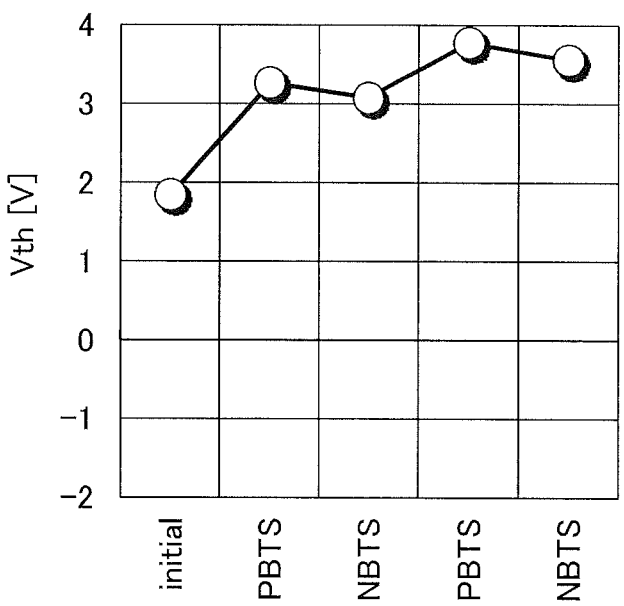

FIG. 29A shows threshold voltages of the sample E1 before the stress test (initial) and the threshold voltages after each gate GBT stress test. FIG. 29B shows threshold voltages of the sample E2 before the stress test (initial) and the threshold voltages after each gate GBT stress test. The vertical axis and the horizontal axis in FIGS. 29A and 29B indicate a threshold voltage (Vth) when drain voltage is 10 V and name of stress test, respectively. FIGS. 29A and 29B show the results before the stress test (initial), after the PBTS, after the NBTS, after the PBTS, and after the NBTS.

The results of FIGS. 29A and 29B showed that the amount of change in threshold voltage of the transistor of the sample E2 was larger than that of the sample E1 but was within ±4 V.

From the above-described results, the transistor of the sample E2 having a stacked-layer oxide semiconductor film, which is one embodiment of the present invention, showed excellent electrical characteristics; that is, improvement in reliability and on-state current, reduction in variation of electrical characteristics, and a small S value were all achieved even when the process temperature is lowered.

The structure described above in this example can be combined with any of the structures described in the other embodiments and examples as appropriate.

Example 5

In this example, transistors corresponding to the transistor 100 shown in FIGS. 1A to 1C and the transistor 170 shown in FIGS. 3A to 3C were fabricated and then a display device including the transistors was fabricated.

First, specifications of the display device fabricated in this example are shown in Table 1.

TABLE 1

| | | |
|---|---|---|
| Panel specification | Panel size | 4.29 inch (portrait) |
| | Valid pixels | 1080 × RGB(H) × 1920 (V): Full-HD |
| | Pixel size | 15.0 μm (H) × 49.5 μm (V) |
| | Panel outside dimension | 54.86 mm (H) × 137.665 mm (V) |
| | Display region | 53.46 mm (H) × 95.04 mm (V) |
| | Bezel width (3 sides) | 0.7 mm |
| | Resolution | 513 ppi |
| | LCD | Transmissive FFS mode |
| | Coloring method | CF method |
| | Aperture ratio | 52.1% |
| | Driving frequency | 60 Hz |
| | Video signal format | Analog line sequential |
| | Gate Driver | Built-in |
| | Source Driver | TAB-IC |
| Source Driver | Video signal voltage | 1.5 V/13.5 V |
| | Data writing period | 6.35 μsec |
| | Inversion driving | Source line inversion or Dot inversion |
| Gate Driver | Clock frequency (GCLK) | 7.26 kHz |
| | Signal voltage | −2.5 V/24.5 V |
| Others | VCOM | 7.5 V |
| | Backgate (GD) | not provided |

Figure 30A:
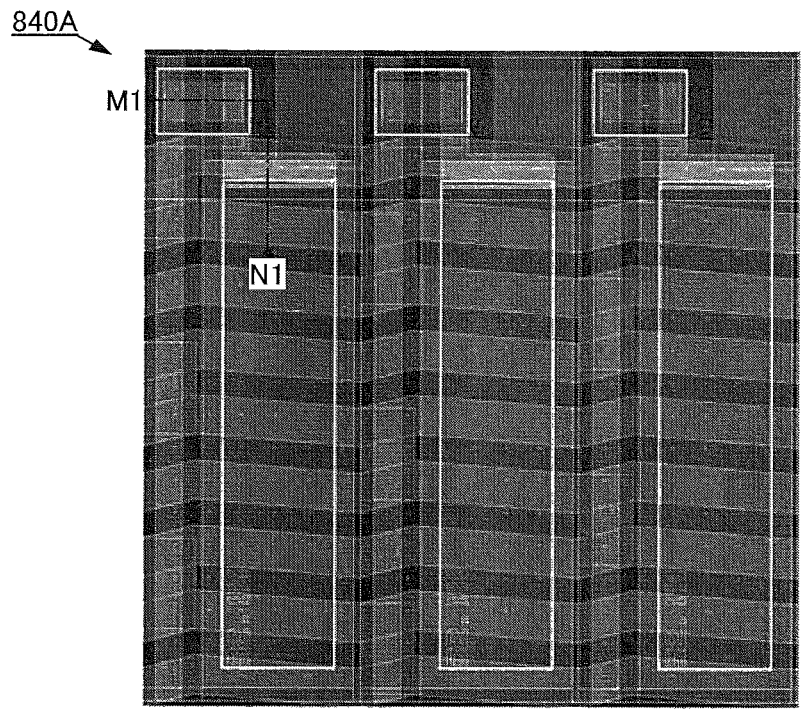
FIGS. 30A and 30B are top views of pixel portions of display devices according to Example.
Figure 30B:
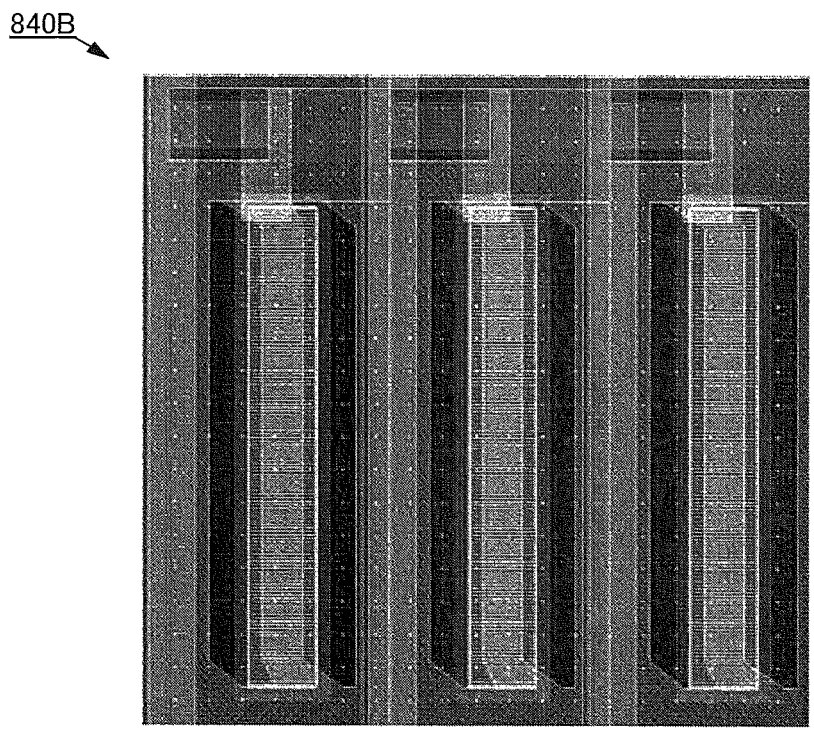

FIGS. 30A and 30B are top views of pixel portions of the display devices fabricated in this example. FIGS. 30A and 30B are top views of pixel portions 840A and 840B in which minimum feature sizes are 2 μm and 3.5 μm, respectively.

Note that FIGS. 30A and 30B each show three pixels.

Figure 31A:
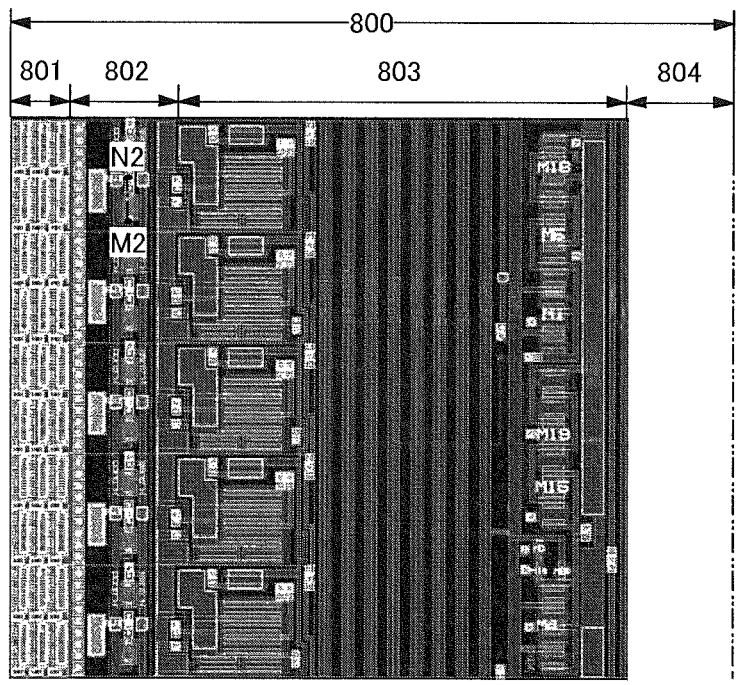
FIGS. 31A and 31B are top views of bezel regions of display devices according to Example.
Figure 31B:
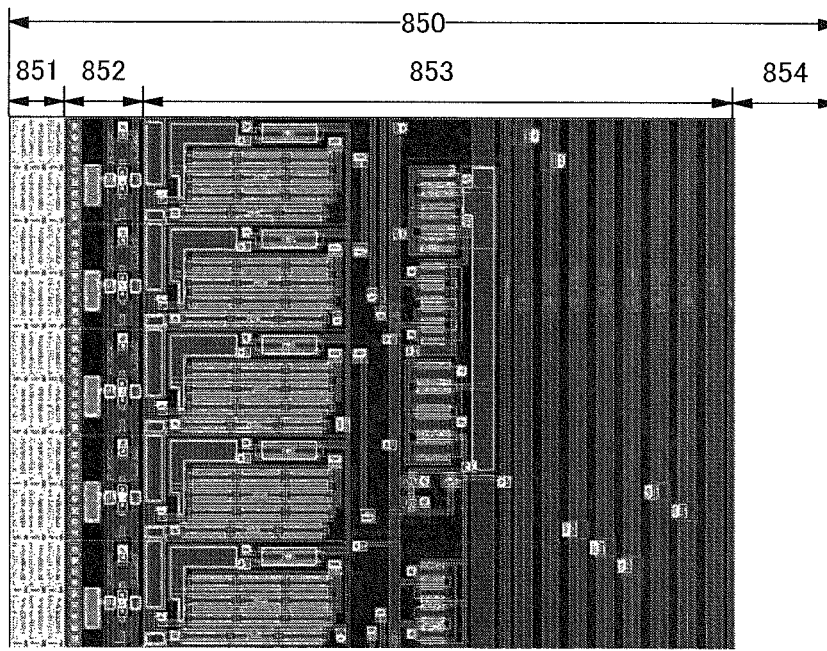

FIGS. 31A and 31B are top views of gate driver portions of the display device fabricated in this example. FIGS. 31A and 31B are top views in which minimum feature sizes are 2 μm and 3.5 μm, respectively. Regions 800, 801, 802, 803, and 804 in FIG. 31A correspond to a bezel width, a dummy pixel portion, a protective circuit portion, a gate driver circuit portion, and a margin region for a division, respectively. Regions 850, 851, 852, 853, and 854 in FIG. 31B correspond to a bezel width, a dummy pixel portion, a protective circuit portion, a gate driver circuit portion, and a margin region for a division, respectively.

In this example, the regions 800, 801, 802, 803, and 804 in FIG. 31A were 0.7 mm, 0.05 mm, 0.08 mm, 0.41 mm, and 0.16 mm, respectively. The regions 850, 851, 852, 853, and 854 in FIG. 31B were 0.8 mm, 0.05 mm, 0.07 mm, 0.55 mm, and 0.13 mm, respectively.

Although the protective circuit portions (the regions 802 and 852) are provided in FIGS. 31A and 31B, they are not necessarily provided. A configuration without a protective circuit portion can have smaller bezel width. For example, the regions 800 and 850 in FIGS. 31A and 31B can be reduced to 0.6 mm and 0.7 mm, respectively.

As described above, the transistor in one embodiment of the present invention has high field effect mobility and reliability and incorporates a gate driver circuit, and in addition, the bezel width (the regions 800 and 850 here) can be reduced to 1 mm or less, preferably 0.8 mm or less, more preferably 0.6 mm or less. Accordingly, a display device with a narrow bezel can be manufactured.

FIGS. 32A and 32B are cross-sectional views corresponding to cross sections taken along dashed-dotted lines M1-N1 in FIG. 30A and M2-N2 in FIG. 31A, respectively.

A pixel portion 840A in FIG. 32A includes a conductive film 904a over a substrate 902, an insulating film 906 over the substrate 902 and the conductive film 904, an insulating film 907 over the insulating film 906, an oxide semiconductor film 908 over the insulating film 907, an oxide semiconductor film 909 over the insulating film 907, a conductive film 912a electrically connected to the oxide semiconductor film 908 and functioning as a source electrode, a conductive film 912b electrically connected to the oxide semiconductor film 908 and functioning as a drain electrode, an insulating film 914 over the insulating film 907 and the oxide semiconductor films 908 and 909, an insulating film 916 over the insulating film 914, an insulating film 918 over the insulating film 916 and the oxide semiconductor film 909, a conductive film 920a over the insulating film 918 and functioning as a pixel electrode, and an insulating film 924 over the insulating film 918 and the conductive film 920a.

Note that the oxide semiconductor film 908 includes a first oxide semiconductor film 908a and a second oxide semiconductor film 908b. The oxide semiconductor film 909 includes a first oxide semiconductor film 909a and a second oxide semiconductor film 909b.

The insulating film 918 covers an opening in the insulating films 914 and 916 and is in contact with the oxide semiconductor film 909. The conductive film 920 functioning as a pixel electrode covers an opening in the insulating films 914, 916, and 918 and is electrically connected to the conductive film 912b functioning as a drain electrode.

Note that a liquid crystal element, elements on the counter substrate side, and the like are not illustrated in FIGS. 32A and 32B.

The region 802 shown in FIG. 32B which functions as a protective circuit portion includes a conductive film 904b over the substrate 902, a conductive film 904c over the substrate 902, the insulating film 906 over the conductive films 904b and 904c, the insulating film 907 over the insulating film 906, an oxide semiconductor film 910 over the insulating film 907, a conductive film 912c electrically connected to the oxide semiconductor film 910, a conductive film 912d electrically connected to the oxide semiconductor film 910, a conductive film 912e over the insulating film 907, the insulating film 914 over the insulating film 907, the oxide semiconductor film 910, and the conductive films 912c, 912d, and 912e, the insulating film 916 over the insulating film 914, the insulating film 918 over the insulating films 907 and 916, a conductive film 920b over the insulating film 918 and overlapping with the oxide semiconductor film 910, a conductive film 920c over the insulating film 918 and the conductive film 912e, and the insulating film 924 over the insulating film 918 and the conductive films 920b and 920c.

Note that the conductive films 904a, 904b, and 904c were formed by processing the same conductive film. The oxide semiconductor films 908, 909, and 910 were formed by processing the same oxide semiconductor film. The conductive films 912a, 912b, 912c, 912d, and 912e were formed by processing the same conductive film. The conductive films 920a, 920b, and 920c were formed by processing the same conductive film.

A transistor in the region 803 functioning as a gate driver circuit portion in FIG. 31A can be similar to the transistor 170 shown in FIGS. 3A to 3C.

A glass substrate was used as the substrate 902. As the conductive films 904a, 904b, and 904c, a 200-nm-thick tungsten film was formed with a sputtering apparatus. As the insulating film 906, a 400-nm-thick silicon nitride film was formed with a PECVD apparatus. As the insulating film 907, a 50-nm-thick silicon oxynitride film was formed with a PECVD apparatus.

As the first oxide semiconductor films 908a, 909a, and 910a, a 10-nm-thick IGZO film (In:Ga:Zn=3:1:2 [atomic proportion]) was formed with a sputtering apparatus. As the second oxide semiconductor films 908b, 909b, and 910b, a 15-nm-thick IGZO film (In:Ga:Zn=1:1:1.2 [atomic proportion]) was fixated with a sputtering apparatus.

As the conductive films 912a, 912b, 912c, 912d, and 912e, a stacked film including a 50-nm-thick tungsten film, a 400-nm-thick aluminum film, and a 100-nm-thick titanium film were formed with a sputtering apparatus.

As the insulating film 914, a 50-nm-thick silicon oxynitride film was formed with a PECVD apparatus. As the insulating film 916, a 400-nm-thick silicon oxynitride film was formed with a PECVD apparatus. As the insulating film 918, a 100-nm-thick silicon nitride film was formed with a PECVD apparatus.

As the conductive films 920a, 920b, and 920c, a 100-nm-thick ITSO film was formed with a sputtering apparatus.

Figure 33:
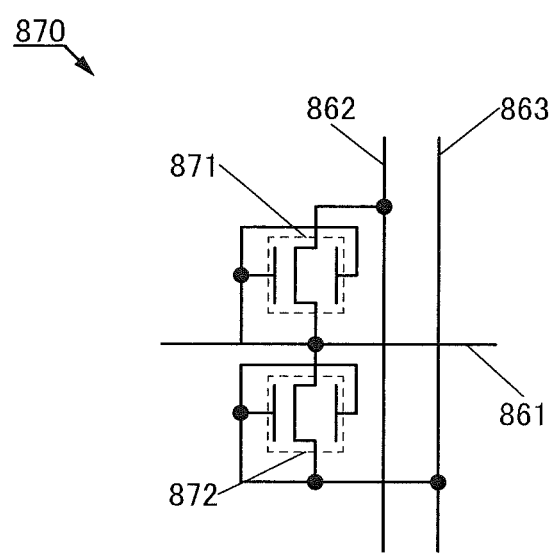
FIG. 33 is a circuit diagram of a protection circuit according to Example.

The region 802 in FIG. 32B functioning as a protective circuit portion includes a diode-connected transistor. FIG. 33 shows an example of a circuit diagram of a protective circuit which can be provided in the region 802 shown in FIG. 32B and functioning as a protective circuit portion.

A protective circuit 870 shown in FIG. 33 includes a first wiring 861 functioning as a gate line, a second wiring 862 functioning as a low-potential power line, a third wiring 863 functioning as a high-potential power line, and transistors 871 and 872. Note that the transistors 871 and 872 are each a dual-gate transistor having two gate electrodes. The same potential is applied to the two gate electrodes.

A gate of the transistor 871 is electrically connected to the first wiring 861 and one of a source and a drain of the transistor 871. The one of the source and the drain of the transistor 871 is electrically connected to one of a source and a drain of the transistor 872. The other of the source and the drain of the transistor 871 is electrically connected to the second wiring 862. The other of the source and the drain of the transistor 872 is electrically connected to a gate of the transistor 872 and the third wiring 863.

The protective circuit 870 shown in FIG. 33 is provided between the regions 801 and 803, that is, in the region 802 as in this example, and reliability of the display device can be improved. Note that this structure is a non-limiting example, and the protective circuit 870 is not necessarily provided. The display device of one embodiment of the present invention without the protective circuit 870 can have a further reduced bezel width.

The structure described above in this example can be combined with any of the structures described in the other embodiments and examples as appropriate.

EXPLANATION OF REFERENCE

100: transistor, 102: substrate, 104: conductive film, 106: insulating film, 107: insulating film, 108: oxide semiconductor film, 108a: oxide semiconductor film, 108b: oxide semiconductor film, 112: conductive film, 112a: conductive film, 112b: conductive film, 114: insulating film, 116: insulating film, 118: insulating film, 120: conductive film, 120a: conductive film, 120b: conductive film, 131: oxide conductive film, 138: etching gas, 139: oxygen, 140a: mask, 140b: mask, 142: etchant, 142a: opening, 142b: opening, 142c: opening, 170: transistor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light blocking film, 750: transistor, 752: transistor, 760: connection electrode, 764: insulating film, 766: insulating film, 767: oxide semiconductor film, 768: insulating film, 770: planarization insulating film, 772: conductive film, 774: conductive film, 775: liquid crystal element, 776: liquid crystal layer, 778: structure, 780: anisotropic conductive film, 782: light-emitting element, 784: conductive film, 786: EL layer, 788: conductive film, 790: capacitor, 800: region, 801: region, 802: region, 803: region, 804: region, 840A: pixel portion, 840B: pixel portion, 850: region, 851: region, 852: region, 853: region, 854: region, 861: wiring, 862: wiring, 863: wiring, 870: protection circuit, 871: transistor, 872: transistor, 902: substrate, 904: conductive film, 904a: conductive film, 904b: conductive film, 904c: conductive film, 906: insulating film, 907: insulating film, 908: oxide semiconductor film, 908a: oxide semiconductor film, 908b: oxide semiconductor film, 909: oxide semiconductor film, 909a: oxide semiconductor film, 909b: oxide semiconductor film, 910: oxide semiconductor film, 910a: oxide semiconductor film, 910b: oxide semiconductor film, 912a: conductive film, 912b: conductive film, 912c: conductive film, 912d: conductive film, 912e: conductive film, 914: insulating film, 916: insulating film, 918: insulating film, 920: conductive film, 920a: conductive film, 920b: conductive film, 920c: conductive film, 924: insulating film, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal.

This application is based on Japanese Patent Application serial no. 2014-144659 filed with Japan Patent Office on Jul. 15, 2014 and Japanese Patent Application serial no. 2015-010055 filed with Japan Patent Office on Jan. 22, 2015, the entire contents of which are hereby incorporated by reference.

The invention claimed is:

1. A manufacturing method of a semiconductor device comprising a transistor, comprising:
    forming a gate electrode over a substrate;
    forming a gate insulating film over the gate electrode;
    forming a first oxide semiconductor film over the gate insulating film;
    forming a second oxide semiconductor film over the first oxide semiconductor film;
    forming a source electrode and a drain electrode over the second oxide semiconductor film;
    forming an oxide insulating film over the second oxide semiconductor film;
    forming an oxide conductive film over the oxide insulating film;
    adding oxygen into the oxide insulating film through the oxide conductive film; and
    removing the oxide conductive film,
    wherein the step of forming the source electrode and the drain electrode is performed so that a region of the second oxide semiconductor film becomes thinner than the first oxide semiconductor film,
    wherein the step of forming the oxide insulating film is performed at a temperature higher than or equal to 180° C. and lower than or equal to 350° C. in a plasma enhanced chemical vapor deposition apparatus, and
    wherein the temperature in the step of forming the oxide insulating film is the highest in the manufacturing steps of the transistor.

2. The manufacturing method of a semiconductor device, according to claim 1,
    wherein the gate electrode is a first gate electrode and the gate insulating film is a first gate insulating film,
    wherein the oxide insulating film functions as a second gate insulating film, and
    wherein a second gate electrode is formed over the oxide insulating film.

3. The manufacturing method of a semiconductor device, according to claim 1, wherein the first oxide semiconductor film and the second oxide semiconductor film each comprise oxygen, In, Zn, and M where M is Ti, Ga, Sn, Y, Zr, La, Ce, Nd, or Hf.

4. The manufacturing method of a semiconductor device, according to claim 1, wherein the first oxide semiconductor film and the second oxide semiconductor film each comprise a crystal part, and wherein the crystal part comprises a portion in which a c-axis of the crystal part is parallel to a normal vector of a surface on which the first oxide semiconductor film is formed or a normal vector of a surface on which the second oxide semiconductor film is formed.

5. A manufacturing method of a semiconductor device comprising a transistor, comprising:

forming a gate electrode over a substrate;
forming a gate insulating film over the gate electrode;
forming a first oxide semiconductor film over the gate insulating film;
forming a second oxide semiconductor film over the first oxide semiconductor film;
forming a source electrode and a drain electrode over the second oxide semiconductor film;
forming an oxide insulating film over the second oxide semiconductor film;
forming an oxide conductive film over the oxide insulating film;
adding oxygen into the oxide insulating film through the oxide conductive film; and
removing the oxide conductive film,
wherein the step of forming the source electrode and the drain electrode is performed so that a region of the second oxide semiconductor film becomes thinner than the first oxide semiconductor film, and
wherein a temperature in the step of forming the oxide insulating film is the highest in the manufacturing steps of the transistor.

6. The manufacturing method of a semiconductor device, according to claim 5, wherein the gate electrode is a first gate electrode and the gate insulating film is a first gate insulating film,
wherein the oxide insulating film functions as a second gate insulating film, and
wherein a second gate electrode is formed over the oxide insulating film.

7. The manufacturing method of a semiconductor device, according to claim 5, wherein the first oxide semiconductor film and the second oxide semiconductor film each comprise oxygen, In, Zn, and M where M is Ti, Ga, Sn, Y, Zr, La, Ce, Nd, or Hf.

8. The manufacturing method of a semiconductor device, according to claim 5, wherein the first oxide semiconductor film and the second oxide semiconductor film each comprise a crystal part, and wherein the crystal part comprises a portion in which a c-axis of the crystal part is parallel to a normal vector of a surface on which the first oxide semiconductor film is formed or a normal vector of a surface on which the second oxide semiconductor film is formed.

9. A manufacturing method of a semiconductor device comprising a transistor, comprising:

forming a gate electrode over a substrate;
forming a gate insulating film over the gate electrode;
forming a first oxide semiconductor film over the gate insulating film;
forming a second oxide semiconductor film over the first oxide semiconductor film;
forming a source electrode and a drain electrode over the second oxide semiconductor film;
forming an oxide insulating film over the second oxide semiconductor film;
forming an oxide conductive film over the oxide insulating film; and
adding oxygen into the oxide insulating film through the oxide conductive film,
wherein the step of forming the source electrode and the drain electrode is performed so that a region of the second oxide semiconductor film becomes thinner than the first oxide semiconductor film, and
wherein a temperature in the step of forming the oxide insulating film is the highest in the manufacturing steps of the transistor.

10. The manufacturing method of a semiconductor device, according to claim 9, wherein the gate electrode is a first gate electrode and the gate insulating film is a first gate insulating film,
wherein the oxide insulating film functions as a second gate insulating film, and
wherein a second gate electrode is formed over the oxide insulating film.

11. The manufacturing method of a semiconductor device, according to claim 9, wherein the first oxide semiconductor film and the second oxide semiconductor film each comprise oxygen, In, Zn, and M where M is Ti, Ga, Sn, Y, Zr, La, Ce, Nd, or Hf.

12. The manufacturing method of a semiconductor device, according to claim 9, wherein the first oxide semiconductor film and the second oxide semiconductor film each comprise a crystal part, and
wherein the crystal part comprises a portion in which a c-axis of the crystal part is parallel to a normal vector of a surface on which the first oxide semiconductor film is formed or a normal vector of a surface on which the second oxide semiconductor film is formed.

* * * * *